(12) United States Patent
Song et al.

(10) Patent No.: US 9,064,582 B2
(45) Date of Patent: *Jun. 23, 2015

(54) NONVOLATILE MEMORY DEVICES AND METHODS OF PROGRAMMING NONVOLATILE MEMORY DEVICES

(71) Applicant: SAMSUNG ELECTRONICS CO., LTD., Suwo-Si, Gyeonggi-Do (KR)

(72) Inventors: Youngsun Song, Hwaseong-Si (KR); Bogeun Kim, Suwon-Si (KR); Ohsuk Kwon, Seoul (KR); Kitae Park, Seongnam-Si (KR); Seung-Hwan Shin, Seongnam-Si (KR); Sangyong Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/316,023

(22) Filed: Jun. 26, 2014

(65) Prior Publication Data

US 2014/0376312 A1  Dec. 25, 2014

Related U.S. Application Data

(63) Continuation of application No. 13/477,161, filed on May 22, 2012, now Pat. No. 8,773,908.

(30) Foreign Application Priority Data

Jun. 8, 2011 (KR) .................. 10-2011-0055134

(51) Int. Cl.
*G11C 16/04* (2006.01)
*G11C 16/10* (2006.01)
*G11C 16/34* (2006.01)
*G11C 11/56* (2006.01)
*G11C 16/08* (2006.01)

(52) U.S. Cl.
CPC ............ *G11C 16/10* (2013.01); *G11C 16/3459* (2013.01); *G11C 11/5621* (2013.01); *G11C 11/5628* (2013.01); *G11C 11/5642* (2013.01); *G11C 16/08* (2013.01); *G11C 16/34* (2013.01)

(58) Field of Classification Search
USPC ............. 365/185.12, 185.03, 185.09, 185.22, 365/189.05, 230.08
See application file for complete search history.

(56) References Cited

U.S. PATENT DOCUMENTS 6,377,507 B1 * 4/2002 Tsao ........................ 365/230.03
7,301,817 B2 11/2007 Li et al.
(Continued)

FOREIGN PATENT DOCUMENTS

JP  2008287798 A  11/2008
JP  2009134849 A   6/2009
(Continued)

*Primary Examiner* — Pho M Luu
(74) *Attorney, Agent, or Firm* — Volentine & Whitt, PLLC

(57) ABSTRACT

A nonvolatile memory device includes a memory cell array, a page buffer unit which output a verify-read result, a reference current generating unit which generates a reference current signal, a page buffer decoding unit which outputs currents according to the verify-read result. The nonvolatile memory device further includes an analog bit counting unit which counts the currents, a digital adding unit which calculates an accumulated sum of the counting result, a pass/fail checking unit which outputs a pass signal or fail signal according to the calculation result, and a control unit controlling a program operation.

19 Claims, 41 Drawing Sheets

(56) References Cited

U.S. PATENT DOCUMENTS

| | | |
|---|---|---|
| 7,499,332 B2 | 3/2009 | Crippa et al. |
| 7,688,638 B2 | 3/2010 | Hemink |
| 7,813,186 B2 | 10/2010 | Park et al. |
| 8,205,039 B2 | 6/2012 | Nagao et al. |
| 8,274,831 B2 | 9/2012 | Mokhlesi et al. |
| 8,305,817 B2 * | 11/2012 | Park et al. ............... 365/185.22 |
| 8,661,294 B2 * | 2/2014 | Lee et al. ..................... 714/38.1 |
| 8,773,908 B2 * | 7/2014 | Song et al. ............... 365/185.12 |
| 2010/0329030 A1 | 12/2010 | You et al. |
| 2011/0032758 A1 * | 2/2011 | Son et al. ................. 365/185.03 |

FOREIGN PATENT DOCUMENTS

| | | |
|---|---|---|
| JP | 2011008910 A | 1/2011 |
| KR | 100933859 B1 | 12/2009 |
| KR | 1020110001073 A | 1/2011 |

* cited by examiner

Fig. 11

| | C1 | C2 | C3 | C4 | | Cm |
|---|---|---|---|---|---|---|
| Size of sink transistor | 0.5W | 1.5W | 2.5W | 3.5W | | (m−0.5)W |
| Discharging current in response to RC | 0.5RC | 1.5RC | 2.5RC | 3.5RC | ... | (m−0.5)RC |
| DA out when DOUT=RC (1 Fail Cell) | Low | High | High | High | | High |
| DA out when DOUT=2RC (2 Fail Cells) | Low | Low | High | High | | High |
| DA out when DOUT=3RC (3 Fail Cells) | Low | Low | Low | High | | High |
| DA out when DOUT≥mRC (Equal to or more than m fail cells) | Low | Low | Low | Low | | Low |

Fig. 12

| | C1 | C2 | C3 | C4 | ... | Cm |
|---|---|---|---|---|---|---|
| Size of sink transistor | 0.5W | 2.5W | 4.5W | 6.5W | | (2m−1.5)W |
| Discharging current in response to RC | 0.5Ri | 2.5Ri | 4.5Ri | 6.5Ri | | (2m−1.5)Ri |
| DA out when DOUT=RC (1 Fail Cell) | Low | High | High | High | | High |
| DA out when DOUT=2RC (2 Fail Cells) | Low | Low | High | High | | High |
| DA out when DOUT=3RC (3 Fail Cells) | Low | Low | Low | High | | High |
| DA out when DOUT≥2mRC (Equal to or more than 2m fail cells) | Low | Low | Low | Low | | Low |

NONVOLATILE MEMORY DEVICES AND METHODS OF PROGRAMMING NONVOLATILE MEMORY DEVICES

CROSS-REFERENCE TO RELATED APPLICATIONS

This is a Continuation of U.S. application Ser. No. 13/477,161, filed May 22, 2012, which issued as U.S. Pat. No. 8,773,908, on Jul. 8, 2014, and a claim of priority under 35 U.S.C §119 is made to Korean Patent Application No. 10-2011-0055134 filed Jun. 8, 2011, in the Korean Intellectual Property Office (KIPO), the entire contents of which is incorporated herein by reference.

BACKGROUND

Example embodiments relate to semiconductor memory devices, and more particularly, to nonvolatile memory devices and to methods of programming nonvolatile memory devices.

A semiconductor memory device is a memory device which is fabricated at least in part from semiconductors such as silicon (Si), germanium (Ge), gallium arsenide (GaAs), indium phosphide (InP), and the like. Semiconductor memory devices are generally classified as either volatile memory devices or nonvolatile memory devices.

Volatile memory devices are characterized by the loss of stored data when a power supply is interrupted. Examples of volatile memory devices include certain types of random access memory (RAM) such as static RAM (SRAM), dynamic RAM (DRAM), synchronous DRAM (SDRAM), and the like. On the other hand, nonvolatile memory devices are characterized by the retention of stored data when a power supply is interrupted. Examples of nonvolatile memory devices include read only memory (ROM), programmable ROM (PROM), electrically programmable ROM (EPROM), electrically erasable and programmable ROM (EEPROM), flash memory devices (including NOR type and NAND type), phase-change RAM (PRAM), magnetic RAM (MRAM), resistive RAM (RRAM), ferroelectric RAM (FRAM), and the like.

SUMMARY

In one embodiment, the nonvolatile memory device includes a memory cell array, and a page buffer unit connected to the memory cell array via bit lines and configured to store a verify-read result during a verify read, to divide the verify-read result into a plurality of groups, and to sequentially output the plurality of groups of the verify-read result. The nonvolatile memory device further includes a reference current generating unit configured to generate a reference current signal, a page buffer decoding unit configured to output currents sequentially according to a number of fail bits of each of the plurality of groups based on the reference current signal, an analog bit counting unit configured to count the currents sequentially output from the page buffer decoding unit based on the reference current signal, a digital adding unit configured to calculate an accumulated sum of the counting result of the analog bit counting unit, a pass/fail checking unit configured to output a pass signal or fail signal according to the calculation result of the digital adding unit, and a control unit configured to control a program operation.

Still other example embodiments of the inventive concepts may be directed to providing a nonvolatile memory device including a memory cell array, and a page buffer unit connected with the memory cell array via bit lines, and configured to store a verify-read result during a verify read, to divide the verify-read result into a plurality of groups, and to sequentially output the plurality of groups of the verify-read result. The nonvolatile memory device further includes a page buffer decoding unit configured to output currents sequentially according to a number of fail bits of each of the plurality of groups output from the page buffer unit during a first verify mode, and output a carry signal and a sum signal sequentially according to the number of the fail bits of each of the plurality of groups output from the page buffer unit during a second verify mode, an analog bit counting unit configured to sequentially count the currents sequentially output from the page buffer decoding unit, a digital adding unit configured to calculate an accumulated sum of the counting result of the analog bit counting unit during the first verify mode, and to calculate an accumulated sum of the sum signal during the second verify mode. The nonvolatile memory device still further includes a pass/fail checking unit configured to output a pass signal or a fail signal according to the calculation result of the digital adding unit during the first verify mode, and to output the pass signal or the fail signal according to the calculating result of the digital adding unit and the carry signal, and a control unit configured to control a program operation.

According to still other example embodiments, a method of programming a nonvolatile memory device includes applying a first program voltage to a selected word line, applying a first verify voltage to the selected word line to detect first memory cells program-passed and second memory cells program-failed among memory cells to be programmed to a first state, program-inhibiting the first memory cells and applying a second program voltage to the selected word line, and processing the memory cells to be programmed to the first state as a program pass.

According to yet other example embodiments, a method of programming a nonvolatile memory device includes applying a program voltage to a selected word line, applying a verify voltage to the selected word line, storing a verify result according to the applying of the verify voltage, selecting a first verify mode or a second verify mode according to a manner of program execution, and determining a program pass or a program fail according to the selected verify mode.

According to other example embodiments, a memory system includes a nonvolatile memory device, and a controller configured to correct errors of read data from the nonvolatile memory device using error correcting codes. The nonvolatile memory device includes a memory cell array, and a page buffer unit connected to the memory cell array via bit lines and configured to store a verify-read result during a verify read, to divide the verify-read result into a plurality of groups, and to sequentially output the groups of the verify-read result. The nonvolatile memory device further includes a reference current generating unit configured to generate a reference current signal, a page buffer decoding unit configured to output currents sequentially according to a number of fail bits of each of the plurality of groups based on the reference current signal, an analog bit counting unit configured to count the currents sequentially output from the page buffer decoding unit based on the reference current signal, a digital adding unit configured to calculate an accumulated sum of the counting result of the analog bit counting unit, a pass/fail checking unit configured to output a pass signal or fail signal according to the calculation result of the digital adding unit, and a control unit configured to control a program operation.

BRIEF DESCRIPTION OF THE FIGURES

Example embodiments will become understood from the detailed description that follows, with reference to accompanying drawings which represent non-limiting, example embodiments. In the drawings:

FIG. 11 illustrates a first embodiment of the sizes of s sink transistors and operations of the page buffer decoding unit and analog bit counting unit according to the inventive concepts;

FIG. 12 illustrates a second embodiment of the sizes of sink transistors and operations of the page buffer decoding unit and analog bit counting unit according to the inventive concepts;

Figure 1:
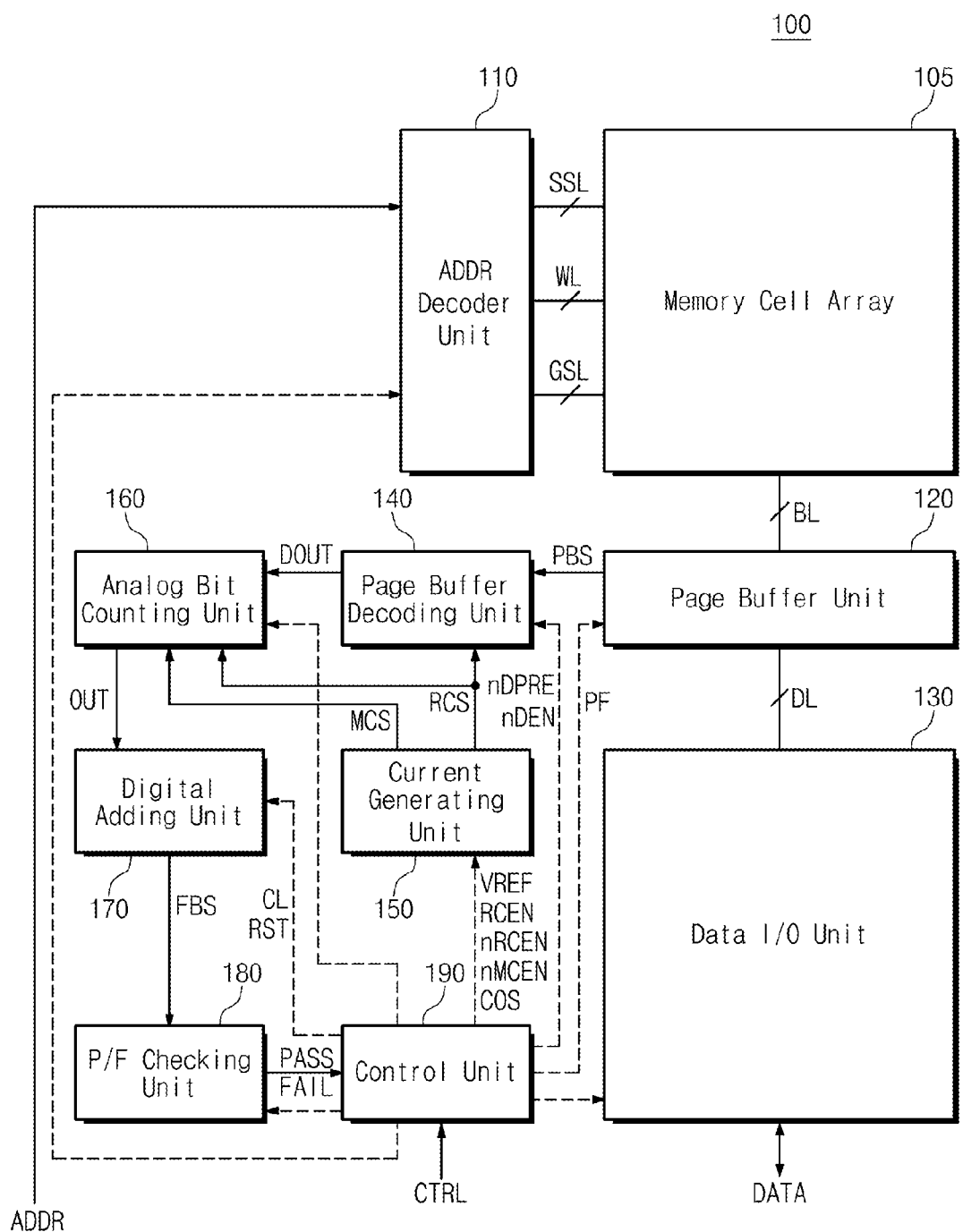
FIG. 1 is a block diagram illustrating a nonvolatile memory device according to a first embodiment of the inventive concepts.

It should be noted that these figures are intended to illustrate the general characteristics of methods, structure and/or materials utilized in certain example embodiments and to supplement the written description provided below. These drawings are not, however, drawn to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EMBODIMENTS

Example embodiments will now be described more fully with reference to the accompanying figures, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the figures, the thicknesses of layers and regions may be exaggerated for clarity. Like reference numerals in the figures may denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers may indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein may have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

The term "selected bit line" or "selected bit lines" is used to indicate a bit line or bit lines, connected with a cell transistor to be programmed or read, among a plurality of bit lines. The term "unselected bit line" or "unselected bit lines" is used to indicate a bit line or bit lines, connected with a cell transistor to be program-inhibited or read-inhibited, among a plurality of bit lines.

The term "selected string selection line" is used to indicate a string selection line connected with a cell string, which includes a cell transistor to be programmed or read, among a plurality of string selection lines. The term "unselected string selection line" or "unselected string selection lines" is used to indicate a remaining string selection line or remaining string selection lines other than the selected string selection line among a plurality of string selection lines. The term "selected string selection transistors" is used to indicate string selection transistors connected with a selected string selection line. The term "unselected string selection transistors" is used to indicate string selection transistors connected with an unselected string selection line or unselected string selection lines.

The term "selected ground selection line" is used to indicate a ground selection line connected with a cell string, which includes a cell transistor to be programmed or read, among a plurality of ground selection lines. The term "unselected ground selection line" is used to indicate a remaining ground selection line or remaining ground selection lines other than the selected ground selection line among a plurality of ground selection lines. The term "selected ground selection transistors" is used to indicate ground selection transistors connected with a selected ground selection line. The term "unselected ground selection transistors" mis used to indicate ground selection transistors connected with an unselected ground selection line or unselected ground selection lines.

The term "unselected word line" is used to indicate a word line, connected with a cell transistor to be programmed or read, among a plurality of word lines. The term "unselected word line" or "unselected word lines" is used to indicate a remaining word lines or remaining word lines other than a selected word line among a plurality of word lines. The term "selected memory cell" or "selected memory cells" is used to designate memory cells to be programmed or read among a plurality of memory cells. The term "unselected memory cell" or "unselected memory cells" is used to indicate a remaining memory cell or remaining memory cells other than a selected memory cell or selected memory cells among a plurality of memory cells.

The term "page" is used to indicate a minimum basis of memory cells for a reading and writing. For example, when k bits are written into a memory cell, k page(s) may be written to the memory cells of a same word line. In the case where k is two (multi-level cells), each memory cell may store a least significant bit and a most significant bit of data. In the case where k is three or more (multi-level cells), each memory cell may store a least significant bit, one or more central significant bits, and a most significant bit of data.

The term "least significant page" is used to indicate a page including least significant bits of data of multi-level cells. The term "central significant page" may be used to indicate a page including central significant bits of data of multi-level cells. The term "most significant page" may be used to indicate a page including most significant bits of data of multi-level cells.

Embodiments of the inventive concepts may be described referring to NAND flash memory devices. However, the inventive concepts are not limited to NAND flash memory devices. The inventive concepts may be applied to various nonvolatile memory devices, such as EEPROM, NOR flash memory devices, PRAM, MMRAM, RRAM and FRAM.

FIG. 1 is a block diagram illustrating a nonvolatile memory device 100 according to a first embodiment of the inventive concepts. Referring to FIG. 1, the nonvolatile memory device 100 of this example includes a memory cell array 105, an address decoding unit 110, a page buffer unit 120, a data input/output unit 130, a page buffer decoding unit 140, a current generating unit 150, an analog bit counting unit 160, a digital adding unit, a pass/fail checking unit 180 and a control unit 190. The memory cell array 105 includes a plurality of memory cells. For example, the memory cell array 105 may include a plurality of cell strings which may be arranged in a row direction and a column direction. Each of the plurality of memory cells of the memory cell array 105 may store one or more bits of data.

The address decoding unit 110 may be coupled with the memory cell array 105 via word lines WL, string selection lines SSL, and ground selection lines GSL. The address decoding unit 110 may be configured to operate responsive to the control of the control unit 190. The address decoding unit 110 may receive an address ADDR from an external device. The address decoding unit 110 may be configured to decode the received address.

The page buffer unit 120 may be coupled with the memory cell array 105 via bit lines BL and coupled with the data input/output unit 130 via data lines DL. The page buffer unit 130 may operate responsive to the control of the control unit 190.

The page buffer unit 120 may receive data from the data input/output unit 130 to write it in the memory cell array 105. The page buffer unit 120 may read data from the memory cell array 105 to output it to the data input/output unit 130. The page buffer unit 120 may read data from a first storage area of the memory cell array 105 to store it in a second storage area thereof. The page buffer unit 120 may perform a copy-back operation.

The page buffer unit 120 may output a page buffer signal PBS to the page buffer decoding unit 140. The page buffer unit 120 may output information of a verify-read result as the page buffer signal PBS responsive to a transmission signal PF from the control unit 190. The page buffer unit 120 may output the verify-read result through a plurality of iterations in response to the transmission signal PF.

The data input/output circuit 130 may be coupled with the page buffer unit 120 via the data lines DL. The data input/output unit 130 may operate responsive to the control unit 190. The data input/output unit 130 may exchange data with the external device. The data input/output circuit 130 may receive data from the external device to transfer it to the page buffer unit 120. The data input/output unit 130 may receive data from the page buffer unit 120 to transfer it to the external device.

The page buffer decoding unit 140 may operate responsive to a decoder enable signal nDEN and a decoder precharge signal nDPRE from the control unit 190. The page buffer decoding unit 140 may receive the page buffer signal PBS from the page buffer unit 120 and receive a reference current signal RCS and a maximum current signal MCS from the current generating unit 150. The page buffer decoding unit 140 may detect fail bits from the received page buffer signal PBS to output the detection result as a decoder output signal DOUT.

The page buffer decoding unit 140 may detect a number of fail bits from the page buffer signal PBS. The page buffer decoding unit 140 may output a current which has an amount corresponding to multiples of reference current RC as the decoder output signal DOUT. The multiples may correspond to the number of the detected fail bits. When the page buffer signal PBS indicates two fail bits, the page buffer decoding unit 140 may output a current which has an amount corresponding to two times of the reference current RC as the decoder output signal DOUT. The reference current RC may be current flowing through a normal transistor when the reference current signal RCS is applied to a gate of the normal transistor.

The current generating unit 150 may operate responsive to a reference voltage VREF, a reference current enable signal RCEN, a maximum current enable signal nMCEN and a current option signal COS from the control unit 190. The current generating unit 150 may generate the reference current signal RCS in response to the reference current enable signal RCEN, the reference voltage VREF and the inverted reference current enable signal nRCEN. The current generating unit 150 may generate the maximum current signal MCS in response to the reference current signal RCS and the maximum current enable signal nMCEN.

The reference current signal RCS may be provided to the page buffer decoding unit 140 and the analog bit counting unit 160. The reference current signal RCS may correspond to a state of the decoding output signal DOUT when the page buffer signal PBS indicates a single fail bit. The maximum current signal MCS may be transferred to the analog bit counting unit 160. The maximum current signal MCS may correspond to a maximum amount of a current flowing within the analog bit counting unit 160.

The analog bit counting unit 160 may operate responsive to a load enable signal LEN and a count enable signal CEN from the control unit 190. The analog bit counting unit 160 may receive the decoding output signal DOUT from the page buffer decoding unit 140 and the reference current signal RCS and the maximum current signal MCS from the current generating unit 150. The analog bit counting unit 160 may count the decoding output signal DOUT (e.g., analog count) and output the counting result OUT.

The analog bit counting unit 160 may count the decoding output signal DOUT using the reference current signal RCS. For example, the analog bit counting unit 160 may count at what times is the decoding output signal DOUT from the reference current RC using the reference current signal RCS.

The analog bit counting unit 160 may control an amount of maximum current in response to the maximum current signal MCS. For example, the amount of the maximum current may be an amount of current flowing through a normal transistor when the maximum current signal MCS is applied to its gate.

The digital adding unit 190 may operate responsive to a latch signal CL and a reset signal RST from the control unit 190. The digital adding unit 170 may receive the counting result OUT from the analog bit counting unit. The digital adding unit 170 may digitalize the counting result OUT and store the digitalized result. The digital adding unit 170 may digitalize a plurality of output signals from the analog bit counting unit 160 and calculate an accumulated sum of the digitalized values. The stored value may be output as a fail bit signal FBS. The fail bit signal FBS may indicate a number of fail bits of the verify-read result. The fail bit signal FBS may be a digital value.

The pass/fail checking unit 180 may operate responsive to the control unit 190. The pass/fail checking unit 180 may receive the fail bit signal FBS from the digital adding unit 170. The pass/fail checking unit 180 may output a pass signal PASS or a fail signal FAIL based on the received fail bit signal FBS. When the fail bit signal FBS indicates a value less than or equal to a specific value, the pass/fail checking unit 180 may output the pass signal PASS. When the fail bit signal FBS indicates a value more than the specific value, the pass/fail checking unit 180 may output the fail signal FAIL.

The control unit 190 may control various operations of the nonvolatile memory device 100. For example, signal paths from the control unit 190 are shown as broken lines. The control unit 190 may operate responsive to control signals CTRL from an external device. The control unit 190 may receive the pass signal PASS or the fail signal FAIL from the pass/fail checking unit 180. When the pass signal PASS is received, the control unit 190 may determine a program pass. When the fail signal FAIL is received, the control unit 190 may determine a program fail.

Figure 2:
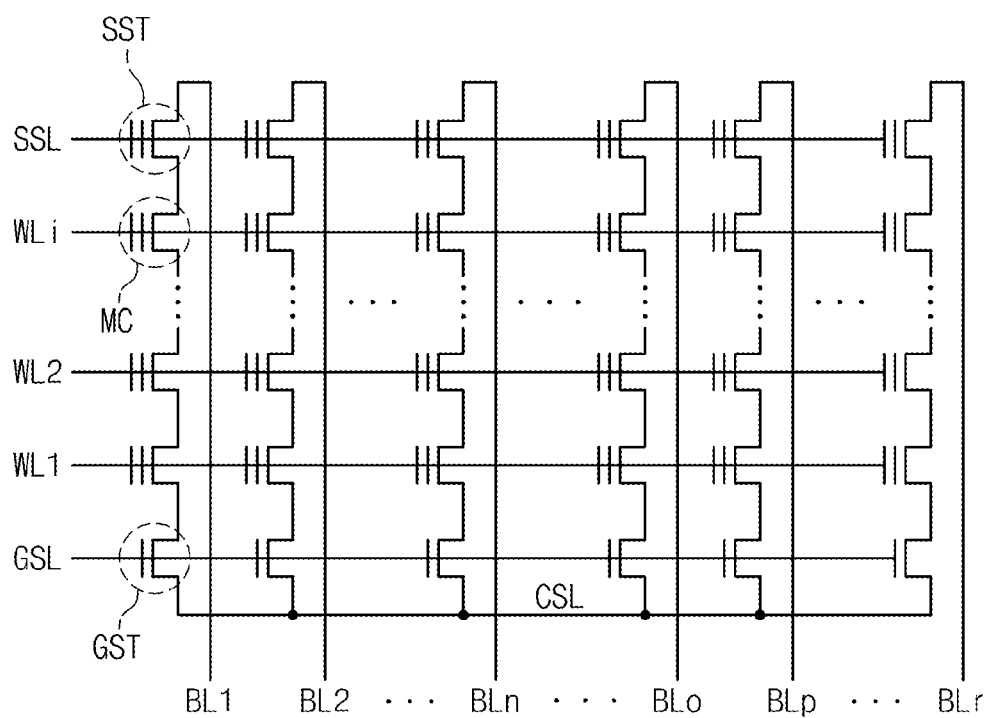
FIG. 2 is a schematic diagram illustrating a memory cell array according to the inventive concepts.

FIG. 2 is a schematic diagram illustrating an example of the memory cell array 105 according to the inventive concepts. Referring to FIG. 2, a plurality of memory cells MCS may be coupled in series to constitute a plurality of strings. String select transistors SST and ground select transistors GST may be coupled with each node of the plurality of strings. A string select line SSL may be coupled with gates of the string select transistors SST. A ground select line may be coupled with gate of ground select transistors GST. A common source line may be coupled with of the ground select transistors GST. Word lines WL1 through WLi may be coupled with control gates of the plurality of memory cells MCS arranged in a direction of columns respectively. Bit lines BL1 through BLr may be coupled with the string select transistors SST.

During the verify-read, a power supply voltage VCC may be charged to the bit lines BL1 through BLr. A verify voltage may be applied to a select word line, and a high voltage may be applied to the string select line SSL, the ground select line GSL and unselected word lines. A ground voltage VSS may be applied to the common source line CSL. Memory cells coupled with the unselected word lines, the string select transistors SST and the ground select transistors may be turned on. Memory cells coupled with the selected word line may be turned on or off.

When threshold voltages of the selected memory cells are higher than the verify voltage, the selected memory cells may be turned on. Thus, bit lines coupled with the selected memory cells may be floated and maintain the charged power supply voltage VCC. When the threshold voltages of the selected memory cells are lower than the verify voltage, the selected memory cells may be turned on. Thus, the bit lines coupled with the selected memory cells may be grounded via the common source line CSL.

Bit lines coupled with program-passed memory cells may have the ground voltage VSS to indicate logic low. Bit lines coupled with program-failed memory cells may have the power supply voltage VCC to indicate logic high.

Example voltages (or logic states) of the bit lines BL1 through BLr are shown in following Table 1.

TABLE 1

|  | Program pass | Program fail |
| --- | --- | --- |
| Bit line | High | Low |

Figure 3:
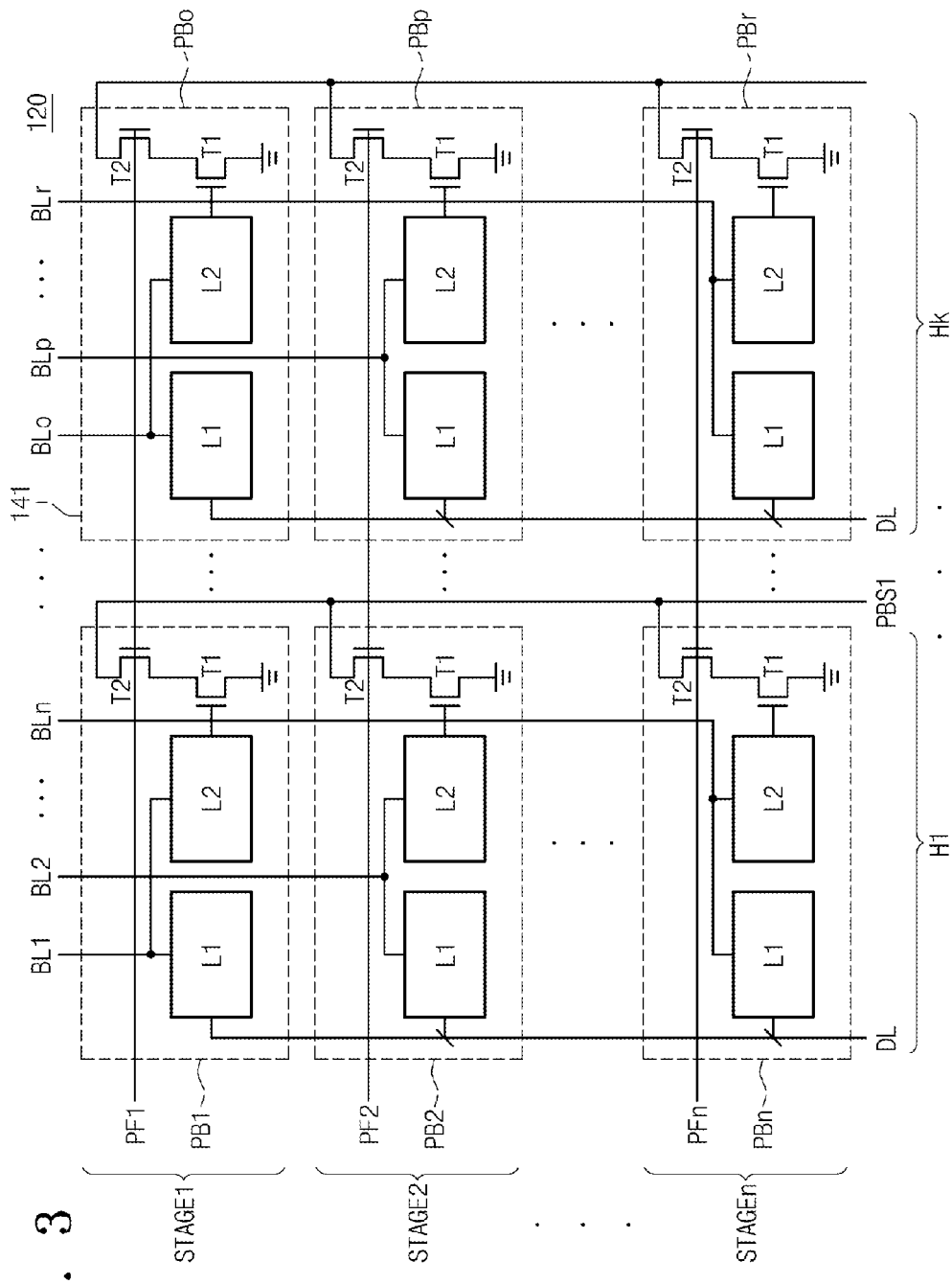
FIG. 3 illustrates an embodiment of a page buffer unit according to the inventive concepts.

FIG. 3 illustrates an embodiment of the page buffer unit 120 according to the inventive concepts. Referring to FIGS. 1 and 3, the page buffer unit 120 includes a plurality of page buffers PB1 through PBr. The plurality of page buffers PB1 through PBr may constitute a plurality of hierarchical structures H1 through Hk. The first through nth page buffers PB1 through PBn may constitute the first hierarchical structure H1. The oth through rth page buffers may constitute the kth hierarchical structure Hk. A number of the page buffers in each hierarchical structure may be the same.

The page buffers in each hierarchical structure may be coupled each other. For example, the first through nth page buffers PB1 through PBn may be coupled by a WIRED-OR structure to output the first page buffer signal PBS1 in a first hierarchical structure H1. The oth through rth page buffers PBo through PBr may be coupled by a WIRED-OR structure to output the kth page buffer signal PBSk.

Each of the page buffers PB1 through PBr may include a first latch L1, a second latch L2, a first transistor T1 and a second transistor L2. The first and second latches L1 and L2 may be coupled with a corresponding one of the bit lines BL1 through BLr. For example, the first and second latches L1 and L2 of the first page buffer PB1 may be coupled with the first bit line BL1. The first and second latches L1 and L2 of the nth page buffer PBn may be coupled with the nth bit line BLn. The first and second latches L1 and L2 of the rth page buffer PBr may be coupled with the rth bit lines BLr.

The first latches L1 may be data latches storing data to be programmed, the read result and the verify-read result. The first latches L1 may be coupled with the data lines DL.

The second latches L2 may operate independently from the first latches L1. The second latches L2 may store the verify-read result. The second latches L2 may invert stored values and transfer them to gates of the first transistors T1.

The first transistors T1 may operate responsive to values stored in the second latches L2. One node of the first transistors may be supplied with the ground voltage VSS, and another node of the first transistors may be coupled with the second transistors T2.

The second transistors T2 may operate responsive to transfer signals PF1 through PFn. One node of the second transistors T2 may be coupled with the first transistors T1, and another node of the second transistors T2 may output the first through kth page buffer signals PBS1 through PBSk.

When the verify-read is executed, the verify-read result is stored in the page buffers PB1 through PBr. According to the verify-read result, the page buffers PB1 through PBr may output the first through kth page buffer signals PBS1 through PBSk. For example, the page buffers PB1 through PBr may output the first through kth page buffer signals PBS1 through PBSk sequentially in an order of first stages STAGE1 through nth stages STAGEn.

When the first transfer signal PF1 is activated, the page buffers PB1 and PBo of the first stage STAGE1 may output the first through kth page buffer signals PBS1 through PBSk. When the nth transfer signal PFn is activated, the page buffers PBn and PBr of the nth stage STAGEn may output the first through kth page buffer signals PBS1 through PBSk.

As shown in Table 1, a bit line coupled with a program-failed memory cell indicates logic low, and a bit line coupled with a program-failed memory cell indicates logic high. Logic values of the bit lines BL1 through BLr may be stored in the page buffers PB1 through PBr.

The second latch L2 of the first page buffer PB1 may output inverted value of the stored value to the gate of the first transistor T1. When a memory cell corresponding to the first page buffer PB1 is the program-failed memory cell, the second latch L2 may output logic high to the gate of the first transistor T1. That is, the first transistor T1 is turned on. When the memory cell corresponding to the first page buffer PB1 is the program-passed memory cell, the second latch L2 may output logic low to the gate of the first transistor T1. That is, the first transistor T1 is turned off.

When the first page buffer PB1 corresponds to the program-failed memory cell and the first transfer signal PF1 is activated, the first page buffer PB1 may output the ground voltage (or logic low) as the first page buffer signal PBS1. When the first page buffer PB1 corresponds to the program-passed memory cell and the first transfer signal PF1 is activated, the first page buffer PB1 may float the first page buffer signal PBS1. The first page buffer PB1 may output the ground voltage (or logic low) as the first page buffer signal PBS1 or float the first page buffer signal PBS1 according to whether the memory cell corresponding to the first page buffer PB1 is program-passed or program-failed.

Other page buffers PB2 through PBr may operate in an identical manner with the first page buffer PB1. Examples of the page buffer signals PBS1 through PBSk according to the verify-read result are shown in following Table 2.

TABLE 2

|  | Program pass | Program fail |
| --- | --- | --- |
| Bit line | High | Low |
| Page buffer signal | Float | Low (VSS) |

Figure 4:
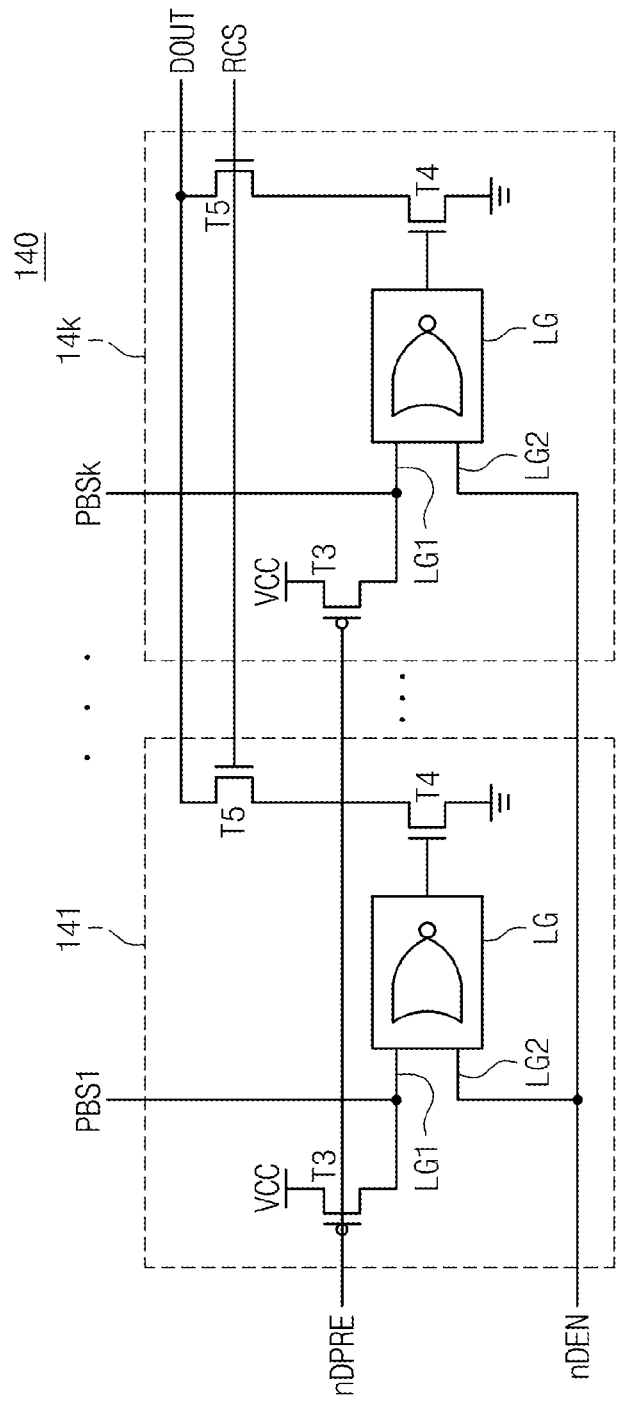
FIG. 4 is a circuit diagram illustrating a first embodiment of a page buffer decoding unit according to an embodiment of the inventive concepts.

FIG. 4 is a circuit diagram illustrating a first embodiment of the page buffer decoding unit 140 according to the inventive concepts. Referring to FIGS. 1, 3 and 4, the page buffer decoding unit 140 includes a plurality of decoders 141 through 14k. The first through kth decoders 141 through 14k may receive first through kth page buffer signals PBS1 through PBSk from the page buffer unit respectively. The decoder enable signal nDEN and the decoder precharge signal nDPRE are provided to first through kth decoders 141 through 14k commonly. The first through kth decoders 141 through 14k may output the decoder output signal DOUT responsive to the first through kth page buffer signals PBS1 through PBSk. Each of the first through kth decoders 141 through 14k may include a first transistor T3, a second transistor T4, a fifth transistor T5 and a logic gate LG.

First input nodes LG1 of the logic gates LG may be coupled with the third transistors T3 and supplied with the first through kth page buffer signal PBS1 through PBSk respectively. The third transistors T3 may precharge the first input nodes LG1 of the logic gates LG to the power supply voltage VCC in response to the decoder precharge signal nDPRE. Second input nodes LG2 of the logic gates LG may be supplied with the decoder enable signal nDEN. The logic gates LG may be elements performing NOR operation.

The fourth transistors T4 may operate responsive to outputs of the logic gates LG. First nodes of the fourth transistors T4 may be supplied with the ground voltage VSS, and second nodes of the fourth transistors may be coupled with the fifth transistors T5.

The fifth transistors T5 may operate responsive to the reference current signal RCS. First nodes of the fifth transistors T5 may be coupled with the fourth transistors T4 and second nodes of the fifth transistors T5 may be coupled commonly to output the decoder output signal DOUT.

A NOR gate may output logic high when logic low is inputted through two input nodes, and output logic high when logic high is inputted through at least one of the two input nodes. When the decoder enable signal nDEN is logic high, the logic gates LG may output logic low. That is, the decoder 140 is disabled. When the decoder enable signal nDEN is logic low, the logic gates LG may output logic high or logic low according to the values of the first input nodes LG1. That is, the decoder 140 is enabled.

When the transfer signals PFG1 through PFn is deactivated, the first through kth page buffer signals PBS1 through PBSk are floated. The third transistors may precharge the first input nodes LG1 to the power supply voltage VCC in response to the decoder precharge signal nDPRE. Then, the decoder precharge signal nDPRE is deactivated, and the first input nodes LG1 of the logic gates LG may be floated.

One of the transfer signals PF1 through PFn is activated, page buffers of one stage of the first through nth stages STAGE1 through STAGEn may output the first through kth page buffer signals PBS1 through PBSk.

When a memory cell corresponding to the first page buffer signal PBS1 is the program-passed memory cell, the first page buffer signal PBS1 may be floated. The first input node LG1 of the logic gate LG of the first decoder 141 may maintain the precharged power supply voltage VCC (i.e., logic high). The logic gate LG of the first decoder 141 may output logic low. The fourth transistor T4 of the first decoder may be turned off, and an output node of the first decoder 141 is floated.

When the memory cell corresponding to the first page buffer signal PBS1 is the program-failed memory cell, the first page buffer signal PBS1 is the ground voltage. A voltage of the first input node LG1 of the logic gate LG of the first decoder 141 may be discharged to the ground voltage (i.e., transit to logic low). The logic gate LG of the first decoder 141 may output logic high. The fourth transistor T4 of the first decoder 141 may be turned on, and the first decoder 141 may operate as a current sink pulling (i.e., drawing negative charges to ground) a current from the output node of the first decoder 141. An amount of the current pulled by the first decoder 141 is controlled by the reference current signal RCS. The current pulled by the first decoder 141 in response to the reference current signal RCS may be the reference current RC.

Each of the second through kth decoders 142 through 14k may operate in an identical manner with the first decoder 141. Output examples of the decoders 141 through 14k according to the verify-read result may be shown in following Table 3.

TABLE 3

|  | Program pass | Program fail |
| --- | --- | --- |
| Bit line | High | Low |
| Page buffer signal | Float | Low (VSS) |
| Output of decoder | Float | Current sink (RC) |

The output nodes of the first through kth decoders 141 through 14k are coupled commonly with an output node of the page buffer decoding unit 140. The decoder output signal DOUT may be a total current pulled by the first through kth decoders 141 through 14k. For example, each of the first through kth decoders 141 through 14k may pull the reference current RC. According to the number of the fail bits indicated by the page buffer signals PBS1 through PBSk, a number of decoders which pull the reference current RC is determined. Thus, the decoder output signal DOUT may be a current having an amount which is a multiple of the reference current RC. The decoder output signal DOUT may be a current having a negative value. The page buffer decoding unit 140 may be a current sink which pulls a current having an amount corresponding to the number of the program-failed memory cells.

Figure 5:
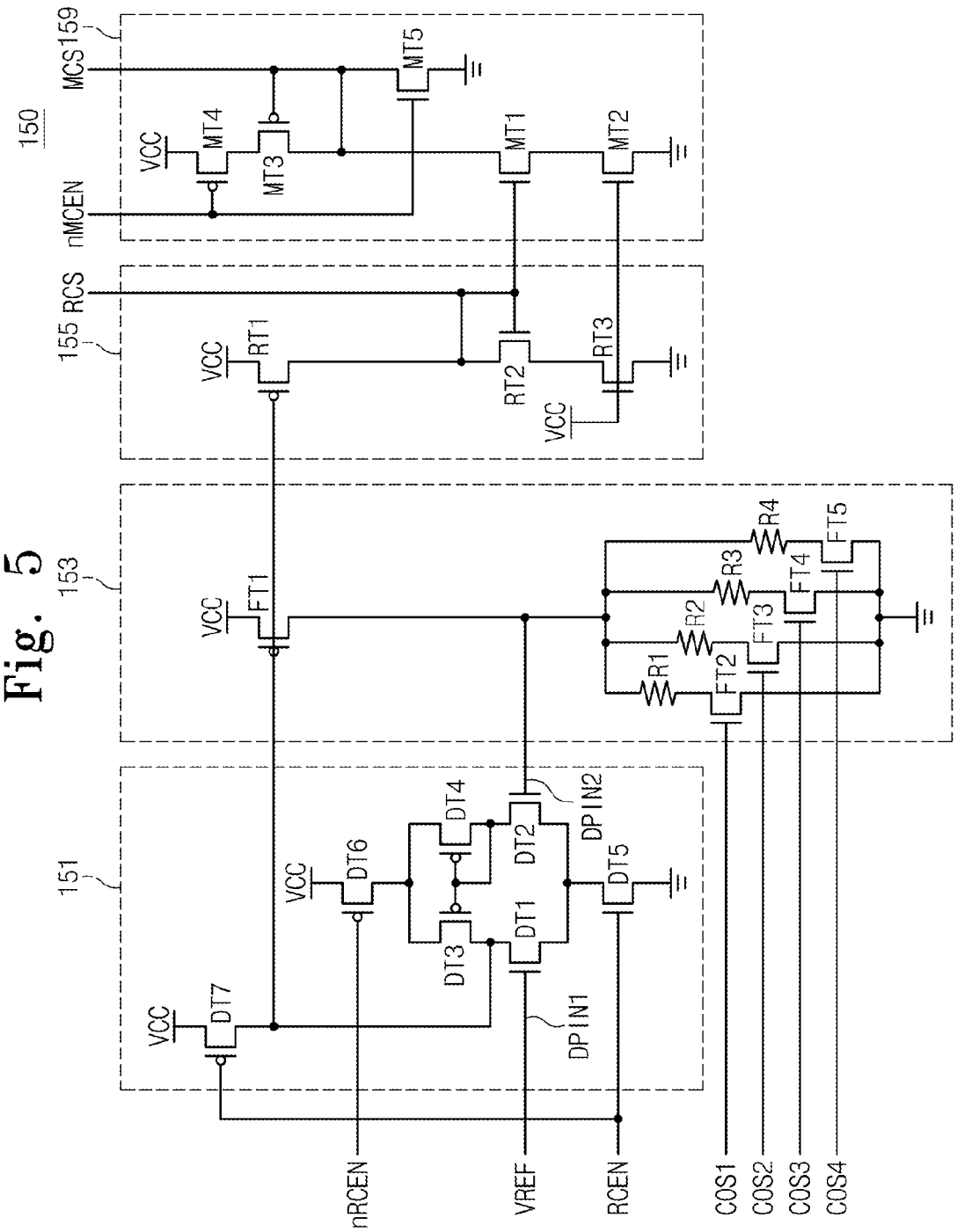
FIG. 5 is a circuit diagram illustrating a first embodiment of a current generating unit according to an embodiment of the inventive concepts.

FIG. 5 is a circuit diagram illustrating a first embodiment of the current generating unit 150 according to the inventive concepts. Referring to FIGS. 1 and 5, the current generating unit 150 may include a differential amplifier 151, a feedback variable resistor 153, a reference current signal generator 155 and a maximum current signal generator 159.

The differential amplifier 151 may include first through seventh differential amplifier transistors DT1 through DT7. The first and second differential amplifier transistors DT1 and DT2 may constitute first and second differential inputs DPIN1 and DPIN2. The third and fourth differential amplifier transistors DT3 and DT4 may constitute a current mirror.

The fifth differential amplifier transistor DT5 may supply the ground voltage VSS to the differential amplifier 151 in response to the reference current enable signal RCEN. The sixth differential amplifier transistor DT6 may supply the power supply voltage VCC to the differential amplifier 151 in response to the inverted reference current enable signal nRCEN. That is, when the reference current enable signal RCEN is logic low and the inverted reference current enable signal nRCEN is logic high, the differential amplifier 151 is disabled.

The seventh differential amplifier transistor DT7 may supply the power supply voltage VCC to an output node DPOUT of the differential amplifier 151 in response to the reference current enable signal RCEN. When the differential amplifier 151 is disabled, the seventh differential amplifier transistor DT7 may output the power supply voltage VCC to the output node DPOUT of the differential amplifier 151.

The first input node DPIN1 of the differential amplifier 151 is supplied with a reference voltage VREF, and the second input node DPIN2 is supplied with a voltage divided by the feedback variable resistor 153. For example, the reference voltage VREF may be the power supply voltage or one of various voltages used in the nonvolatile memory device 100.

The feedback variable resistor 153 may include first through fifth feedback transistors FT1 through FT5 and first through fourth resistors R1 through R4.

The first feedback transistor FT1 may operate responsive to an output signal of the differential amplifier 151. A first node of the first feedback transistor FT1 may be supplied with the power supply voltage VCC, a second node may be coupled with the second input node DPIN2 of the differential amplifier 151. The first feedback transistor FT1 may operate as a current driver supplying a current in response to the output of the differential amplifier 151.

First nodes of the first through fourth resistors R1 through R4 may be coupled with the second input node DPIN2, and second nodes may be coupled with the second through fifth feedback transistors FT2 through FT4 respectively. First nodes of the second through fifth feedback transistors FT2 through FT5 may be coupled with the first through fourth resistors R1 through R4 respectively, and second nodes may be supplied with the ground voltage VSS. The second through fifth feedback resistors FT2 through FT5 may operate in response to the first through fourth current option signals COS1 through COS4 respectively.

The first through fourth resistors R1 through R4 and the second through fifth feedback transistors FT2 through FT5 may constitute a variable resistor which operates responsive to the first through fourth current option signals COS1 through COS4. A voltage supplied to the second input node DPIN2 of the differential amplifier 151 may be varied according to the first through fourth current option signals COS1 through COS4. That is, the output signal of the differential amplifier 151 may be varied by the first through fourth current option signals COS1 through COS4.

The reference current generator 155 may include first through third reference transistors RT1 through RT3. The first reference transistor RT1 may operate in response to the output signal of the differential amplifier 151. A first node of the first reference transistor RT1 may be supplied with the power supply voltage VCC, and a second node may be coupled with the second reference transistor RT2.

A first node of the second reference transistor RT2 may be coupled with the first reference transistor RT1, and a second node may be coupled with the third reference transistor RT3. The first node and a gate of the second reference transistor RT2 may be coupled in common and output the reference current signal RCS.

A first node of the third reference transistor RT3 may be coupled with the second reference transistor RT2, and a second node may be supplied with the ground voltage VSS. A gate of the third reference transistor RT3 may be supplied with the power supply voltage VCC. The third transistor RT3 may maintain a turned on state.

When the reference current enable signal RCEN is activated, the output signal of the differential amplifier 151 may be formed by the differential amplifier 151 and the feedback variable resistor 153. The output signal of the differential amplifier 151 may be adjusted by the first through fourth current option signals COS1 through COS4. The reference current generator 155 may output the reference current signal RCS in response to the output signal of the differential amplifier 151. Thus, the reference current signal RCA may be adjusted by the first through fourth current option signals COS1 through COS4.

When the current enable signal RCEN is deactivated, the output signal of the differential amplifier 151 may be determined regardless of the feedback variable resistor 153. Thus, even though the first through fourth current option signals COS1 through COS4 are adjusted, the reference current generator 155 may maintain the reference current signal RCS without any variation.

The maximum current signal generator 159 may include first through fifth maximum current transistors MT1 through MT5. The first maximum current transistor MT1 may operate as a current mirror with the second maximum current transistor MT2. The second maximum current transistor MT2 may be coupled between the first maximum current transistor MT1 and a ground node. A gate of the second maximum current transistor MT2 is supplied with the power supply voltage VCC. The second maximum current transistor may maintain a turned on state.

A first node of the third maximum current transistor MT3 may be coupled with the first maximum current transistor MT1, and a second node may be coupled with the fourth maximum current transistor MT4. The fourth maximum current transistor MT4 may be coupled between the third maximum current transistor MT3 and a power supply node. The fourth maximum current transistor MT4 may supply the power supply voltage VC to the maximum current signal generator 159 responsive to the maximum current enable signal nMCEN. A first node of the fifth maximum current transistor MT5 may be coupled with the third maximum current transistor MT3, and a second node may be supplied with the ground voltage. The fifth maximum current transistor MT5 may supply the ground voltage VSS to the maximum current signal generator 159 in response to the maximum current enable signal nMCEN.

A first node of the first maximum current transistor MT1, the first node and a gate of the third maximum current transistor MT3 and a first node of the fifth maximum current transistor MT5 may be coupled in common and output the maximum current signal MCS.

When the maximum current enable signal nMCEN is activated, the fourth maximum current transistor MT4 may be turned on, and the fifth maximum current transistor MT5 may be turned off. The maximum current signal generator 159 may output the maximum current signal MCS responsive to the reference current signal RCS. When the maximum current enable signal nMCEN is deactivated, the fourth maximum current transistor MT4 may be turned off, and the fifth maximum current transistor MT5 may be turned on. The maximum current signal generator 159 may output the ground voltage as the maximum current signal MCS in regardless of the reference current signal RCS.

Figure 6:
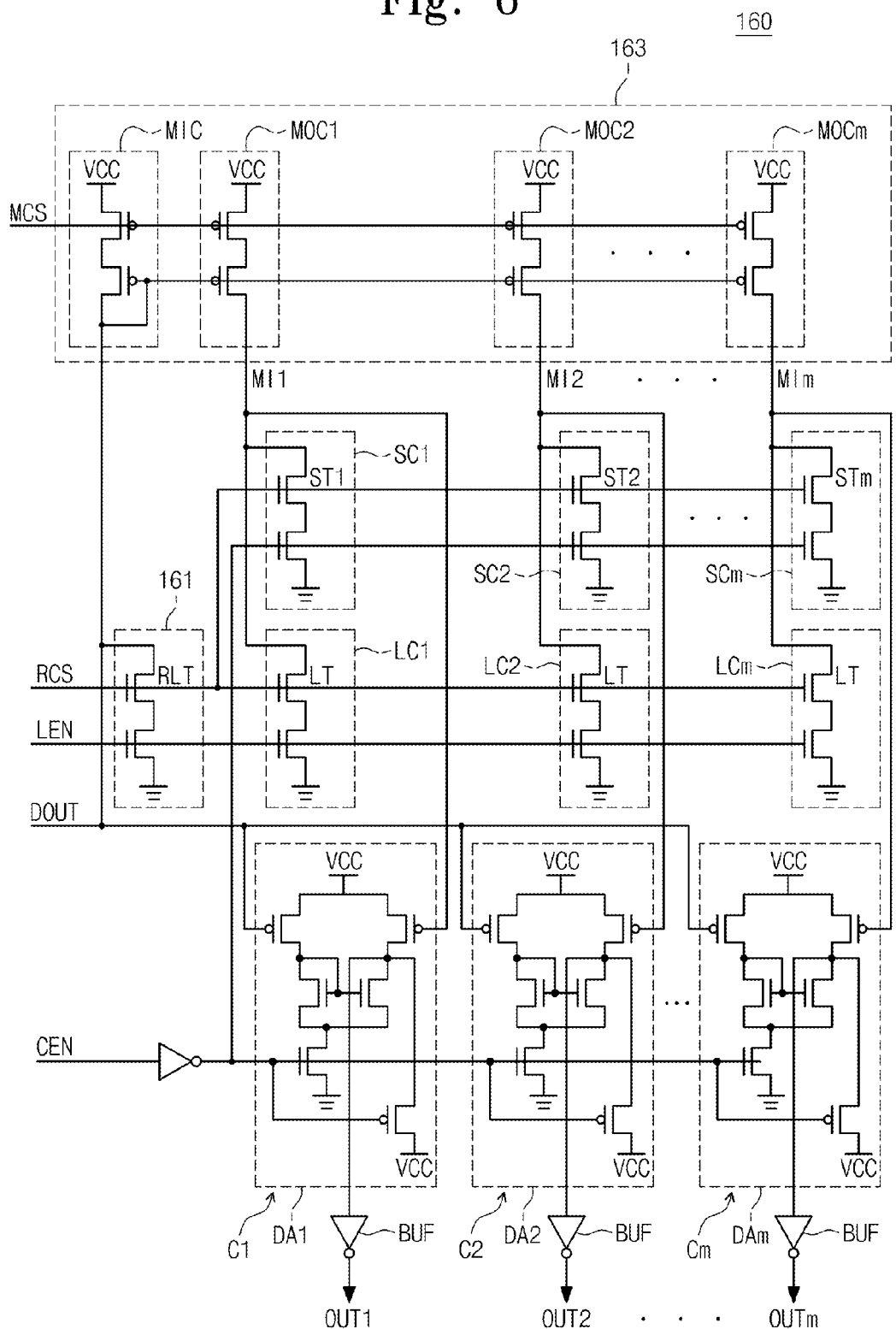
FIG. 6 is a circuit diagram illustrating a first embodiment of an analog bit counting unit according to the inventive concepts.

FIG. 6 is a circuit diagram illustrating a first embodiment of the analog bit counting unit 160 according to the inventive concepts. Referring to FIGS. 1 and 6, the analog bit counting unit 160 may include a reference load circuit 161, a current mirror 163, first through mth sink circuits SC1 through SCm, first through mth load circuits LC1 through LCm and first through mth differential amplifiers DA1 through DAm.

The reference load circuit 161 may be electrically coupled with a ground node in response to the load enable signal LEN. The reference load circuit 161 may be enabled or disabled responsive to the load enable signal LEN.

The reference load circuit 161 may include a reference load transistor RLT. The reference load transistor RLT may operate in response to the reference current signal RCS. For example, a size of the reference load transistor RLT may be larger than a size of a normal transistor. When the size of the reference load transistor RLT may be n-times larger than the size of the normal transistor, the reference load transistor RLT may pull an n-times larger current than the reference current RC responsive to the reference current signal RCS. The reference load transistor RLT may operate as a current sink.

The current mirror 163 may mirror an input signal to output a plurality of mirrored signals. The input signal may be a total current of the decoder output signal DOUT and the current pulled by the reference load circuit 161. The current mirror 163 may include a mirror input circuit MIC and first through mth mirror output circuits MOC1 through MOCm.

The mirror input circuit MIC may receive the input signal. The first through mth mirror output circuits MOC1 through MOCm may mirror the input signal to output first through mth mirrored signals MI1 through MIm respectively.

The first through mth load circuits may be current sinks which pull current from the first through mth mirrored signals MI1 through MIm. The first through mth load circuits may be electrically coupled with ground nodes in response to the load enable signal LEN. The first through mth load circuits LC1 through LCm may be enabled or disabled responsive to the load enable signal LEN.

The first through mth load circuits LC1 through LCm may include load transistors LT respectively. The load transistors LT may operate in response to the reference current signal RCS. Each of the load transistors LT may have the same structure and size to the reference load transistor RLT. That is, each of the first through mth load circuits LC1 through LCm may be a current sink pulling an identical current with the reference load circuit 161.

The reference load circuit 161 may pull a current from the input signal of the current mirror 163. The first through mth load circuits LC1 through LCm may pull currents from the first through mth mirrored signals MI1 through MIm respectively. The reference load circuit 161 and the first through mth load circuits LC1 through LCm may be used to provide offset to the analog bit counting unit 160. For example, each of the reference load circuit 161 and the first through mth load circuits LC1 through LCm may substantially pull a 5-times larger current than the reference current RC. That is, each of the reference load transistor RLT and load transistors LT may have a 5-times larger size than the size of the normal transistor.

The first through mth sink circuits SC1 through SCm may be current sinks which pull currents from the first through mth mirrored signals MI1 through MIm respectively. The first through mth sink circuits SC1 through SCm may be electrically coupled with ground nodes responsive to the count enable signal CEN. The first through mth sink circuits SC1 through SCm may be enabled or disabled in response to the count enable signal CEN.

The first through mth sink circuits SC1 through SCm may include first through mth sink transistors ST1 through STm respectively. The first through mth sink transistors ST1 through STm may have different sizes than each other. When the first through mth sink transistors ST1 through STm have different sizes, amounts of currents pulled by the first through mth sink transistors ST1 through STm may be different than each other.

The first through mth differential amplifiers DA1 through DAm may enabled or disabled in response to the count enable signal CEN. When the count enable signal CEN is logic low, the first through mth differential amplifiers DA1 through DAm may be supplied with the ground voltage, and enabled. When the count enable signal CEN is logic high, the first through mth differential amplifiers DA1 through DAm may not be supplied with the ground voltage, and disabled. When the first through mth differential amplifiers DA1 through DAm are disabled, the power supply voltage may be output as outputs of the first through mth differential amplifiers DA1 through DAm in response to the count enable signal CEN.

The first through mth differential amplifiers DA1 through DAm may compare a voltage generated by the input signal of the current mirror 163 with voltages generated by first through mth differential amplifiers DA1 through DAm respectively. The first through mth differential amplifiers DA1 through DAm may output the compared result as the first through mth counting results OUT1 through OUTm. The counting results OUT1 through OUT1 may be output via buffers BUF.

The first sink circuit SC1 and the first differential amplifier DA1 may constitute a first counter C1. The first differential amplifier DA1 may compare the voltage generated by the input signal of the current mirror with the voltage generated by the first mirrored signal MI1 to output the compare result as the first counting result OUT1. Similarly, the second through mth sink circuits SC2 through SCm may constitute second through mth counters C2 through Cm.

Figure 7:
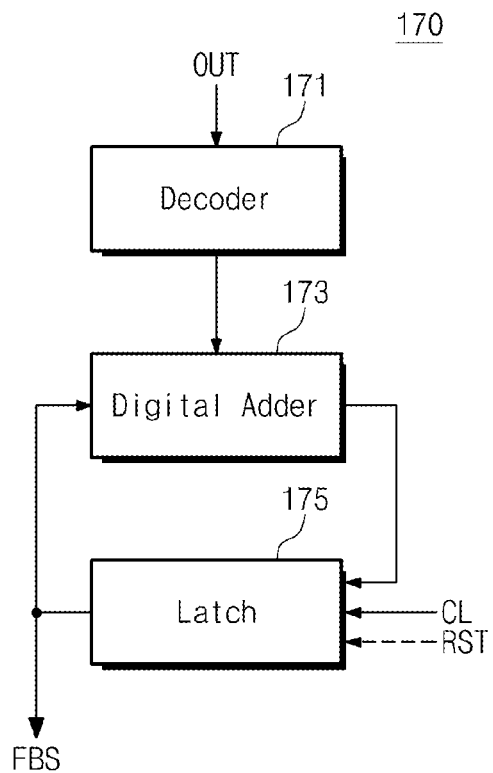
FIG. 7 is a block diagram illustrating a digital adding unit according to an embodiment of the inventive concepts.

FIG. 7 is a block diagram illustrating the digital adding unit 170 according to an embodiment of the inventive concepts. Referring to FIGS. 1 and 7, the digital adding unit 170 may include a decoder 171, a digital adder 173 and a latch 175.

The decoder 171 may receive the counting results OUT1 through OUTm from the analog bit counting unit 160. The decoder 171 may convert the received counting results OUT1 through OUTm into a digital value (e.g., digital bits) of a specific number system. For example, the decoder 171 may convert the counting results OUT1 through OUTm into a digital value of one of various number systems such as a binary system, an octal system, a decimal system, a hexadecimal system, etc.

The digital adder 173 may receive the digital value from the decoder 171. The digital adder 173 may add a value stored in the latch 175 (e.g., digital bits) and the digital value received from the decoder 171.

An input node of the latch 175 may be coupled with an output node of the digital adder 173. An output node of the latch 175 may be coupled with the digital adder 173 and output as the fail bit signal FBS. The latch 175 may operate responsive to the latch signal CL or the reset signal RST. When the reset signal RST is activated, the latch 175 may be reset. When the latch signal CL is activated, the latch 175 may store an output signal of the digital adder 173.

Figure 8:
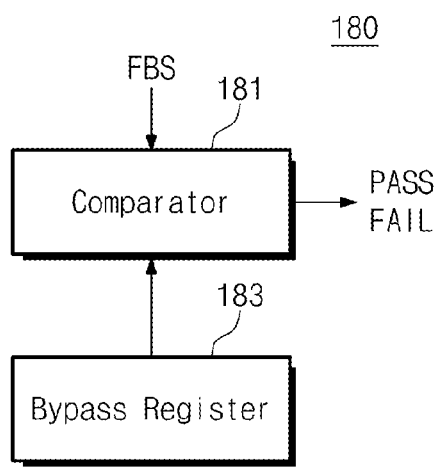
FIG. 8 is a block diagram illustrating an embodiment of a pass/fail checking unit according to the inventive concepts.

FIG. 8 is a block diagram illustrating an embodiment of the pass/fail checking unit 180 according to the inventive concepts. Referring to FIGS. 1 and 8, the pass/fail checking unit 180 may include a comparator 181 and a bypass register 183.

The comparator 181 may receive the fail bit signal FBS from the digital adding unit 170. The bypass register 183 may be configured to store a bypass value. The bypass value may be a number of the fail bits which can be ignored during the program operation. When the value of the fail bit signal FBS is equal to or less than the bypass value, the comparator may output the pass signal PASS. When the value of the fail bit signal FBS is higher than the bypass value, the comparator 181 may output the fail signal FAIL.

Figure 9:
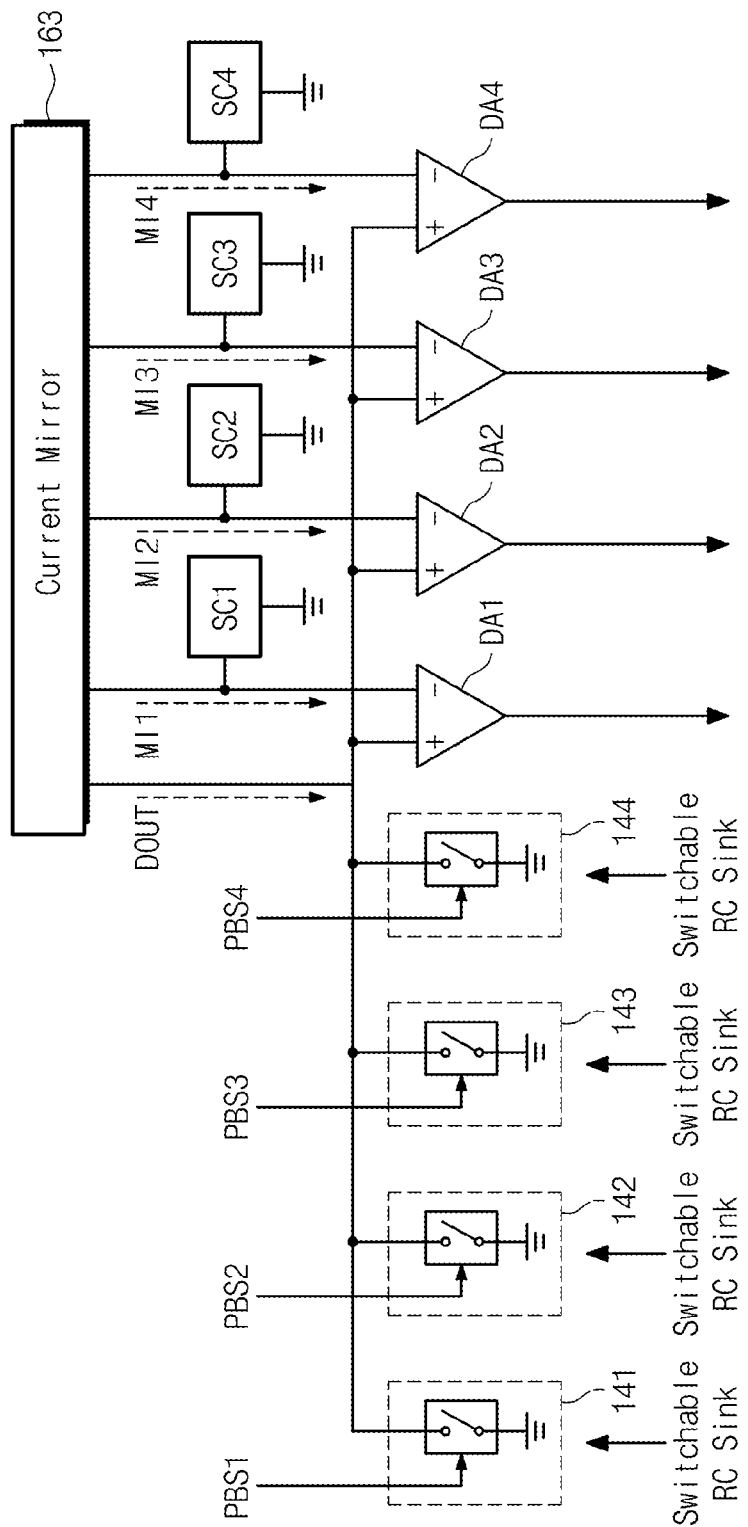
FIG. 9 is a schematic diagram illustrating a portion of the page buffer decoding unit and the analog bit counting unit according to an embodiment of the inventive concepts.

FIG. 9 is a schematic diagram illustrating a portion of the page buffer decoding unit 140 and the analog bit counting unit 160 according to an embodiment of the inventive concepts. The reference load circuit 161 and the first through mth load circuits LC1 through LCm are not shown in FIG. 9 for a convenient description. Referring to FIGS. 4, 6 and 9, the decoders 141 through 144 of the page buffer decoding unit 140 may be current sinks which operate in response to the page buffer signals PBS1 through PBS4. A number of the decoders is not limited.

Each decoder may pull the reference current RC generated in response to the reference current signal RCS. When one of the page buffer signals PBS1 through PBS4 indicates the fail bit, a corresponding decoder of the decoders 141 through 144 may pull the reference current RC. The decoder output signal DOUT may be the total current pulled by the decoders 141 through 144.

The current mirror 163 may mirror the decoder output signal DOUT and output the mirrored signals MI1 through MI4. A number of the mirrored signals MI1 through MI4 is not limited.

The sink circuits SC1 through SC4 may pull currents from the first through fourth mirrored signals MI1 through MI4 respectively. A number of the sink circuits SC1 through SC4 is not limited. An amount of a current pulled by each sink circuit may be determined by the size of the sink transistor therein.

The decoder output signal DOUT may be transferred via a positive input node of the first differential amplifier DA1. The current mirror 163 may provide the first mirrored signal MI1, which is the same to the decoder output signal DOUT, to a negative input node of the first differential amplifier DA1. The first sink circuit SC1 may pull a specific amount of current from the negative input node of the first differential amplifier DA1. When the amount of the current pulled by the first sink circuit SC1 is less than the first mirrored signal MI1, a voltage of the negative input node of the first differential amplifier DA1 may increase, and then the first differential amplifier DA1 may output logic high.

Similarly, the second through fourth differential amplifiers DA2 through DA4 may output logic high or logic low according to whether amounts of currents pulled by the second through fourth sink circuits SC2 through SC4 are larger than the decoder output signal DOUT respectively. By adjusting the amounts of the currents pulled by the sink circuits SC1 through SC4, outputs of the differential amplifiers DA1 through DA4 may be set to indicate information of the number of the fail bits.

Figure 10:
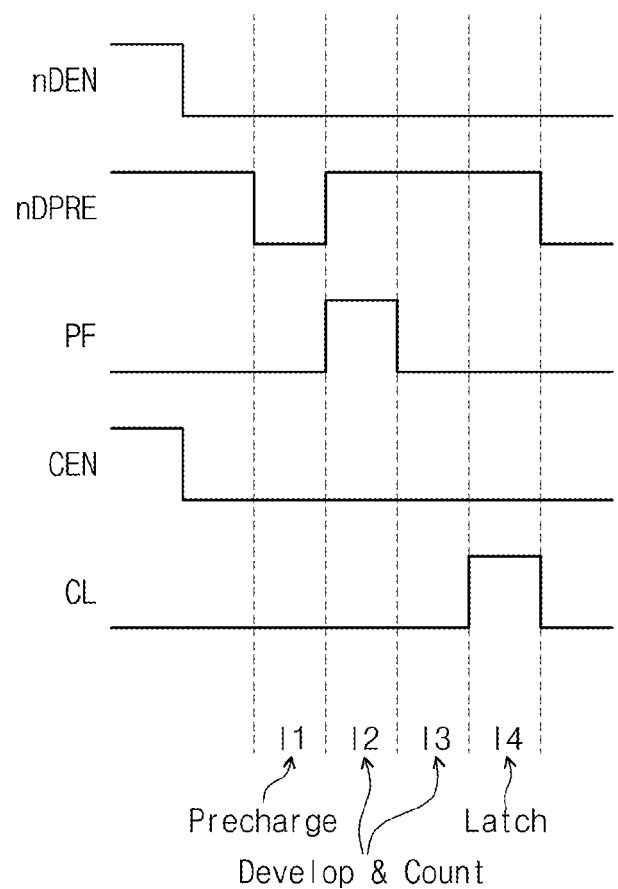
FIG. 10 is a timing diagram illustrating a portion of control signals of the nonvolatile memory device according to an embodiment of the inventive concepts.

FIG. 10 is a timing diagram illustrating an example of a portion of control signals of the nonvolatile memory device 100 according to the inventive concepts. Referring to FIGS. 1 and 10, the decoder enable signal nDEN may be activated, and the page buffer decoding unit 140 may be enabled. The counting enable signal CEN may be activated, and the analog bit counting unit 160 may be enabled.

During the first interval I1, the decoder precharge signal nDPRE may be activated. The first input nodes LG1 of the logic gates LG of the decoders 141 through 14k of the page buffer decoding unit 140 may be precharged to the power supply voltage VCC. The first interval I1 may form a precharge interval.

During the second interval I2, the decoder precharge signal nDPRE may be deactivated. The first input nodes LG1 of the logic gates LG of the decoders 141 through 14k of the page buffer decoding unit 140 may be floated. The transfer signal PF is activated. For example, one of the first through nth transfer signals PF1 through PFn may be activated. That is, the page buffers of one stage of the first through nth stages STAGE1 through STAGEn may output the page buffer signals PBS1 through PBSk. Then, during the third interval I3, the transfer signal PF may be deactivated.

During the second and third intervals I2 and I3, the page buffer decoding unit 140 may output the decoder output signal DOUT according to the number of the fail bits which is indicated by the page buffer signals PBS1 through PBSk. The decoder output signal DOUT may be a current having an amount corresponding to a multiple of the amount of the reference current RC and the number of the fail bits.

The analog bit counting unit 160 may output the counting results OUT1 through OUTm responsive to the decoder output signal DOUT. The counting results OUT1 through OUTm may be converted into the digital value of the specific number system, and then added with the value stored in the latch 175.

The second and third intervals I2 and I3 may form develop and counting intervals.

During the fourth interval I4, the latch signal CL may be activated. The value added by the digital adder 173 may be stored into the latch 175.

FIG. 11 illustrates a first embodiment of the sizes of the sink transistors ST1 through STm and operations of the page buffer decoding unit 140 and analog bit counting unit 160 according to the inventive concepts. The offset based on the reference load circuit 161 and the first through mth load circuits LC1 through LCm may be ignored for convenience of the description. Referring to FIGS. 6, 9 and 11, the sizes of the sink transistors ST1 through STm may be expressed referring to a size W. The size W may be a size of the normal transistor of the nonvolatile memory device 100.

The size of the first sink transistor ST1 may be 0.5 W. When the reference current signal RCS is applied to the first sink transistor, the first transistor may pull a current of 0.5RC. The size of the second sink transistor ST2 may be 1.5 W. The second sink transistor ST2 may pull a current of 1.5RC in response to the reference current signal RCS. The size of the third sink transistor ST3 may be 2.5 W. The third sink transistor ST3 may pull a current of 2.5RC in response to the reference current signal RCS. The size of the fourth sink transistor ST4 may be 3.5 W. The fourth sink transistor ST4 may pull a current of 3.5RC in response to the reference current signal RCS. The size of the mth sink transistor STm may be (m−0.5)W. The mth sink transistor STm may pull a current of (m−0.5)RC in response to the reference current signal RCS.

When the page buffer signals PBS1 through PBSk indicate that the number of the program-failed memory cells is one, the decoder output signal DOUT may be the reference current RC. Each of the 1st through mth mirrored signals MI1 through MIm are the reference current RC. An amount of current pulled through the first sink circuit SC1 is 0.5RC. Thus, charges may be accumulated on the first sink circuit SC1, and a voltage of the first sink circuit SC1 may increase and the first differential amplifier DA1 may output a logic low. Each of the second through mth sink circuits SC2 through SCm pulls a current having more amount than the reference current RC. Thus, each of the second through mth differential amplifiers DA2 through DAm may output logic high.

When the page buffer signals PBS1 through PBSk indicate that the number of the program-failed memory cells is two, the decoder output signal DOUT may be 2RC. Each of the first through mth mirrored signals is 2RC. Amounts of currents pulled by the first and second sink circuits SC1 and SC2 are 0.5RC and 1.5RC respectively, and they are less than the decoder output signal DOUT. Thus, the first and second differential amplifiers DA1 and DA2 may output a logic low, and remaining differential amplifiers DA3 through DAm may output logic high.

When the page buffer signals PBS1 through PBSk indicate that the number of the program-failed memory cells is three, the decoder output signal DOUT may be 3RC. Each of the first through mth mirrored signals is 3RC. Amounts of currents pulled via the first through third sink circuits SC1 through SC3 are 0.5RC, 1.5RC and 2.5RC respectively, and they are less than the decoder output signal DOUT. Thus, the first through third differential amplifiers DA1 through DA3 may output logic low, and remaining differential amplifiers DA4 through DAm may output logic high.

When the page buffer signals PBS1 through PBSk indicate that the number of the program-failed memory cells is equal to or more than m, the decoder output signal DOUT may be equal to or more than mRC. Amount of currents pulled by each of the first through mth sink circuits SC1 through SCm is less than mRC. Thus, the first through mth differential amplifiers DA1 through DAm may output logic low.

As described above, when the sink transistors ST1 through STm are configured to pull different currents having amounts between integer numbers of the reference current RC, the counters C1 through Cm of the analog bit counting unit 160 may output information about the number of program-failed memory cells indicated by the page buffer signals PBS1 through PBSk. For example, the sink transistors SC1 through SCm differ from each other by W in size.

When the first through mth counters C1 through Cm is activated simultaneously, the number of fail bits, which the fail bit signals PBS1 through PBSk indicate, may be counted in parallel. Thus, counting speed increases when compared with counting in series.

For example, the counters C1 through Cm may be divided into a plurality of groups, and the counters C1 through Cm may be activated sequentially in a unit of the divided group.

When the first through mth counters C1 through Cm are provided, the analog bit counting unit 160 may counts the decoder output signal DOUT to mRC. When the number of the fail bits, which the page buffer signals PBS1 through PBSk indicate, is more than m, the page buffer decoding unit 140 pulls a current larger than mRC and the current mirror 163 may output currents MI1 through MIm larger than mRC respectively. By limiting a maximum amount of current pulled by the current mirror 163 using the maximum current signal MCS, power consumption may be reduced.

FIG. 12 illustrates a second embodiment of the sizes of the sink transistors ST1 through STm and operations of the page buffer decoding unit 140 and analog bit counting unit 160 according to the inventive concepts. For example, the offset of the reference load circuit 161 and the first through mth load circuits LC1 through LCm may be ignored. Referring to FIGS. 6, 9 and 12, the sizes of the sink transistors ST1 through STm may be expressed referring to a size W. The size W may be a size of the normal transistor of the nonvolatile memory device 100.

The size of the first sink transistor ST1 may be 0.5 W. When the reference current signal RCS is applied to the first sink transistor, the first transistor may pull a current of 0.5RC. The size of the second sink transistor ST2 may be 2.5 W. The second sink transistor ST2 may pull a current of 2.5RC in response to the reference current signal RCS. The size of the third sink transistor ST3 may be 2.5 W. The third sink transistor ST3 may pull a current of 3.5RC in response to the reference current signal RCS. The size of the fourth sink transistor ST4 may be 4.5 W. The fourth sink transistor ST4 may pull a current of 4.5RC in response to the reference current signal RCS. The size of the mth sink transistor STm may be (2m−1.5)W. The mth sink transistor STm may pull a current of (2m−1.5)RC in response to the reference current signal RCS.

When the page buffer signals PBS1 through PBSk indicate that the number of the program-failed memory cells is one, the decoder output signal DOUT may be the reference current RC. Each of the 1st through mth mirrored signals MI1 through MIm are the reference current RC. An amount of current pulled through the first sink circuit SC1 is 0.5RC. Thus, the first differential amplifier DA1 may output a logic low, and remaining differential amplifiers DA2 through DAm may output logic high.

When the page buffer signals PBS1 through PBSk indicate that the number of the program-failed memory cells is two, the decoder output signal DOUT may be 2RC. Amounts of currents pulled by the first and second sink circuits SC1 and SC2 are 0.5RC and 2.5RC respectively, and they are less than the decoder output signal DOUT. Thus, the first differential amplifier DA1 may output a logic low, and remaining differential amplifiers DA2 through DAm may output logic high.

When the page buffer signals PBS1 through PBSk indicate that the number of the program-failed memory cells is three, the decoder output signal DOUT may be 3RC. Amounts of currents pulled via the first and second sink circuits SC1 through SC2 are 0.5RC and 2.5RC respectively, and they are less than the decoder output signal DOUT. Thus, the first and second third differential amplifiers DA1 through DA2 may output logic low, and remaining differential amplifiers DA3 through DAm may output logic high.

When the page buffer signals PBS1 through PBSk indicate that the number of the program-failed memory cells is equal to or more than 2m, the decoder output signal DOUT may be equal to or more than 2mRC. Amount of currents pulled by each of the first through mth sink circuits SC1 through SCm is less than 2mRC. Thus, the first through mth differential amplifiers DA1 through DAm may output logic low.

As described referring to FIGS. 11 and 12, a resolution and a number of a countable fail bits may be adjusted by adjusting the sized of the sink transistors ST1 through STm. The resolution may be a number of fail bits which causes a transition of a signal among the counting results OUT1 through OUTm of the counting unit 160.

For example, the analog bit counting unit 160 may have one resolution when the sink transistors ST1 through STm are configured to have size differences of W. The analog bit counting unit 160 may have two resolutions when the sink transistors ST1 through STm are configured to have size differences of 2 W. Similarly, the analog bit counting unit 160 may have n resolutions when the sink transistors ST1 through STm are configured to have size differences of nW.

In FIGS. 11 and 12, it is described that the first sink transistor ST1 has a size of 0.5 W. That is, the first counting result OUT1 of the first differential amplifier DA1 transits when the page buffer signals PBS1 through PBSk indicate one fail bit. However, the first transistor ST1 may have a size of (n−0.5)W (n is a positive integer). That is, the first counting result OUT1 may transit when the page buffer signals PBS1 through PBSk indicate n fail bits.

Figure 13:
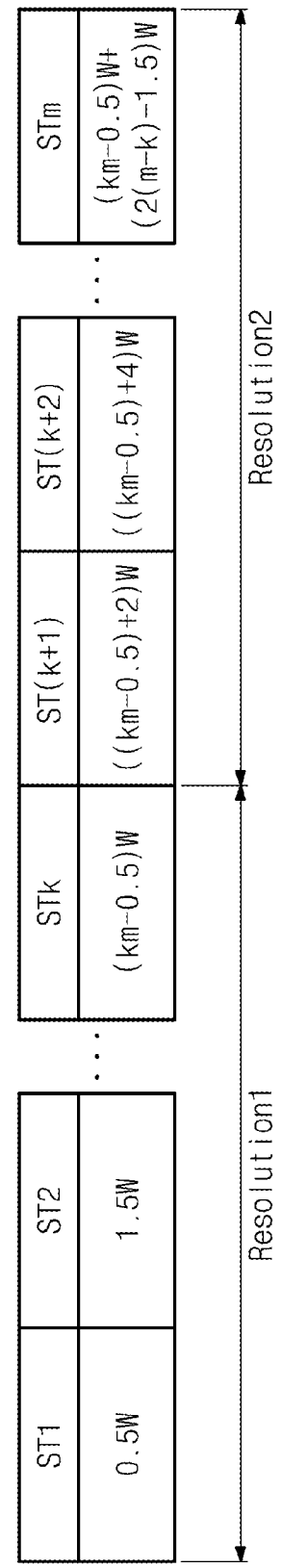
FIG. 13 illustrates an embodiment of sink transistors providing a multi resolution.

FIG. 13 illustrates an embodiment of the sink transistors ST1 through STm providing a multi resolution. Referring to FIGS. 6 and 13, the first through kth sink transistors ST1 through STk may be configured to have differences of W in the sizes. The first through kth counters C1 through Ck may have one resolution. The k+1th through mth sink transistors STk+1 through STm may be configured to have differences of 2 W in the sizes. The k+1th through mth counters Ck+1 through Cm may have two resolutions. That is, the analog bit counting unit 160 may execute the counting with different resolutions according to the number of the fail bits.

Figure 14:
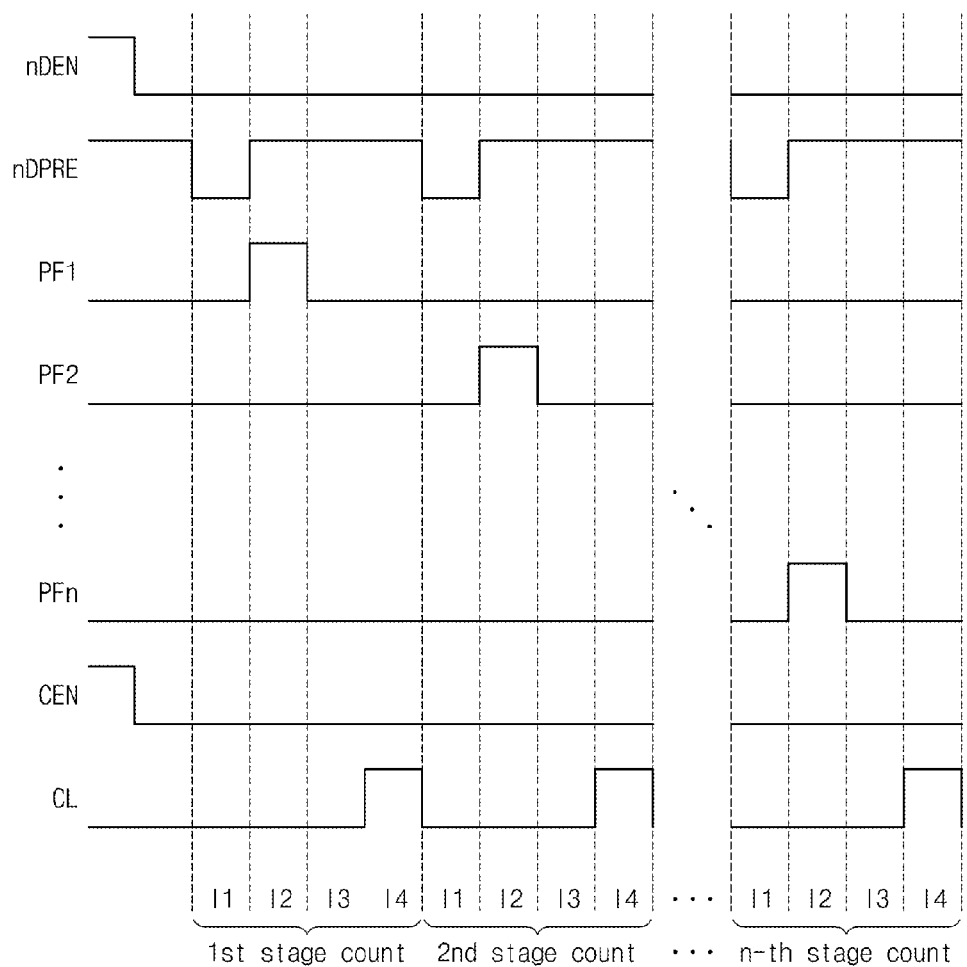
FIG. 14 is a timing diagram illustrating an first embodiment of counting a number of the program-failed memory cells.

FIG. 14 is a timing diagram illustrating a first embodiment of the counting the number of the program-failed memory cells. Referring to FIGS. 1 through 10 and 14, the counting is performed in a unit of the stage of the page buffers PB1 through PBr.

The decoder enable signal nDEN and the count enable signal CEN are activated. In response to the activated decoder enable signal nDEN, the page buffer decoding unit 140 is enabled. In response to the count enable signal CEN, the analog bit counting unit 160 is enabled. For example, the reset signal RST may be activated along with the decoder enable signal nDEN and the count enable signal. The decoder enable signal nDEN and the count enable signal CEN may be activated concurrently or in a specific order.

A counting of fail bits of the verify-read result of page buffers PB1 and PBo of the first stage STAGE1 is performed. During a precharge interval I1, the decoder precharge signal nDPRE is activated. The first input nodes LG1 of the logic gates LG of the page buffer decoding unit 140 may be precharged to the power supply voltage.

During develop and count intervals I2 and I3, the first transfer signal PF1 is activated and then deactivated. The page buffers PB1 and PBo of the first stage STAGE1 may output the verify-read result as the page buffer signals PBS1 through PBSk. The page buffer decoding unit 140 may output the decoder output signal DOUT in response to the page buffer signals PBS1 through PBSk. The decoder output signal DOUT may have an amount of integer times of the reference current RC.

Based on the decoder output signal DOUT, the counters C1 through Cm of the analog bit counting unit 160 may count the number of fail bits of the verify-read result from the page buffers PB12 and PBO of the first stage STAGE1. The analog bit counting unit 160 may output the counting results OUT1 through OUTm. The decoder 171 of the digital adding unit 170 may convert the counting results OUT1 through OUTm into a digital value. The digital adder 173 may add a value output from the decoder 171 with a value stored in the latch 175.

During the latch interval I4, the latch signal CL is activated. The latch 175 may store a value added by the digital adder 173 in response to the activation of the latch signal CL.

Then, a counting of the verify-read result of the page buffers PB2 and PBp of the second stage STAGE2 is performed. During the precharge interval I1, the precharge of the page buffer decoding unit 140 is performed.

During the develop and count intervals I2 and I3, the second transfer signal PF2 is activated and then deactivated. The page buffers PB2 and PBp of the second stage STAGE2 may output the verify-read result as the page buffer signals PBS1 through PBSk. In response to the page buffer signals PBS1 through PBSk, the page buffer decoding unit 140 may output the decoder output signal DOUT. The number of the fail bits of the verify-read result from the page buffers PB2 and PBp of the second stage STAGE2 is counted according to the decoder output signal DOUT.

During the latch interval I4, the value stored in the latch 175 and the digital value output from the decoder 171 are added. That is, the number of the fail bits of the verify-read result from the page buffers PB1 and PBo of the first stage STAGE1 are added with that of the page buffers PB2 and PBp of the second stage STAGE2.

A counting of the verify-read result of the page buffers PNn and PBr of the nth stage STAGEn is performed. During the precharge interval IL the precharge of the page buffer decoding unit 140 is executed.

During the develop and count intervals I2 and I3, the nth transfer signal PFn is activated and then deactivated. The page buffers PBn and PBr of the nth stage STAGEn may output the verify-read result as the page buffer signals PBS1 through PBSk. In response to the page buffer signals PBS1 through PBSk, the page buffer decoding unit 140 may output the decoder output signal DOUT. The number of the fail bits of the verify-read result from the page buffers PBn and PBr of the nth stage STAGEn is counted.

During the latch interval I4, the value stored in the latch 175 is added with the digital value output from the decoder 171. The numbers of the fail bits of the page buffers PB1 through PBr of the first through nth stages STAGE1 through STAGEn are added up. That is, the number of the fail bits of the page buffers PB1 through PBr is counted sequentially in an unit of the stage.

Figure 15:
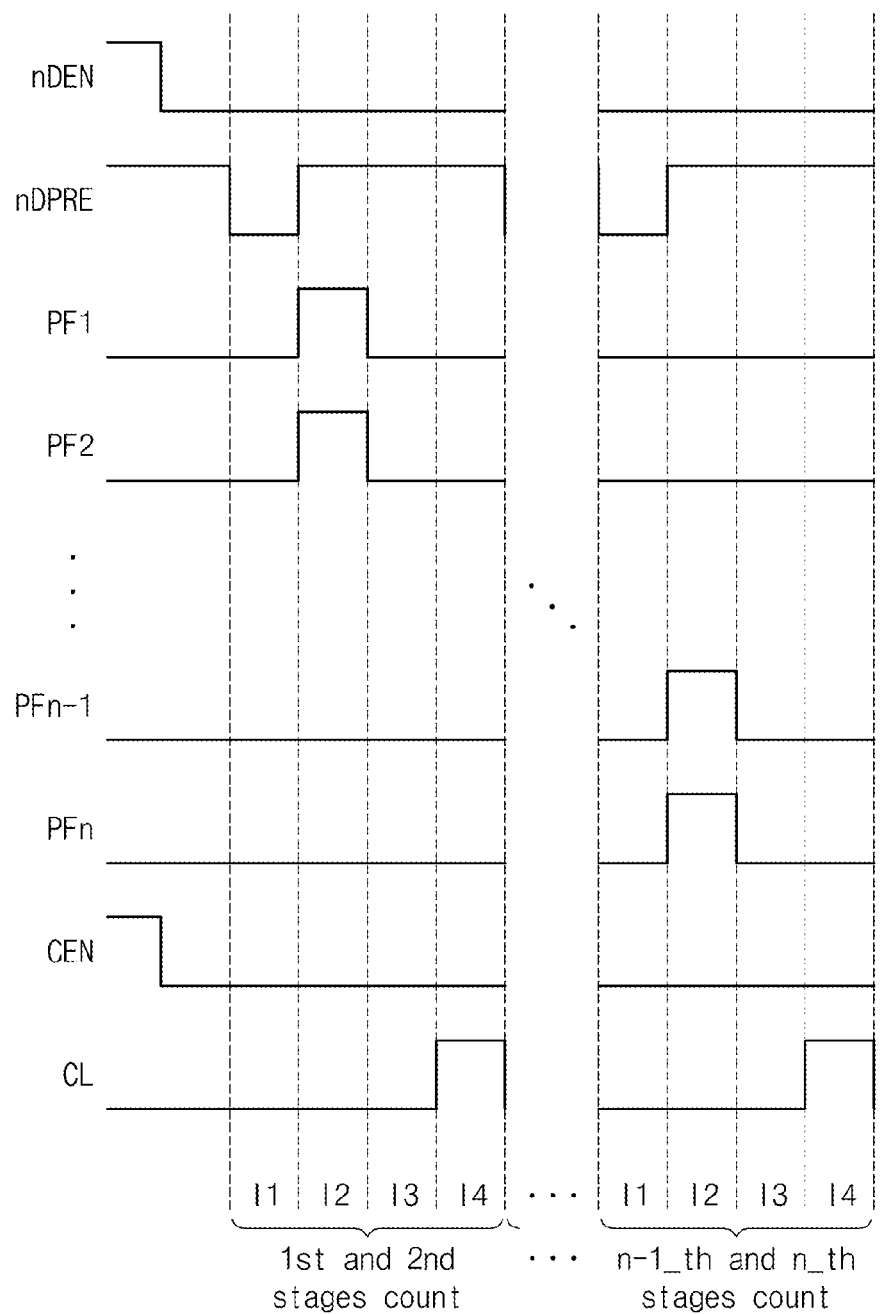
FIG. 15 is a timing diagram illustrating a second embodiment of counting a number of the program-failed memory cells.

FIG. 15 is a timing diagram illustrating a second embodiment of the counting the number of the program-failed memory cells. When compared with the timing diagram shown in FIG. 14, two transfer signals (e.g., PF1 and PF2) are activated concurrently in the develop and count intervals I2 and I3. When the two transfer signals are activated simultaneously, verify-read results of page buffers of two stages counted concurrently. Thus, counting time may be reduced.

Figure 16:
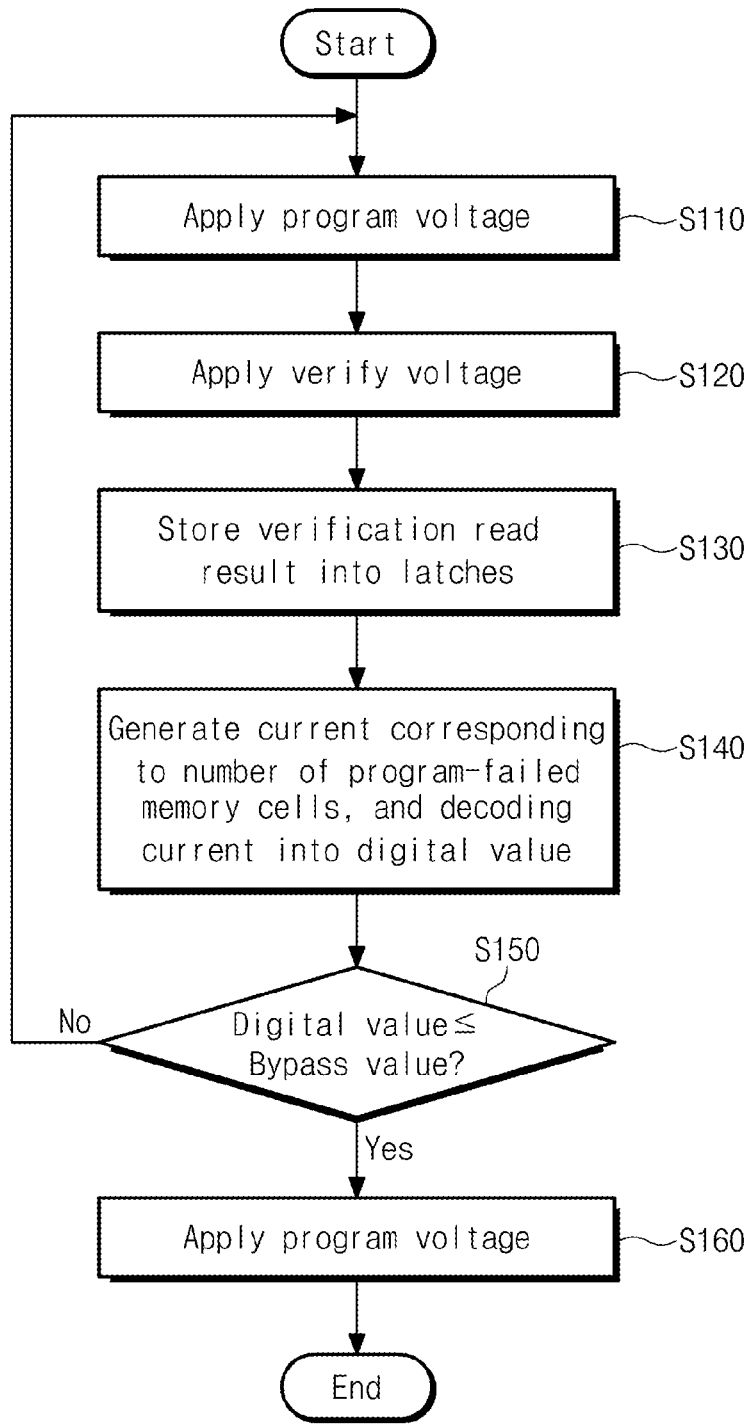
FIG. 16 is a flow chart illustrating a first embodiment of a programming method according to the inventive concepts.

FIG. 16 is a flow chart illustrating a first embodiment of a programming method according to the inventive concepts. Referring to FIGS. 1 and 16, a program voltage is applied in a step S110. For example, the program voltage may be applied to a selected word line among the word lines WL1 through WLi (shown in FIG. 2). A verify voltage is applied in a step S120. The verify voltage may be applied to the selected word line.

The verify-read result is stored into latches in a step S130. For example, the verify-read result may be stored into the first and second latches L1 and L2 of the page buffer unit 130 (shown in FIG. 3).

A current corresponding to the number of the program-failed memory cells is generated, and the generated current is decoded into the digital value in a step S140. The page buffer decoding unit 140 may generate the current (i.e., the decoder output signal DOUT) corresponding to the number of the fail bits. The page buffer decoding unit 140 may output the decoder output signal DOUT once a stage of the stages STAGE1 through STAGEn of the page buffers PB1 through PBr.

The analog bit counting unit 160 may count the number of the fail bits from the output signal of the page buffer decoding unit 140 (i.e., the decoder output signal DOUT). The analog bit counting unit 160 may output the counting results OUT1 through OUTm once a stage of the stages STAGE1 through STAGEn of the page buffers PB1 through PBr.

The digital adding unit 170 may decode the counting results OUT1 through OUTm of the analog bit counting unit 160 into the digital value. The digital adding unit 170 may decode the counting result OUT1 through OUTm into the digital value once a stage of the stages STAGE1 through STAGEn, and may calculate a total sum. The total sum may be stored in the latch 175.

It is determined whether the digital value stored in the latch 175 (i.e., the total sum) is equal to or less than the bypass value in a step S150. The pass/fail checking unit 180 may determine whether the digital value stored in the latch 175 is equal to or less than the bypass value stored in the bypass register 183. When the digital value stored in the latch is more than the bypass value, the step S110 may be reexecuted. That is, a program loop, which includes the applying the program voltage and the applying the verify voltage, is repeated. The control unit 190 may repeat the program loop in response to the fail signal FAIL.

When the digital value stored in the latch 175 is equal to or less than the bypass value, a step S160 may be performed. In the step S160, the program voltage is applied and then the program operation is ended. For example, the pass/fail checking unit 180 may output the pass signal PASS when the digital value stored in the latch 175 is equal to or less than the bypass value. The control unit 190 may the nonvolatile memory device 100 that the program voltage is applied once more and the program operation is ended in response to the pass signal PASS.

The bypass value may be less than a number of error bits which can be corrected by the nonvolatile memory device 100 or a host thereof. That is, when error bits which can be corrected by an error correcting algorithm are detected, the nonvolatile memory device 100 may determine the program pass and end the program operation. Thus, time consumption caused by slow memory cells, which are programmed slower than normal memory cells, are reduced.

When the program pass is determined, the nonvolatile memory device 100 may apply the program voltage once more and end the program operation. Due to the program voltage applied once more, a portion of the program-failed memory cells may be programmed to be program-passed. Thus, the number of the program-failed memory cells may be reduced without an additional verify-read operation.

Figure 17:
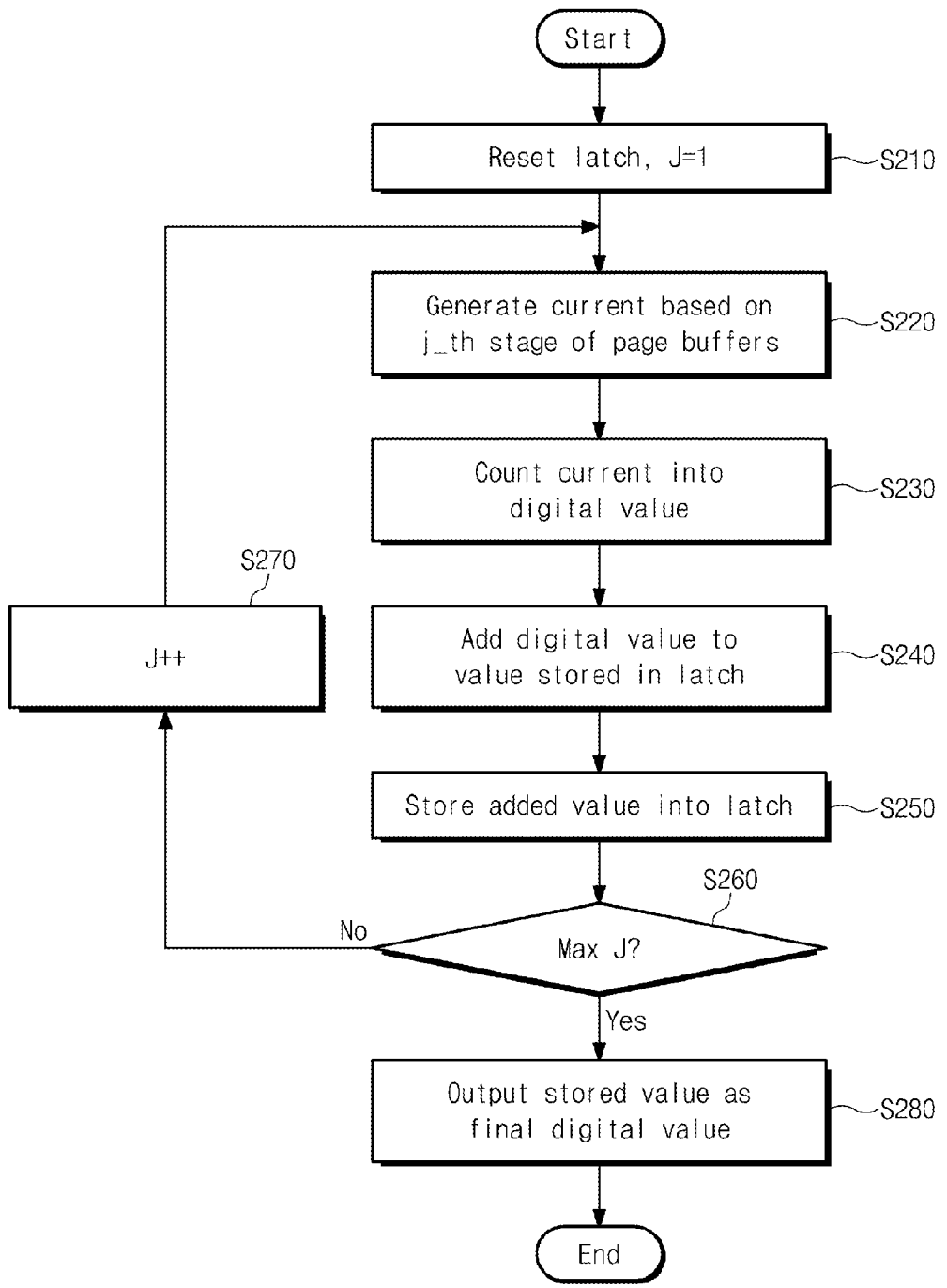
FIG. 17 is a flow chart illustrating an embodiment of generating a current and decoding the generated current into a digital value shown in the step S140 of FIG. 16.

FIG. 17 is a flow chart illustrating the generating the current and decoding the generated current into the digital value shown in the step S140 of FIG. 16. Referring to FIG. 17, the latch 175 (shown in FIG. 7) is reset and a variable J is initialized to '1' in a step S110.

The current (i.e., the decoder output signal DOUT) may be generated (e.g., be sunken) based on Jth stage STAGEJ of the page buffers PB1 through PBr. When the Jth transfer signal PFJ is activated in the page buffer unit 130, the page buffer decoding unit 140 may output the decoder output signal DOUT. The generated current, that is, the decoder output signal DOUT may correspond to the number of the fail bits of the verify-read result stored in the Jth stage of the page buffers PB1 through PBr.

The current is decoded into the digital value in a step S230. The analog bit counting unit 160 (shown in FIG. 6) may count the number of the fail bits from the decoder output signal DOUT, and output the counting results OUT1 through OUTm. The digital adding unit 170 (shown in FIG. 7) may decode the counting results OUT1 through OUTm into the digital value.

The digital value is added with the value stored in the latch 175 in a step S240. The digital adder 173 may add the digital value output from the decoder 171 and the value stored in the latch 175, and output the added value.

The added value is stored into the latch 175 in a step S250. The latch 175 may store the output of the adder 173 in response to the latch signal CL.

It is determined whether the variable J is max in a step S260. That is, it is determined whether the counting of the step S220 through S250 is performed to all stages of the page buffers PB1 through PBr. When the variable J is not max, the variable J increases in a step S270 and then the step S220 is reexecuted. When the variable J is max, the value stored in the latch 175 is output as the final digital value in a step S280.

Figure 18:
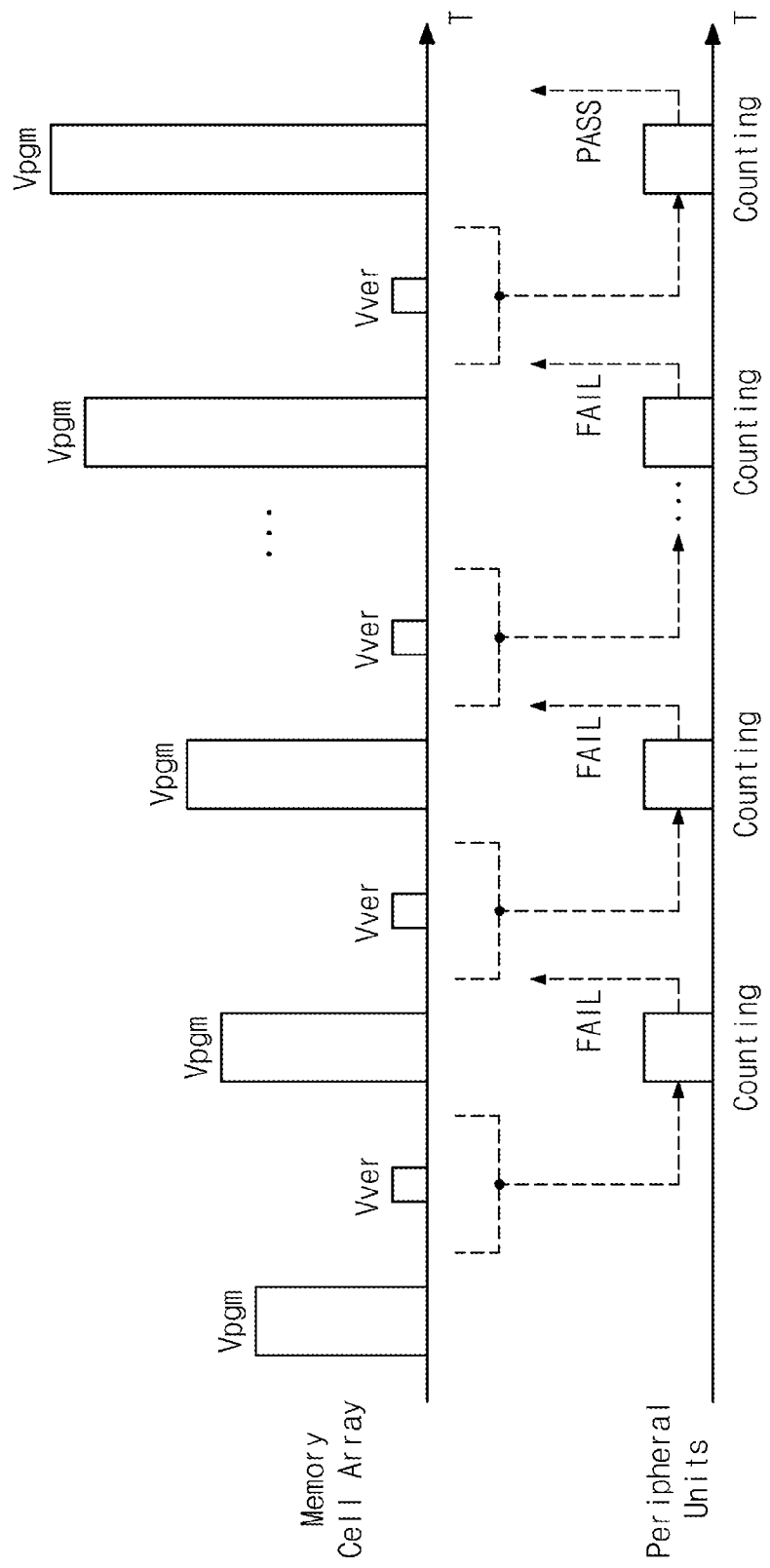
FIG. 18 is a timing diagram illustrating a first example of the program method of the inventive concepts.

FIG. 18 is a timing diagram illustrating a first example of the program method of the inventive concepts. Referring to FIG. 18, the program voltage Vpgm is applied and the verify voltage Vver is applied to the memory cell array 105 (shown in FIG. 2). The applying of the program voltage Vpgm and the verify voltage Vver may form a program loop.

The counting is performed in a peripheral units, that is, in the page buffer decoding unit 140, analog bit counting unit 160 and digital adding unit 170 based on the verify-read result. For example, the number of the fail bits may be counted from the verify-read result. The program voltage Vpgm may be applied to the memory cell array 105 during the counting is performed in the peripheral units.

When the digital value, which is result of the counting, is more than the bypass value, that is, when the number of the fail bits is more than the bypass value, the program fail is determined. When the program fail is determined, the verify voltage Vver may be applied to the memory cell array 105 additionally. The program voltage Vpgm may be applied to the memory cell array 105 during the counting caused by the additionally applied verify voltage and the following verify-read result.

The counting of the fail bits may be performed during the program voltage Vpgm is applied. Thus, a separate time for the counting of the fail bits is not needed.

When the digital value, which is the result of the counting, is equal to or less than the bypass value, that is, when the number of the fail bits is equal to or less than the bypass value, the program pass is determined. When the program pass is determined, the verify voltage Vver may not be applied and the program operation may be ended.

When the number of the fail bits is less than the bypass value, the program pass is determined. Thus, time delay due to the slow memory cells is prevented.

The counting is performed overlapped (or concurrently) with the applying of the program voltage Vpgm. Thus, even though the program pass is determined, the program voltage Vpgm may be applied once more during execution of the determination. Thus, the number of program-failed memory cells may be reduced.

Figure 19:
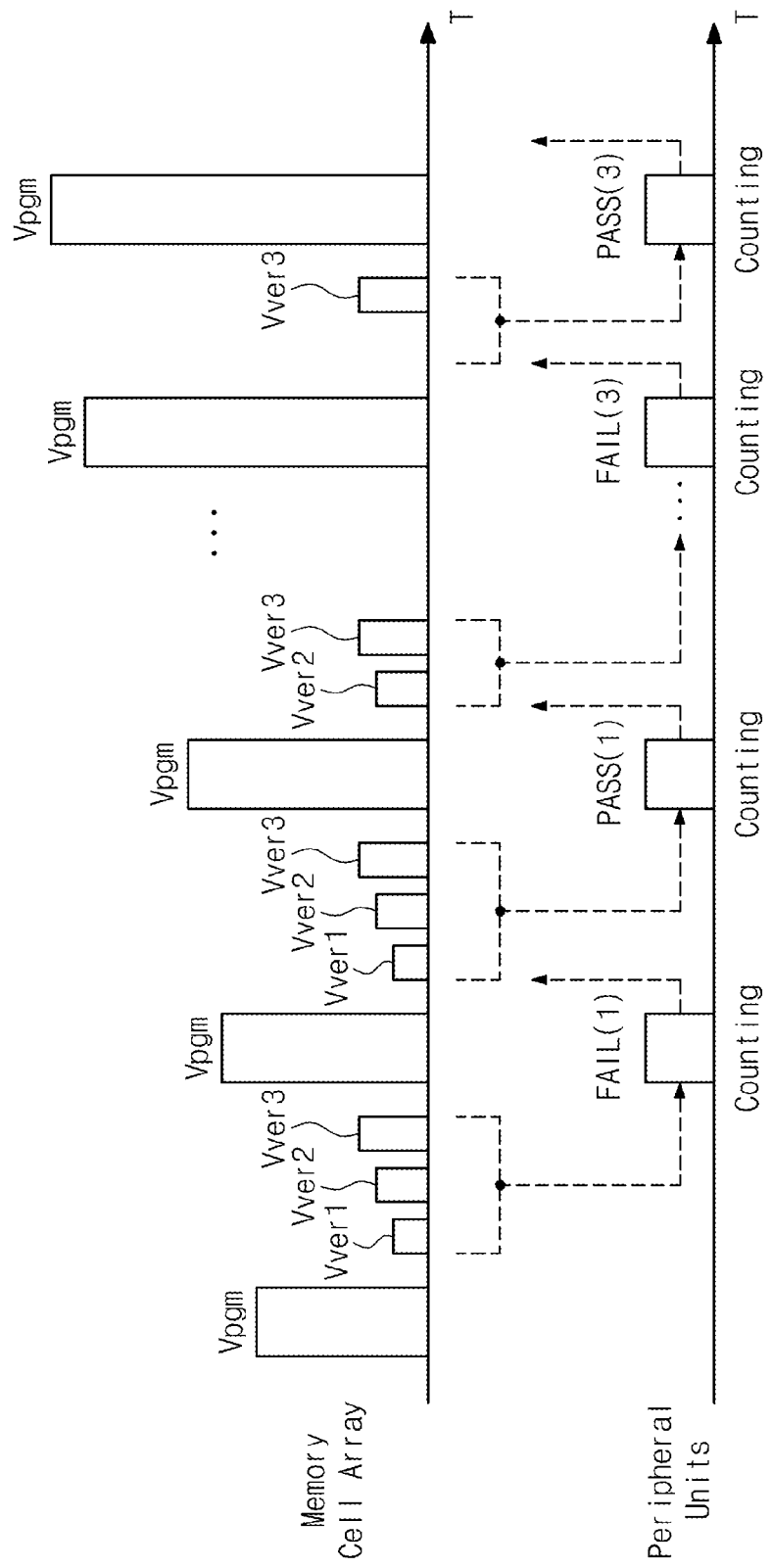
FIG. 19 is a timing diagram illustrating a second example of the program method of the inventive concepts.

FIG. 19 is a timing diagram illustrating a second example of the program method of the inventive concepts. Referring to FIG. 19, the memory cells MC (shown in FIG. 2) may include multi-level cells MLC. The memory cells may be programmed and verified using at least one program voltage and at least one verify voltage to a plurality of program states simultaneously.

Memory cells programmed to a first program state may be verified using a first verify voltage Vver1. Memory cells programmed to a second program state may be verified using a second verify voltage Vver2. Memory cells programmed to a third program state may be verified using a third verify voltage Vver3.

The counting may be performed to a verify-read result corresponding to the lowest verify voltage Vver1 among verify-read results according to the plurality of verify voltages Vver1 through Vver3. Based on the verify-read result of the first verify voltage Vver1, the number of the fail bits to be programmed to the first program state may be compared with the bypass value. The program pass or program fail of the first program state may be determined according to the comparison result.

When the verify-read result of the first verify voltage Vver1 is determined the program fail, the program loop may be reexecuted and the counting corresponding to the first verify voltage Vver1 may be reperformed. When the verify-read result of the first verify voltage Vver1 is determined the program pass, the first verify voltage Vver1 may not be applied any more. Then, the counting may be performed to a verify-read result corresponding to the next lowest verify voltage Vver2. Based on the verify-read result of the second verify voltage Vver2, the number of the fail bits to be programmed to the second program state may be compared with the bypass value. The program pass or program fail may be determined according to the comparison result.

When the verify-read result of the second verify voltage Vver2 is determined the program fail, the program loop may be reexecuted and the counting corresponding to the second verify voltage Vver2 may be reperformed. When the verify-read result of the second verify voltage Vver2 is determined the program pass, the second verify voltage Vver2 may not be applied any more. Then, the counting may be performed to a verify-read result corresponding to the next lowest verify voltage Vver3. Based on the verify-read result of the third verify voltage Vver3 the number of the fail bits to be programmed to the third program state may be compared with the bypass value. The program pass or program fail may be determined according to the comparison result.

When the verify-read result of the third verify voltage Vver3 is determined the program fail, the program loop may be reexecuted and the counting corresponding to the third verify voltage Vver3 may be reperformed. When the verify-read result of the third verify voltage Vver2 is determined the program pass, the third verify voltage Vver3 may not be applied any more. Then, the counting may be performed to a verify-read result corresponding to the next lowest verify voltage. If there are no verify voltage applied, that is, the memory cells are program passed, the program operation may be ended.

For example, a number of program states programmed concurrently is not limited. When the memory cells are programmed to k program states simultaneously, the program operation and verify operation may be performed using k verify voltages.

Figure 20:
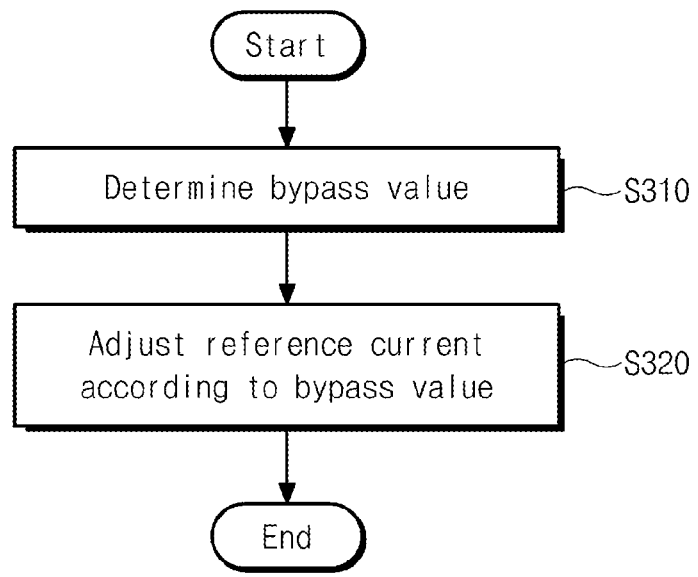
FIG. 20 is a flow chart illustrating an example of an operating method of the current generating unit 150 and control unit 190 shown in FIG. 1.

FIG. 20 is a flow chart illustrating an example of operating method of the current generating unit 150 and control unit 190 shown in FIG. 1. Referring to FIGS. 1, 5 and 20, the bypass value is determined in a step S310. For example, the bypass value may be determined by the control unit 190. The bypass value may be determined by a program circuit like a mode register set MRS (not shown).

The reference current RC is adjusted according to the determined bypass value in a step S320.

According to the determined bypass value, the number of the fail bits to be counted in the analog bit counting unit 160 may be adjusted. When the number of the fail bits to be counted in the analog bit counting unit 160 is adjusted, effects of noises may vary. By adjusting the amount of the reference current RC according to the number of the fail bits to be counted, the variation of the noises may be compensated. For example, the resistances of the feedback variable resistor 153 may be adjusted when the current option signals COST through COS4 are adjusted. When the resistances of the feedback variable resistor 153 is adjusted, the reference current signal RCS is adjusted and then the amount of the reference current RC may be adjusted.

For example, the control unit 190 may adjust the reference current signal RCS according to a prestored table when the bypass value is determined. The control unit 190 may adjust the reference current signal RCS adaptively.

Figure 21:
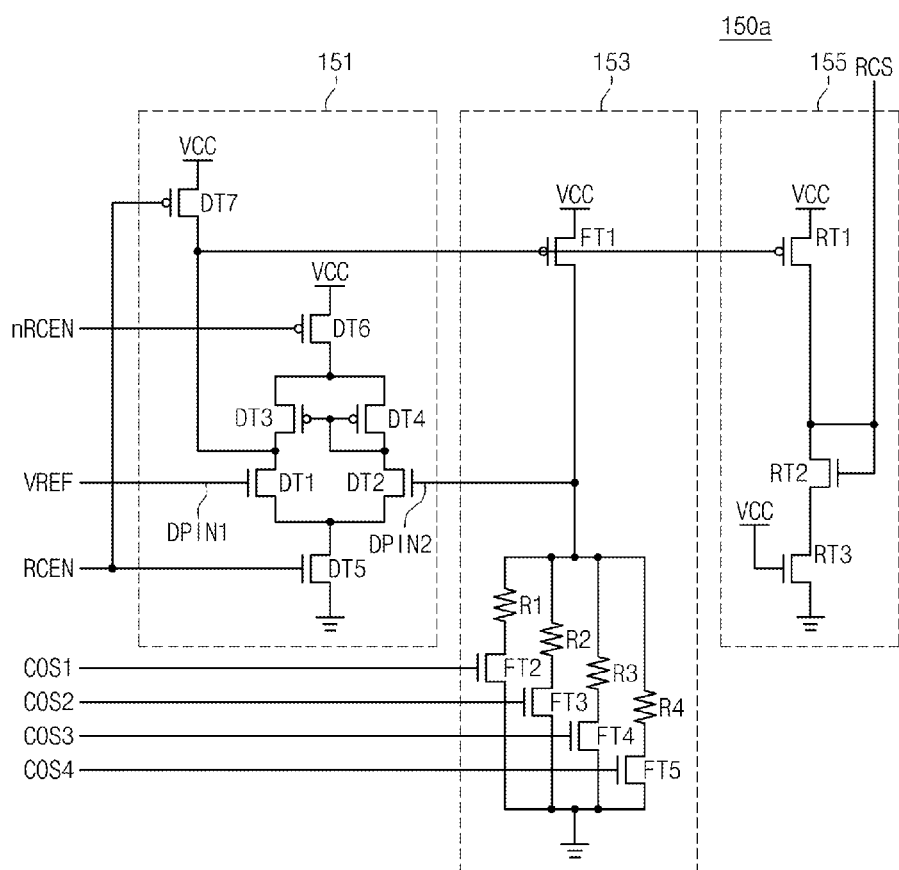
FIG. 21 is a circuit diagram illustrating a second embodiment of the current generating unit according to the inventive concepts.

FIG. 21 is a circuit diagram illustrating a second embodiment of the current generating unit 150 according to the inventive concepts. When compared with the current generating unit 150 shown in FIG. 5, the maximum current signal generator 159 may not be provided in the current generating unit 150a according to the second embodiment. The current generating unit 150a may be configured to output the reference current signal RCS without outputting the maximum current signal MCS.

Figure 22:
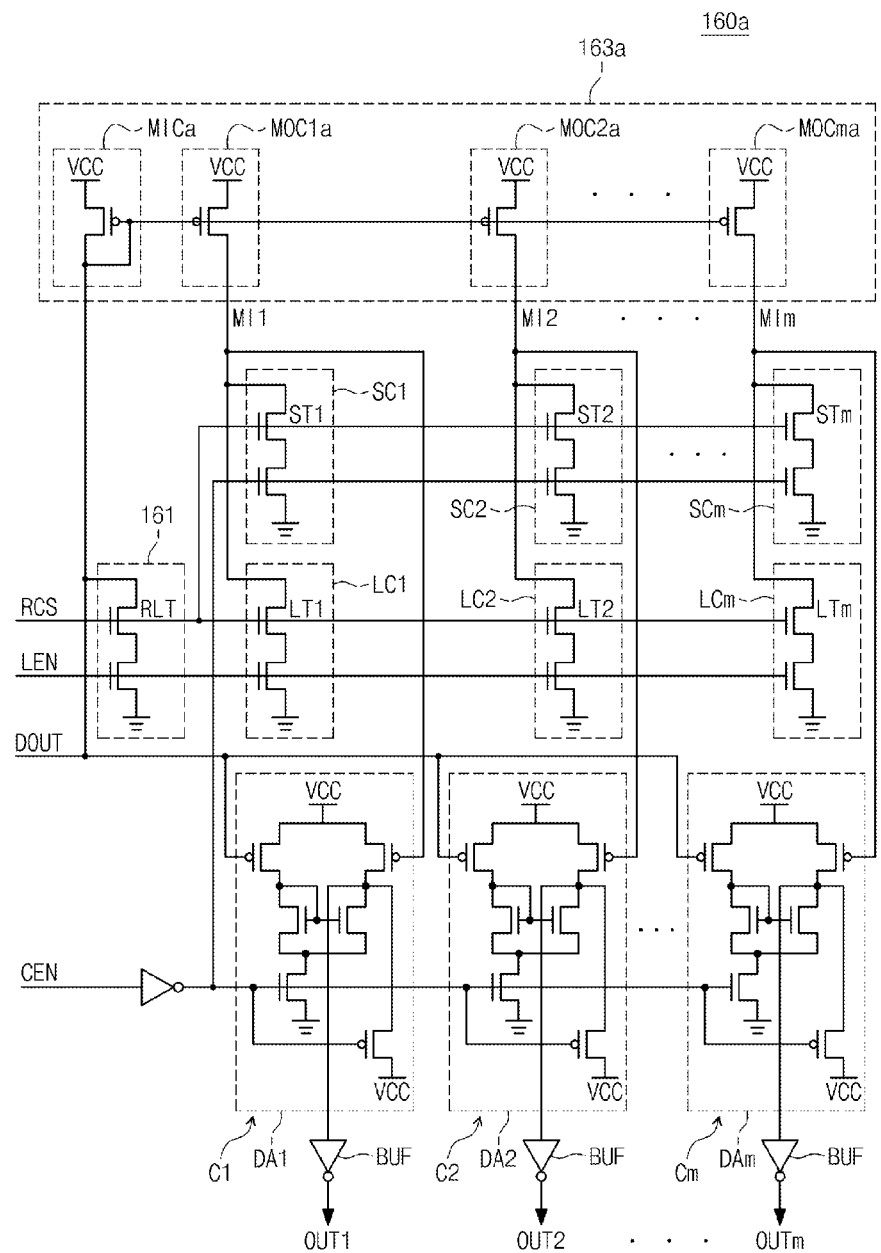
FIG. 22 is a circuit diagram illustrating a second embodiment of the analog bit counting unit according to the inventive concepts.

FIG. 22 is a circuit diagram illustrating a second embodiment of the analog bit counting unit 160 according to the inventive concepts. When compared with the analog bit counting unit 160 shown in FIG. 6, the transistors limiting the maximum amount of the currents may not be provided in the mirror input circuit MICa and the first through mth mirror output circuits MOC1a through MOCma of the analog bit counting unit 160a according to the second embodiments. The maximum current signal MCS may not be provided.

Figure 23:
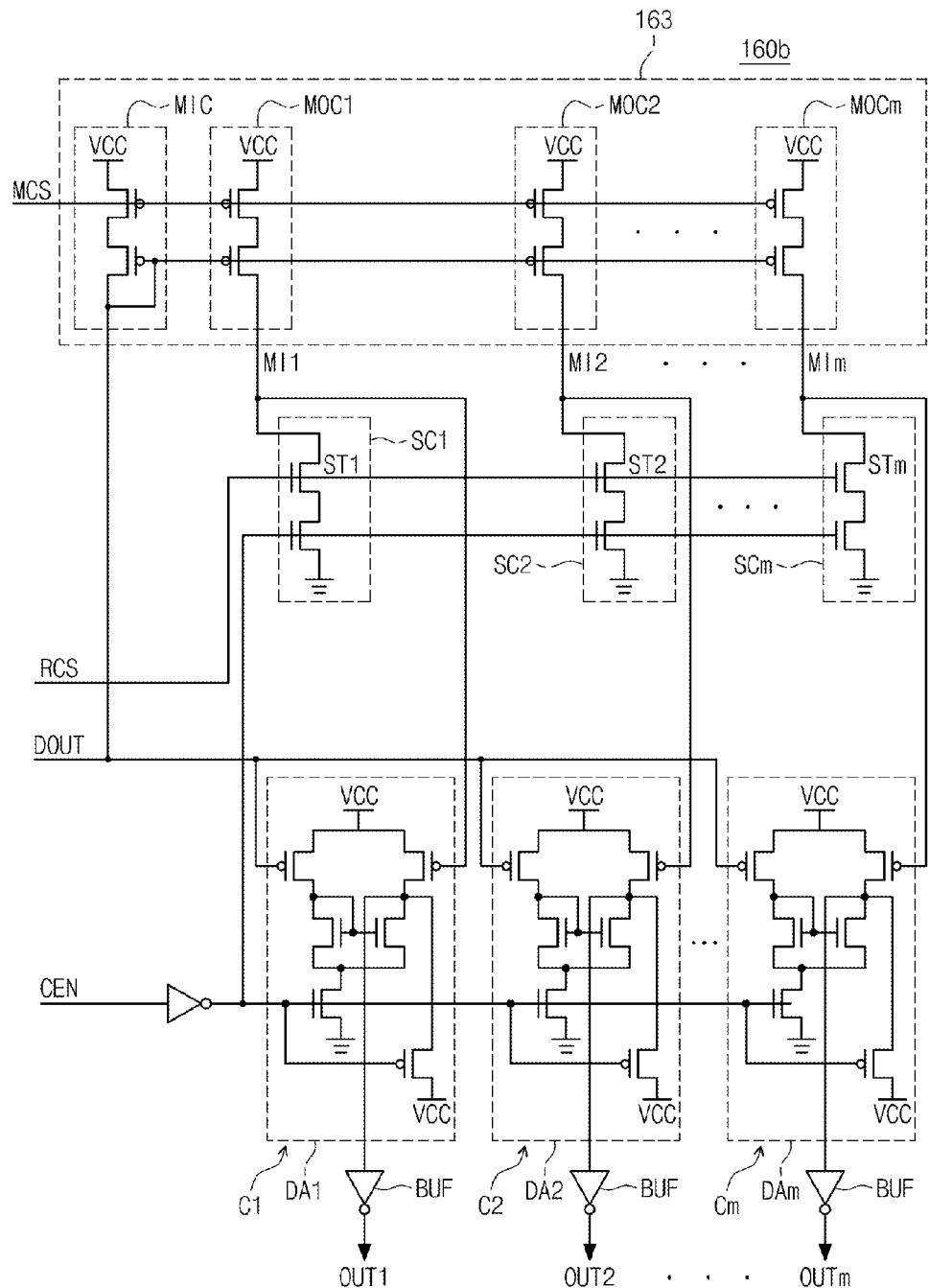
FIG. 23 is a circuit diagram illustrating a third embodiment of the analog bit counting unit according to the inventive concepts.

FIG. 23 is a circuit diagram illustrating a third embodiment of the analog bit counting unit 160 according to the inventive concepts. When compared with the analog bit counting unit 160 shown in FIG. 6, the reference load circuit 161 and the first through mth load circuits LC1 through LCm may not be provided in the analog bit counting unit 160b according to the third embodiment. The load enable signal LEN may not be provided.

Figure 24:
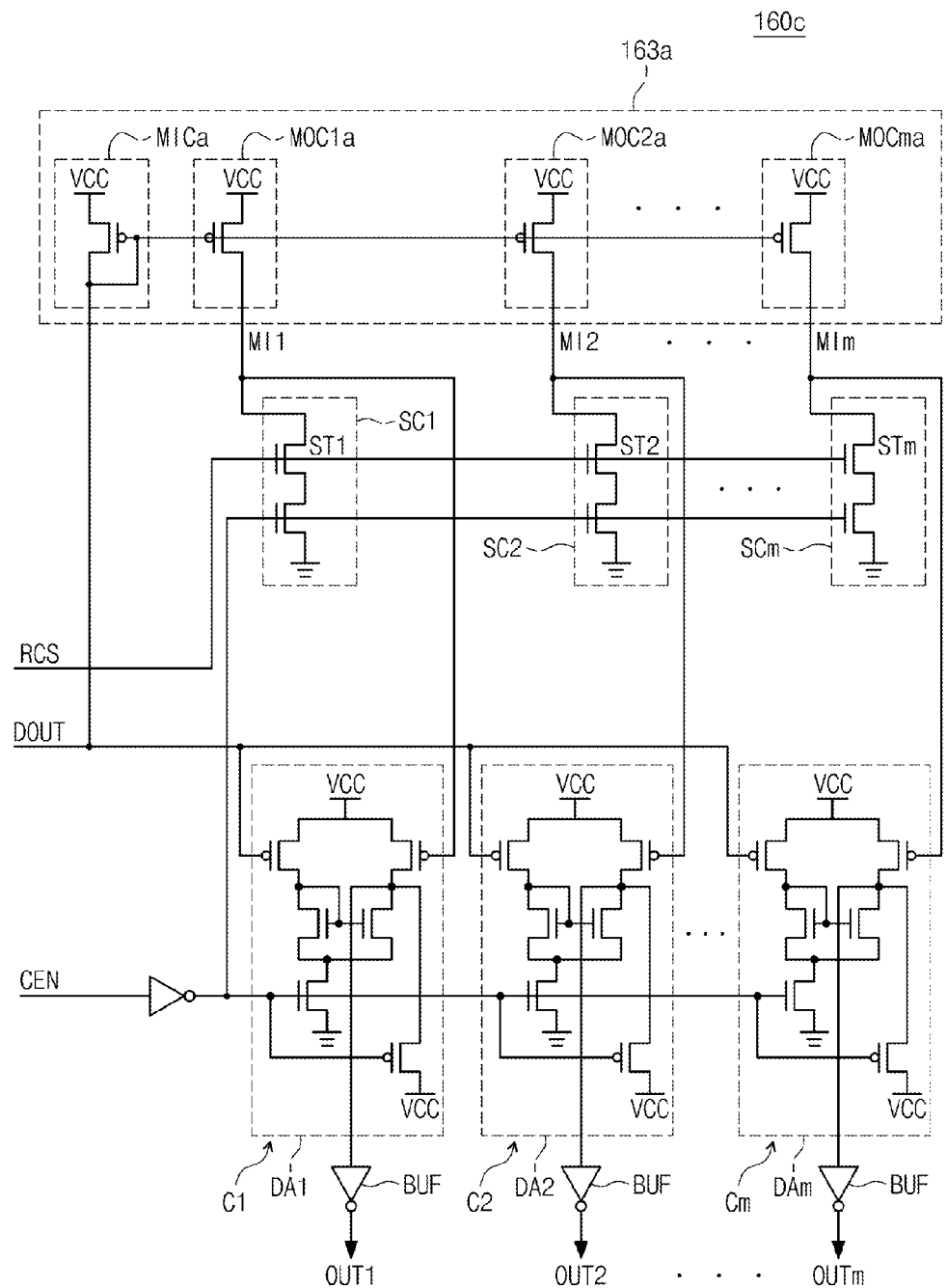
FIG. 24 is a circuit diagram illustrating a fourth embodiment of the analog bit counting unit according to the inventive concepts.

FIG. 24 is a circuit diagram illustrating a fourth embodiment of the analog bit counting unit 160 according to the inventive concepts. When compared with the analog bit counting unit 160 shown in FIG. 6, the reference load circuit 161 and the first through mth load circuits LC1 through LCm may not be provided in the analog bit counting unit 160b according to the fourth embodiment. The load enable signal LEN may not be provided.

The transistors limiting the maximum amount of the currents may not be provided in the mirror input circuit MICa and the first through mth mirror output circuits MOC1a through MOCm. The maximum current signal MCS may not be provided.

Figure 25:
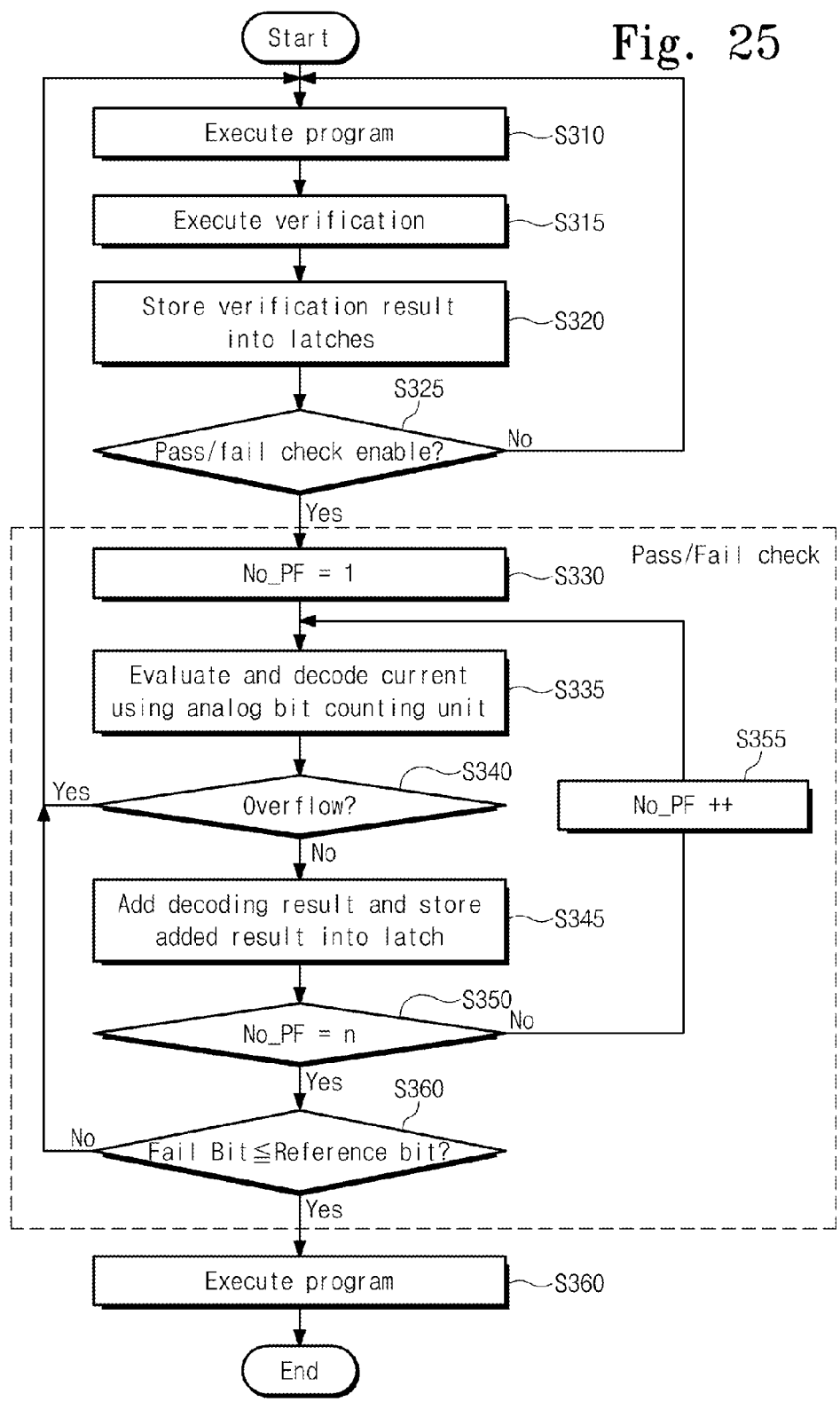
FIG. 25 is a flow chart illustrating a second embodiment of the programming method according to the inventive concepts.

FIG. 25 is a flow chart illustrating a second embodiment of the programming method according to the inventive concepts. Referring to FIGS. 1 and 25, the program is executed in a step S310. The program voltage Vpgm may be applied to the selected word line of the memory cell array 105.

The verification is executed in a step S315. The verification may be executed to memory cells connected to the selected memory cells.

The verify-read result may be stored in the latches in a step S320. For example, the verify-read result may be stored in the second latches L2 (shown in FIG. 3).

It is determined whether a pass/fail check is enabled in a step S325. When the pass/fail check is enabled, a step S330 is performed. When the pass/fail check is not enabled, the step S310 may be reexecuted. For example, when a number of the program loop executed is equal to or less than a reference value, the pass/fail check may be disabled. When the number of the program loop executed is over the reference value, the pass/fail check may be enabled.

In the step S330, the transfer variable No_PF is initialized. For example, the transfer variable No_PG may be initialized to '1'. The transfer signal (e.g., PF1) corresponding to the transfer variable may be activated. Upon activation of the transfer signal (e.g., PF1), the page buffer decoding unit 140 may output the current (i.e., the decoder output signal DOUT).

The currents are evaluated and decoded using the analog bit counting unit 160 in a step S335. For example, the analog bit counting unit 160 may evaluate the currents output from the page buffer decoding unit 140 and decode the evaluation result.

It is determined whether an overflow occurs in a step S340. For example, it is determined whether the currents output from the page buffer decoding unit 140 is over a countable range of the analog bit counting unit 160. When the overflow occurs, the program may be reexecuted in the step S310. When the overflow does not occur, a step S345 may be performed.

The decoding results are added up and the added up result is stored in the latch in a step S345. The digital adding unit 170 may add the output from the analog bit counting unit 160 with the value stored in the latch 175 (shown in FIG. 7), then store the added result into the latch 175.

It is determined whether the transfer variable No_PF is max (e.g., n). That is, it is determined whether each of the transfer signals PF1 through PFn is activated once. When the transfer variable No_PF is not max, the transfer variable No_PF increases in a step S355. Then, the transfer signal (e.g., PF2) corresponding to the increased transfer variable No_PF is activated, and the page buffer decoding unit 140 may output the current. When the transfer variable No_PF is max, a step S360 is performed.

It is determined whether the fail bits are equal to or less than reference bits. The pass/fail checking unit 180 may determine whether the output from the digital adding unit 170 is equal to or less than the value stored in the bypass register 183 (shown in FIG. 8). When the fail bits (e.g., the number of the fail bits) are not equal to or less than the reference bits (e.g., a number of the reference bits), the program is reexecuted in the step S310. When the fail bits are equal to or less than the reference bits, the program is executed once more and the program is ended in a step S365.

Figure 26:
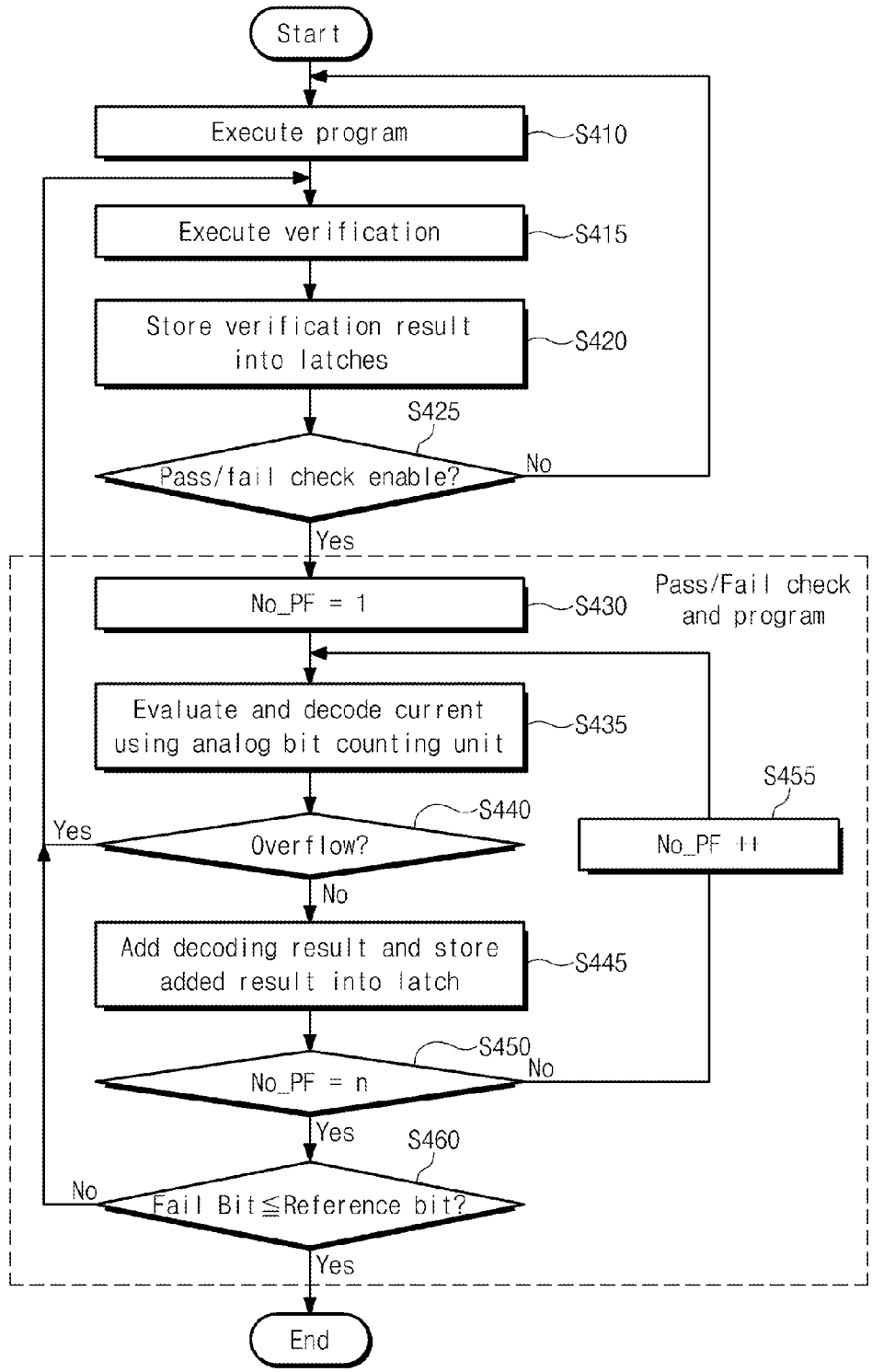
FIG. 26 is a flow chart illustrating a third embodiment of the programming method according to the inventive concepts.

FIG. 26 is a flow chart illustrating a third embodiment of the programming method according to the inventive concepts. Steps S410 through S435 and steps s445 through S455 may be performed similarly to the steps S310 through S335 and the steps S345 through S355 shown in FIG. 25.

In steps S430 through S460, the program may be executed during the pass/fail check is performed. Thus, when the overflow occurs in the step S440, the verification of the step S415 may be executed instead of the program of the step S410. Furthermore, when the fail bits (e.g., the number of the fail bits) are not equal to or less than the reference bits (e.g., the number of the reference bits) in the step S460, the verification of the step S415 may be executed instead of the program of the step S410. If the program is executed during the pass/fail check is performed, program time may reduce.

Figure 27:
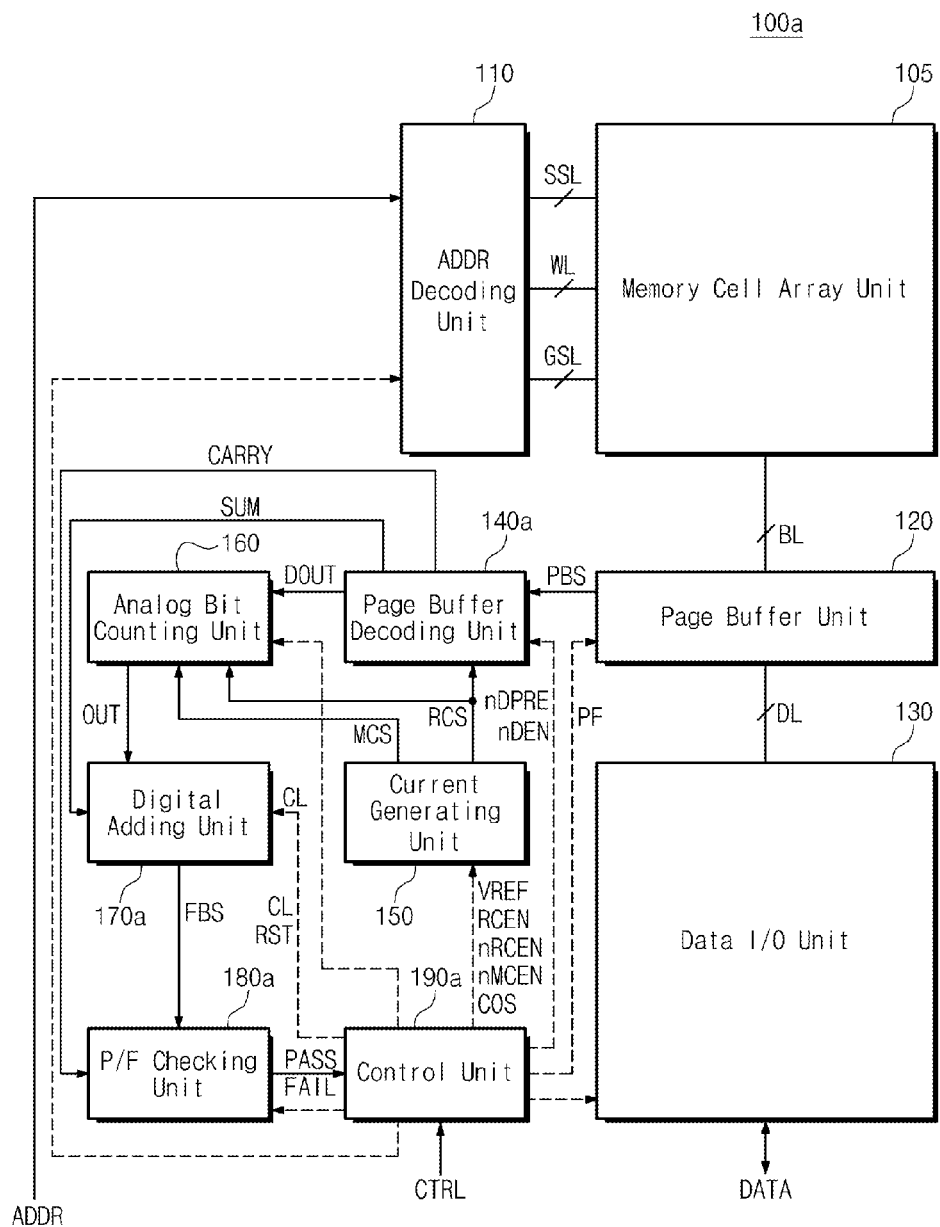
FIG. 27 is a block diagram illustrating a nonvolatile memory device according to another embodiment of the inventive concepts.

FIG. 27 is a block diagram illustrating a nonvolatile memory device 100a according to another embodiment of the inventive concepts. The nonvolatile memory device 100a may be configured similarly to the nonvolatile memory device 100 shown in FIG. 1, except for the page buffer decoding unit 140a, the digital adding unit 170a, the pass/fail checking unit 180a and the control unit 190a.

Like the page buffer decoding unit 140 shown in FIG. 1, the page buffer decoding unit 140a may output the decoder output signal DOUT in response to the page buffer signal PBS. The page buffer decoding unit 140a may further generate a sum signal SUM and a carry signal CARRY in response to the page buffer signal PBS. The sum signal SUM may be transferred to the digital adding unit 170a and the carry signal CARRY may be transferred to the pass/fail checking unit 180a.

The digital adding unit 170a may add up the counting result OUT from the analog bit counting unit 160 or the sum signal SUM under a control of the control unit 190a. The added up result may be output as the fail bit signal FBS.

The pass/fail checking unit 180a may determine the program pass or program fail based on the fail bit signal FBS or the carry signal CARRY under a control of the control unit 190a.

Figure 28:
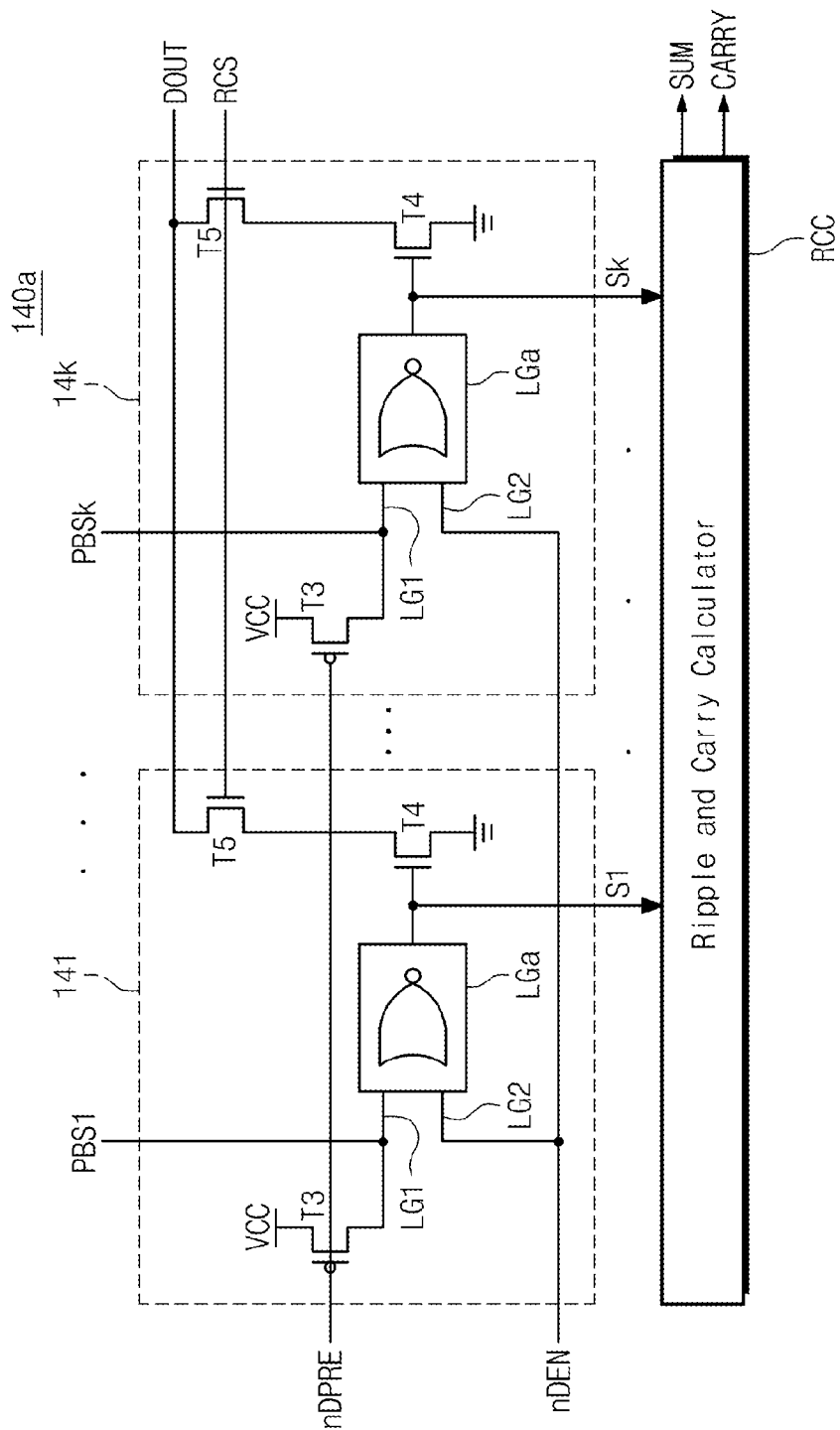
FIG. 28 illustrates an embodiment of the page buffer decoding unit shown in FIG. 27.

FIG. 28 illustrates an example of the page buffer decoding unit 140a shown in FIG. 27. When compared with the page buffer decoding unit 140 shown in FIG. 4, the page buffer decoding unit 140a may further include a ripple and carry calculator RCC.

The output signals of the logic gates LG may be transferred to the ripple and carry calculator RCC as first through kth signals S1 through Sk. The ripple and carry calculator may generate the sum signal SUM and the carry signal CARRY based on the first through kth signals S1 through Sk.

Figure 29:
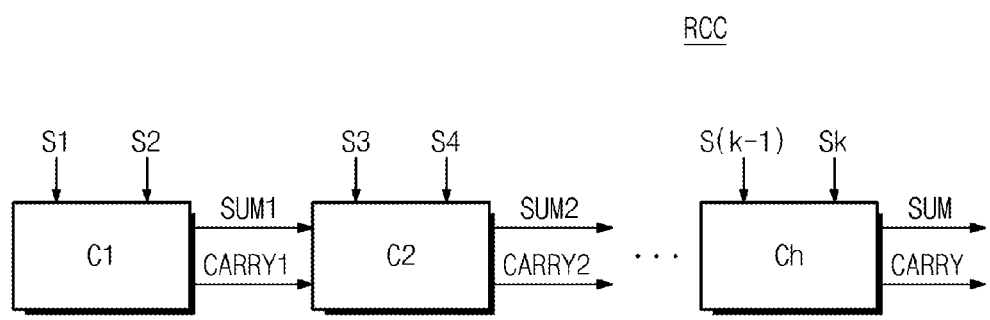
FIG. 29 is a block diagram illustrating an embodiment of the ripple and carry calculator shown in FIG. 28.

FIG. 29 is a block diagram illustrating an example of the ripple and carry calculator RCC shown in FIG. 28. Referring to FIGS. 27 through 29, signals output from directly adjacent logic gates LG of the page buffer decoding unit 140a are transferred to a calculator. For example, the first and second signals S1 and S2 are transferred to a first calculator C1, the third and fourth signals S3 and S4 are transferred to a second calculator C2, and the k−1th and kth signals Sk−1 and Sk are transferred to a hth calculator Ch.

The first calculator C1 may add the first and second signals S1 and S2, and output the added result as the first sum signal SUM. For example, the first calculator C1 may output a result of an exclusive logical sum XOR of the first and second signals S1 and S2 as the first sum signal SUM1. When the first and second signals S1 and S2 are logic high, the first calculator C1 may output logic high as a first carry signal CARRY1.

The second calculator C2 may calculate an XOR of the third and fourth signals S3 and S4. The second calculator C2 may output the XOR result as the second sum signal SUM2.

When the third and fourth signals S3 and S4 are logic high or when the XOR result and the first sum signal SUM1 are logic high, the second calculator C2 may output logic high as a second carry signal CARRY2. When the first carry signal CARRY1 is logic high, the second calculator C2 may output logic high as the second carry signal CARRY2.

The hth calculator Ch may operate similar to the second calculator C2 except that the hth calculator outputs the sum signal SUM and the carry signal CARRY instead of internal sum and carry signals referred as SUM# and CARRY#. The hth calculator Ch may output the sum signal SUM and the carry signal CARRY based on output signals from the page buffer decoding unit 140a and output signals of prior calculator (e.g., the internal sum and carry signals).

Figure 30:
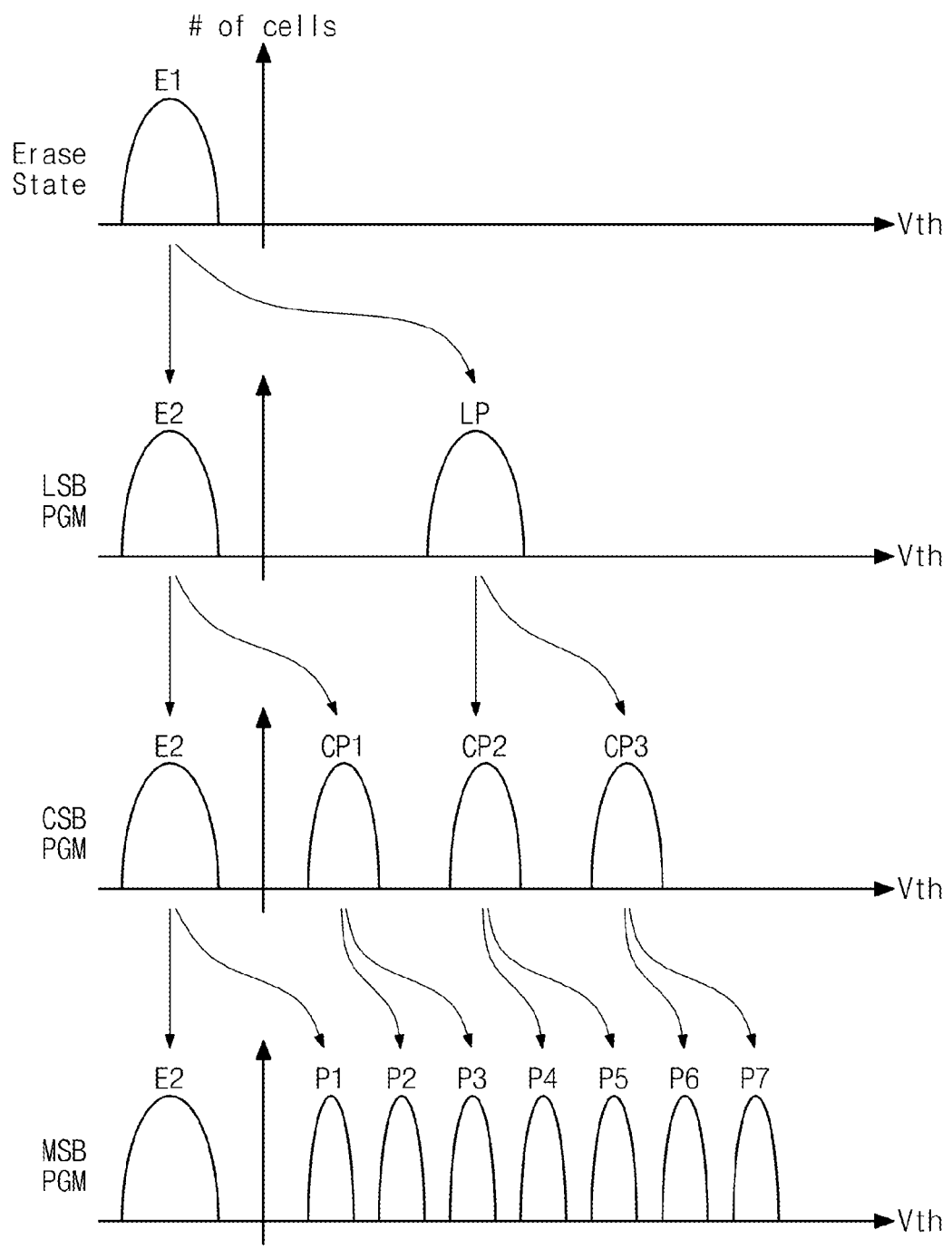
FIG. 30 is a diagram illustrating a first embodiment of logic states programmed to the memory cells according to inventive concepts.

FIG. 30 is a diagram illustrating a first embodiment of logic states programmed to the memory cells according to the inventive concepts. In FIG. 30, a horizontal axis indicates logic states of the memory cells, more particularly threshold voltages of the memory cells. The logic states of the memory cells may be distinguished based on the threshold voltages. A vertical axis indicates a number of memory cells. In other words, the curved figures denote exemplary threshold voltage distributions of memory cells a each logic state.

Memory cells of a first erase state E1 may be programmed to a second erase state E2 or a least significant program state LP by a least significant bit LSB program. Threshold voltages of the second erase state E2 may be higher than that of the first erase state E1. A distribution of the threshold voltages of the second erase state E2 may be narrower than that of the second erase state E2.

Memory cells of the second erase state E2 may be programmed to a third erase state E3 or a first central significant program state CP1 by a central significant bit CSB program. Threshold voltages of the third erase state E3 may be higher than that of the second erase state E2. A distribution of the threshold voltages of the third erase state E3 may be narrower than that of the second erase state E2.

Memory cells of the least significant program state LP may be programmed to a second central significant program state CP2 or a third central significant program state CP3 by the CSB program.

Memory cells of the third erase state E3 may be programmed to a fourth erase state E4 or a first program state P1 by a most significant bit MSB program. Threshold voltages of the fourth erase state E4 may be higher than that of the third erase state E3. A distribution of the threshold voltages of the fourth erase state E4 may be narrower than that of the third erase state E3.

Memory cells of the first central significant program state CP1 may be programmed to a second program state P2 or a third program state P3 by the MSB program. Memory cells of the second central significant program state CP2 may be programmed to a fourth program state P4 or a fifth program state P4 by the MSB program. Memory cells of the third central significant program state CP3 may be programmed to a sixth program state P6 or a seventh program state P7 by the MSB program.

Figure 31:
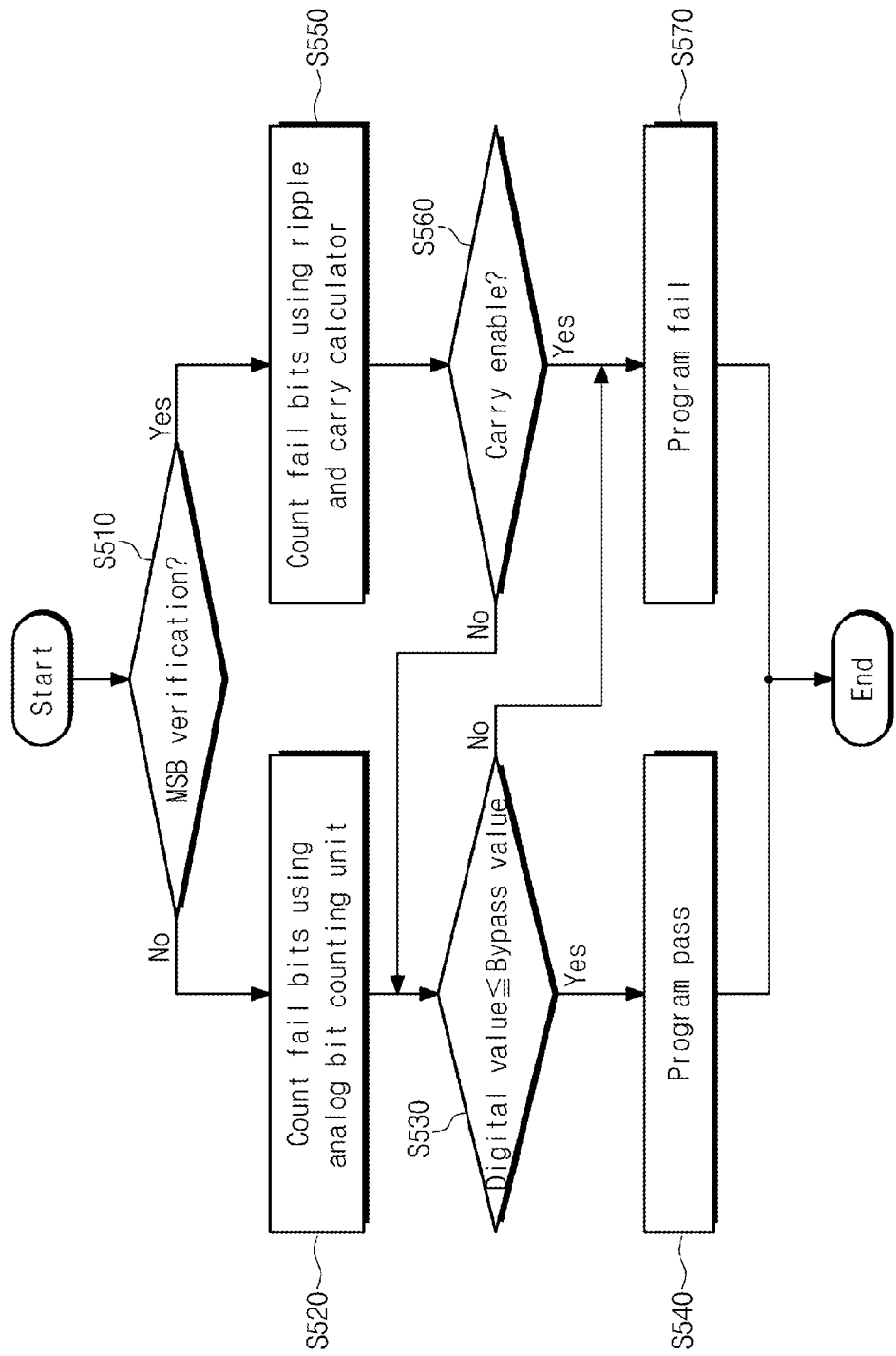
FIG. 31 is a flow chart illustrating a first embodiment of a verification method according to the inventive concepts.

FIG. 31 is a flow chart illustrating a first embodiment of a verification method according to the inventive concepts. Referring to FIGS. 27 and 31, it is determined whether a MSB verification, which is a verification corresponding to the MSB program, is executed. In a step S510. When the MSB verification is not executed, a step S520 is performed. When the MSB verification is to be executed, a step S550 is performed.

In the step S520, the fail bits are counted using the analog bit counting unit 160. For example, the fail bits may be counted by the same method described referring to FIGS. 1 through 26. The digital value, which is the counting result, and the bypass value are compared. When the digital value is equal to or less than the bypass value, the program pass is determined in a step S540. When the digital value is over the bypass value, the program fail is determined in a step S570.

In the step S550, the fail bits are counted using the ripple and carry calculator RCC (shown in FIGS. 28 and 29). It is determined whether the carry signal CARRY is activated. When the carry signal CARRY is activated, the program fail is determined in the step S570. That is, when two or more fail bits are detected in each stage of the page buffers PB1 through PBr, the program fail is determined and the verification may be ended. When the carry signal CARRY is not activated, the step S530 is executed. For example, the digital adding unit 170a may add up the sequentially transferred sum signals SUM from the page buffer decoding unit 140a. The digital value, which is the added up result, may be compared with the bypass value and the program pass or program fail may be determined according to the comparison result.

When a LSB verification or a CSB verification, which correspond to the MSB program and CSB program respectively, is executed, the program pass or program fail may be determined based on the comparison of the number of the fail bits and the bypass value. When the MSB verification is executed, the program pass or program fail may be determined based on the activation of the carry signal CARRY and the comparison of the number of the activation of the sum signal SUM and the bypass value.

For example, the counting using the analog bit counting unit 160 or the counting using the ripple and carry calculator RCC may be selected based on whether the MSB verification is executed. For example, when the memory cells are set to store i bits data, the counting using the analog bit counting unit 160 or the counting using the ripple and carry calculator RCC may be selected whether a verification over a j bit (j is an integer equal to or less than i) is executed.

An increment of a program voltage during the MSB program may be lower than an increment of the program voltage during the LSB or CSB programs. That is, a verification mode may be selected based on the increments of the program voltage. A verify voltage (e.g., the highest verify voltage) of the MSB verification may be higher than that of the LSB and CSB verifications. That is, the verification mode may be selected based on the level of the verify voltage. The program voltage (e.g., an initial program voltage) of the MSB program may be higher than that of the LSB and CSM programs. That is, the verification mode may be selected based on the level of the program voltage. The verification mode may be selected according to received addresses.

Figure 32:
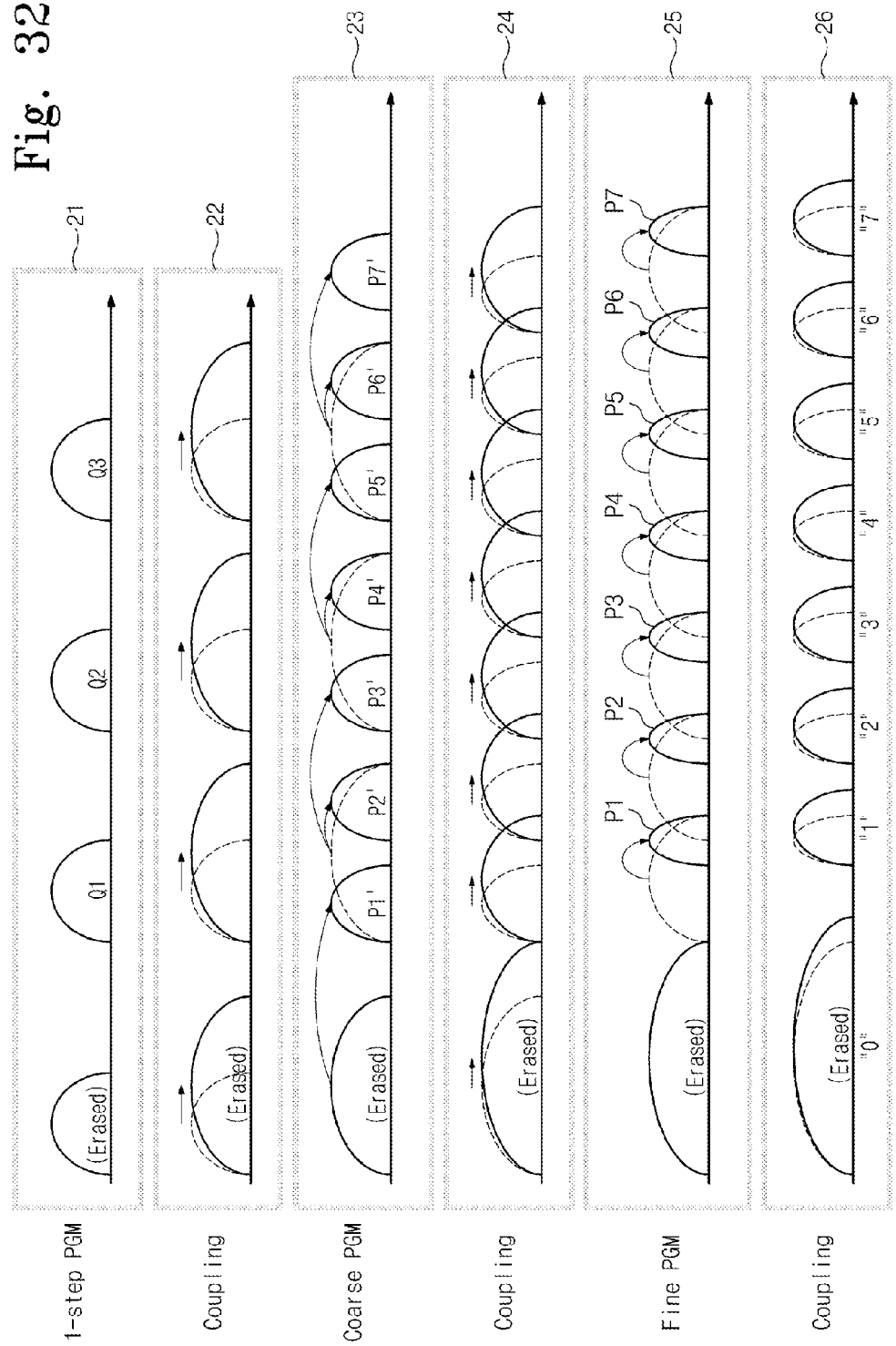
FIG. 32 is a diagram illustrating a second embodiment of logic states programmed to the memory cells according to inventive concepts.

FIG. 32 is a diagram illustrating a second embodiment of logic states programmed to the memory cells according to inventive concepts. Referring to FIG. 32, the memory cells may be programmed according to a 3-step program.

A 1-step program is executed on a first word line. 2 page data (e.g., first and second page data) may be programmed into memory cells of the first word line. As shown in box 21, memory cells may be programmed to have threshold voltages included in threshold voltage distributions corresponding to erase state E and program states Q1, Q2 and Q3.

After the 1-step program of the first word line, the 1-step program may be performed on a second word line adjacent to the first word line. When the 1-step program is executed on the second word line, threshold voltage distributions of the 1-step programmed memory cells of the first word line may be broadened due to a coupling of the 1-step program on the second word line as shown in a box 22.

After the 1-step program on the second word line, a 2-step program (or coarse program) may be executed on the first word line. 1 page data, that is, third page data may be programmed into memory cells of the first word line. As shown in box 23, memory cells included in the threshold voltage distributions corresponding each state may be programmed to have threshold voltages included in corresponding threshold voltage distributions.

For example, memory cells included in the threshold voltage distribution corresponding to the erase state E may be programmed to have threshold voltages included in threshold voltage distributions corresponding to the erase state E or a program state P1' respectively according to data to be programmed. Memory cells included in the threshold voltage distribution corresponding to the program state Q1 may be programmed to have threshold voltages included in threshold voltage distributions corresponding to the program states P2' and P3' respectively according to data to be programmed. Memory cells included in the threshold voltage distribution corresponding to the program state Q2 may be programmed to have threshold voltages included in threshold voltage distributions corresponding to the program states P4' and P5' respectively according to data to be programmed. Memory cells included in the threshold voltage distribution corresponding to the program state Q3 may be programmed to have threshold voltages included in threshold voltage distributions corresponding to the program states P6' and P7' respectively according to data to be programmed.

After the 2-step program (or the coarse program) on the first word line, the 2-step program (or the coarse program) may be performed on the second word line. When the 2-step program (or the coarse program) is executed on the second word line, threshold voltage distributions of the 2-step programmed memory cells of the first word line may be broadened due to a coupling of the 2-step program on the second word line as shown in a box 24.

After the 2-step program on the second word line, a 3-step program (or a fine program) may be executed on the first word line. The memory cells of the first word line may be programmed to have final threshold voltage distributions P1 through P7 as shown in a box 25.

The fine program may need pre-programmed data (e.g., the first through third page data). For example, the pre-programmed data may be programmed into a specific area of the memory cell array 105 to be maintained. The specific area may be configured to have single level cells SLC. The specific area may be a buffer area configured to have the SLC. The specific area may be an On Chip Buffer area.

As shown in a box 26, the threshold voltage distributions of the fine programmed memory cells may be broadened due to a coupling of the 3-step program (or the fine program) on the memory cells of the second word line.

Figure 33:
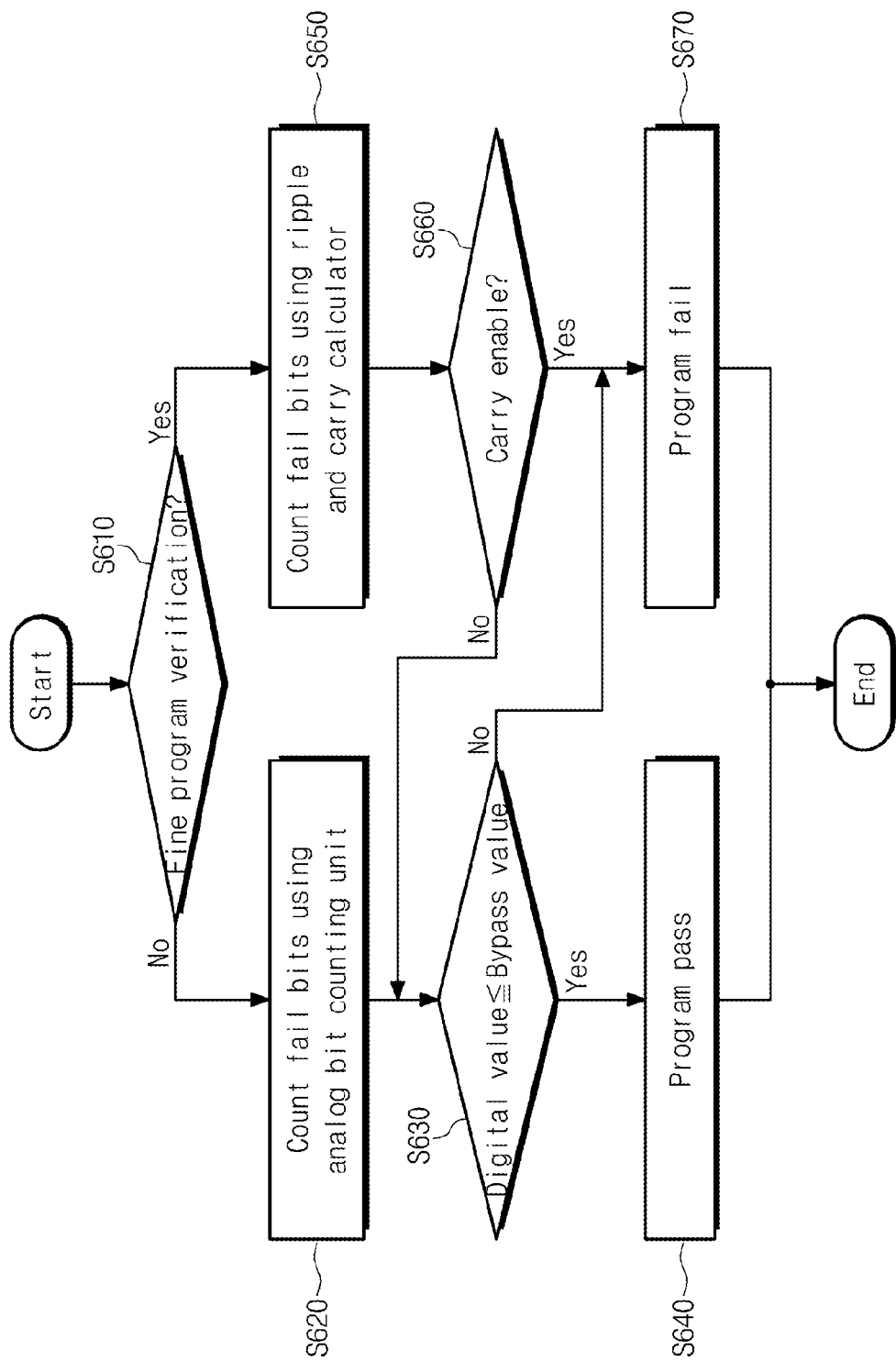
FIG. 33 is a flow chart illustrating a second embodiment of the verification method according to the inventive concepts.

FIG. 33 is a flow chart illustrating a second embodiment of the verification method according to the inventive concepts. Referring to FIGS. 27 and 33, it is determined whether a verification of the fine program is executed in a step S610. When the verification the fine program is not executed, a step S620 is performed. When the verification of the fine program is executed, a step S650 is performed. Steps S620 through S670 may be performed in the same manner with the steps S520 thorough S570 shown in FIG. 31. That is, when a verification of the 1-step program or the 2-step program (or the coarse program) is executed, the counting is performed using the analog bit counting unit 160. When the verification of the 3-step program (or the fine program) is executed, the counting is performed using the ripple and carry calculator RCC (shown in FIGS. 28 and 29).

An increment of a program voltage during the fine program may be lower than an increment of the program voltage during the 1-step or coarse programs. That is, the verification mode may be selected based on the increments of the program voltage. A verify voltage (e.g., the highest verify voltage) of the verification of the fine program may be higher than that of the 1-step or coarse program. That is, the verification mode may be selected based on the level of the verify voltage. The program voltage (e.g., an initial program voltage) of the fine program may be higher than that of the 1-step or coarse program. That is, the verification mode may be selected based on the level of the program voltage. The verification mode may be selected according to received addresses.

Figure 34:
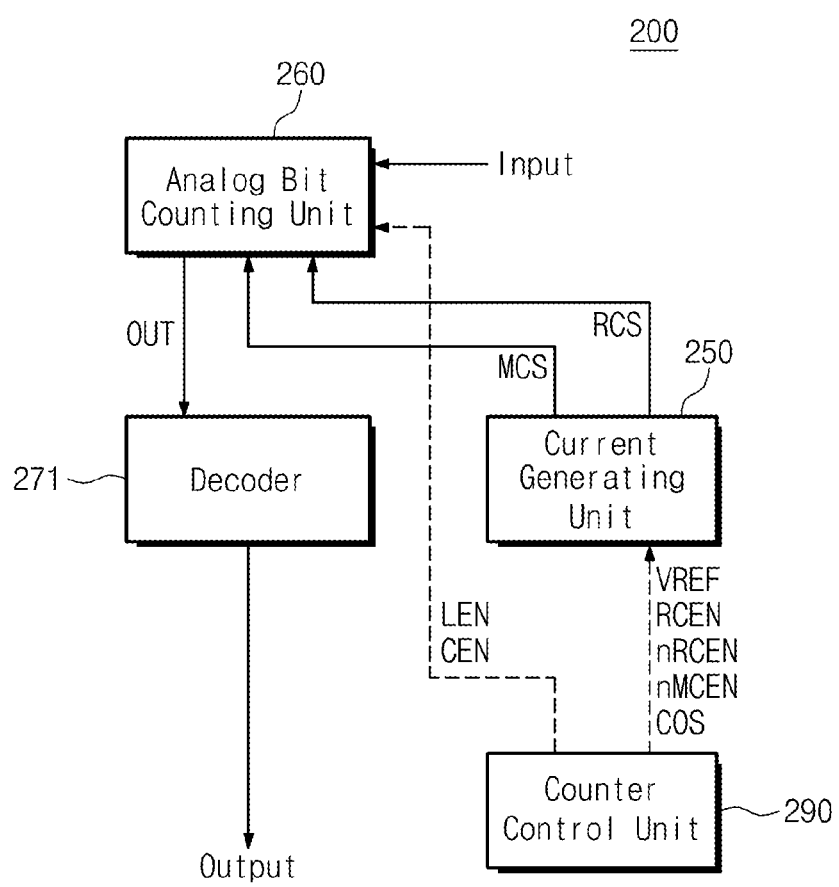
FIG. 34 is a block diagram illustrating a first embodiment of a counter according to the inventive concepts.

FIG. 34 is a block diagram illustrating a first embodiment of a counter 200 according to the inventive concepts. Referring to FIG. 34, the counter 200 includes a current generating unit 250, an analog bit counting unit 260, a decoder 271 and a counter control unit 290.

The current generating unit 250 may receive a reference voltage VREF, a reference current enable signal RCEN, an inverted reference current enable signal nRCEN, a maximum current enable signal nMCEN and a current option signal COS from the counter control unit 290. The current generating unit 250 may output a reference current signal RCS and a maximum current signal MCS. The current generating unit 250 may have the same structure and operate in the same manner as the current generating unit 150*a* shown in FIG. 21.

The analog bit counting unit 260 may receive input signal from an external device, receive the reference current signal RCS and maximum current signal MCS from the current generating unit 250 and receive a load enable signal LEN and a count enable signal CEN from the counter control unit 290. The analog bit counting unit 260 may count the input signal in a unit of a reference current RC corresponding to the reference current signal RCS, and output an output signal OUT indicating the counting result. The analog bit counting unit 260 may have the same structure and operate in the same manner as the analog bit counting unit 160, 160*a* or 160*b* shown in FIGS. 22 through 24.

The decoder 271 may receive the output signal OUT from the analog bit counting unit 260 and decoder the output signal OUT into a digital value. The decoder 271 may have the same structure and operate in the same manner as the decoder 171 shown in FIG. 7. An output of the decoder 271 may be output to an external device.

The counter control unit 290 may control various operations of the counter 200. The counter control unit 290 may control the reference voltage VREF, reference current enable signal RCEN, inverted reference current enable signal nRCEN, maximum current enable signal nMCEN, current option signal COS, load enable signal LEN and count enable signal CEN as described referring to FIGS. 1 through 24.

Figure 35:
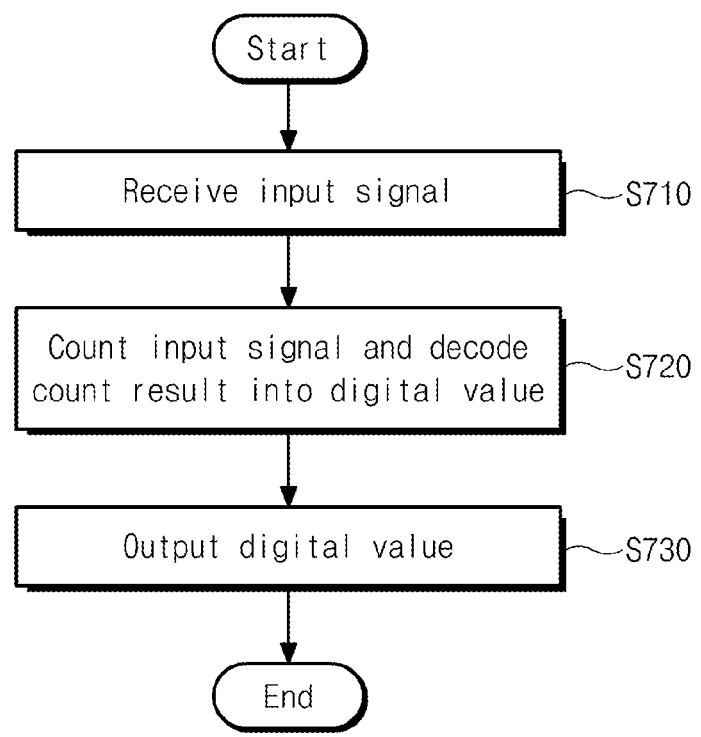
FIG. 35 is a flow chart illustrating an embodiment of an operating method of the counter shown in FIG. 34.

FIG. 35 is a flow chart illustrating an example of an operating method of the counter 200 shown in FIG. 34. Referring to FIGS. 34 and 35, the input signal is received in a step S710. The input signal may be a current.

In a step S720, the input signal is counted, and the counting result is decoded into the digital value. The analog bit counting unit 260 may count the input signal in an unit of the reference current RC. The decoder 271 may decode the output signal OUT of the analog bit counting unit 260 into the digital value.

In a step S730, the digital value is output.

Figure 36:
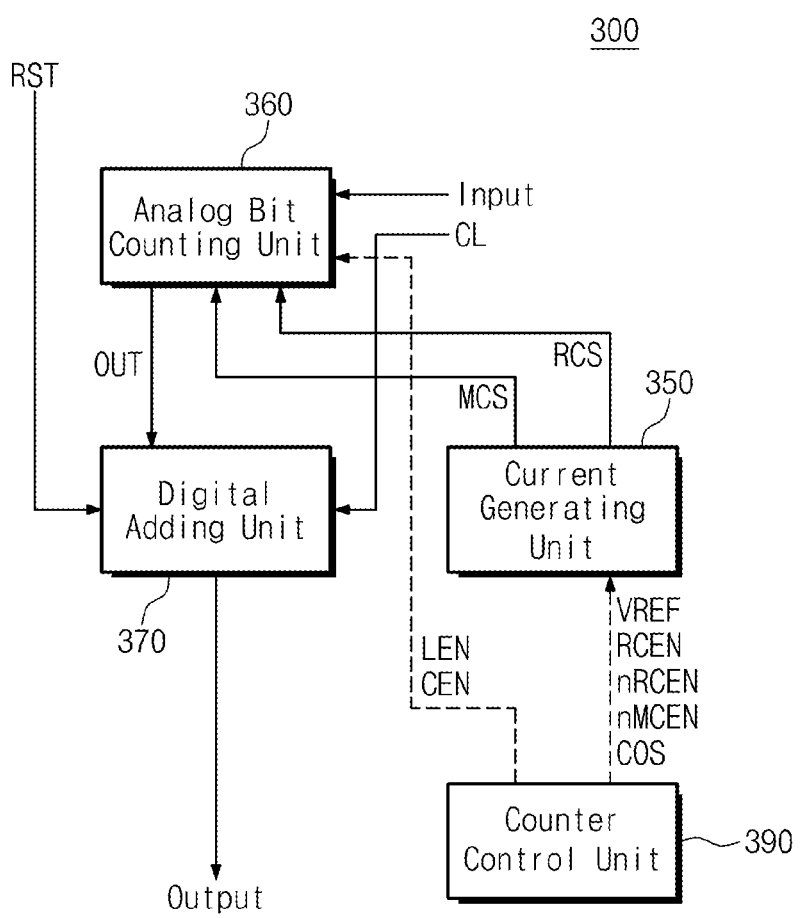
FIG. 36 is a block diagram illustrating a second embodiment of a counter according to the inventive concepts.

FIG. 36 is a block diagram illustrating a second embodiment of a counter 300 according to the inventive concepts. Referring to FIG. 36, the counter 300 may include a current generating unit 350, an analog bit counting unit 360, a digital adding unit 370 and a counter control unit 390.

When compared with the counter 200 shown in FIG. 34, the digital adding unit 370 is provided instead of the decoder 271. The digital adding unit 370 may decode the output signal OUT of the analog bit counting unit 360 into the digital value, and add up the digital value with a value stored in an internal latch (not shown). The digital adding unit 370 may store the added up value into the internal latch (not shown) in response to a latch signal CL. The value stored in the internal latch (not shown) may be output to an external device. The digital adding unit 370 may have the same structure and operate in the same manner as the digital adding unit 170 shown in FIG. 7.

The counter 300 may be an accumulation counter calculating an accumulated sum. When the latch signal CL is activated, the accumulated sum is calculated and output. The latch signal CL may be output from an external device. The accumulated sum may be reset in response to a reset signal RST received from an external device.

Figure 37:
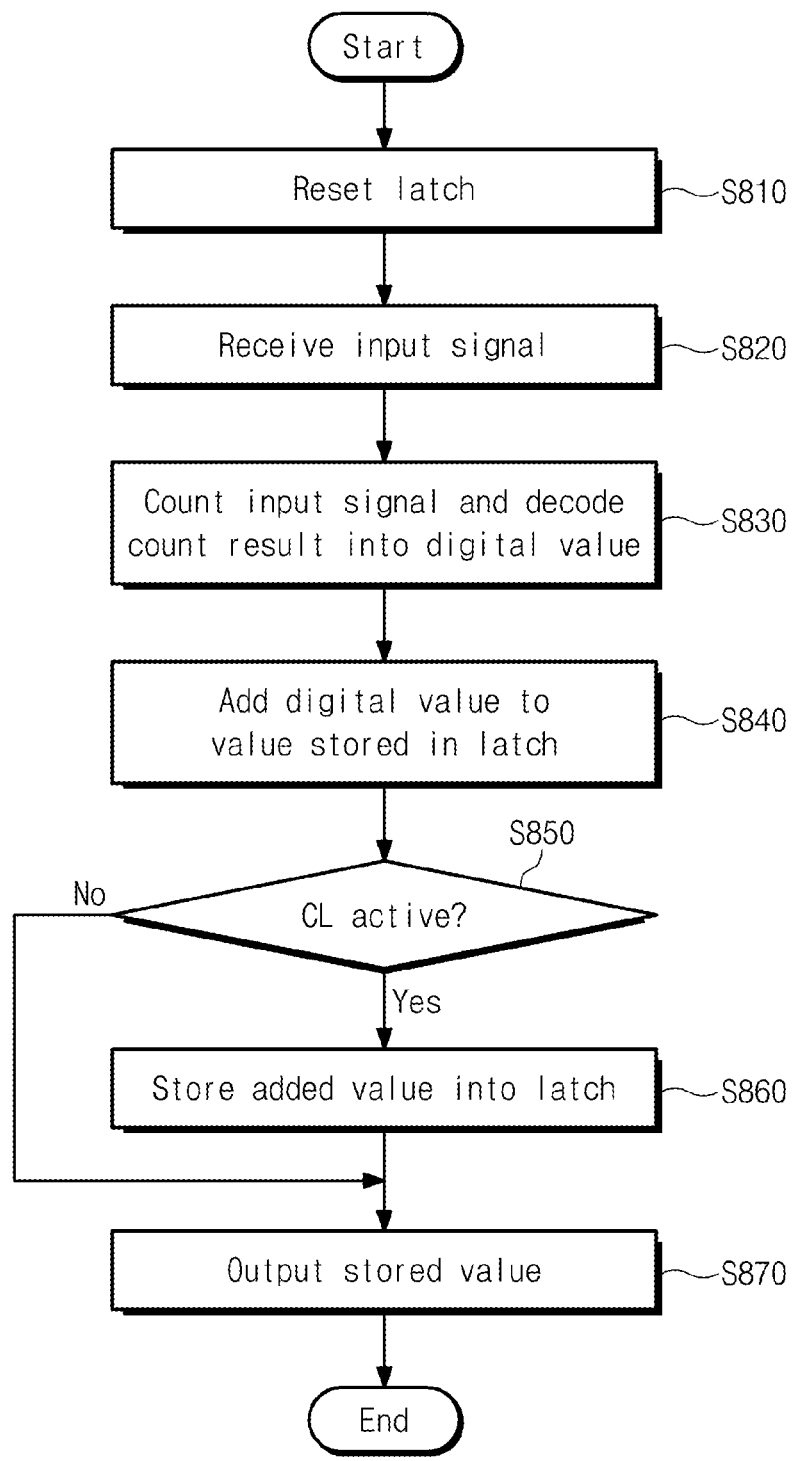
FIG. 37 is a flow chart illustrating an embodiment of an operating method of the counter shown in FIG. 36.

FIG. 37 is a flow chart illustrating an example of an operating method of the counter 300 shown in FIG. 36. Referring to FIGS. 36 and 37, the internal latch storing the accumulated sum is reset. For example, the internal latch of the digital adding unit 370 (the latch 175 shown in FIG. 7) may be reset.

In a step S820, the input signal is received. In a step S830, the input signal is counter, and the counting result is decoded into the digital value. The analog bit counting unit 360 may count the input signal in a unit of the reference current RC. The digital adding unit may decode the output signal OUT of the analog bit counting unit 360 into the digital value.

In a step S840, the digital value is added with the value stored in the latch. For example, the digital adding unit 370 may add up the digital value with the value stored in the internal latch.

In a step S850, it is determined whether the latch signal CL is activated. When the latch signal CL is activated, the added up value is stored in the internal latch in a step S860. Then, the value stored in the internal latch may be output in a step S870.

Figure 38:
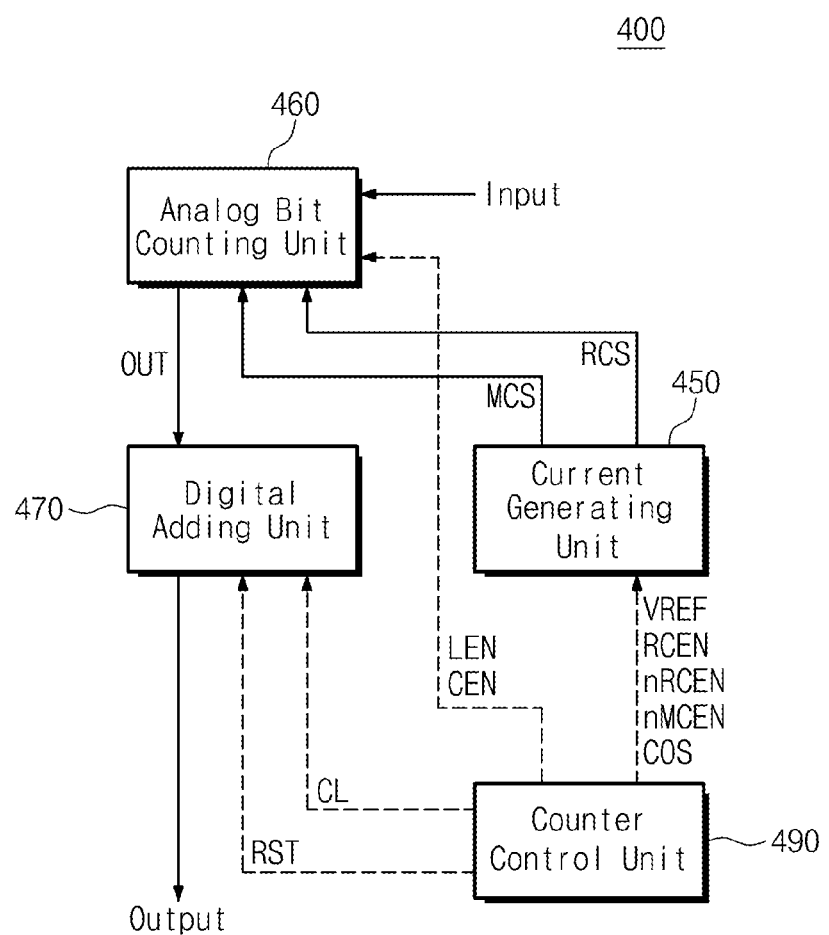
FIG. 38 is a block diagram illustrating a third embodiment of the counter according to the inventive concepts.

FIG. 38 is a block diagram illustrating a third embodiment of the counter 400 according to the inventive concepts. When compared with the counter 300 shown in FIG. 36, the latch signal CL and the reset signal RST may be provided to the analog bit counting unit 460 from the counter control unit 490.

Figure 39:
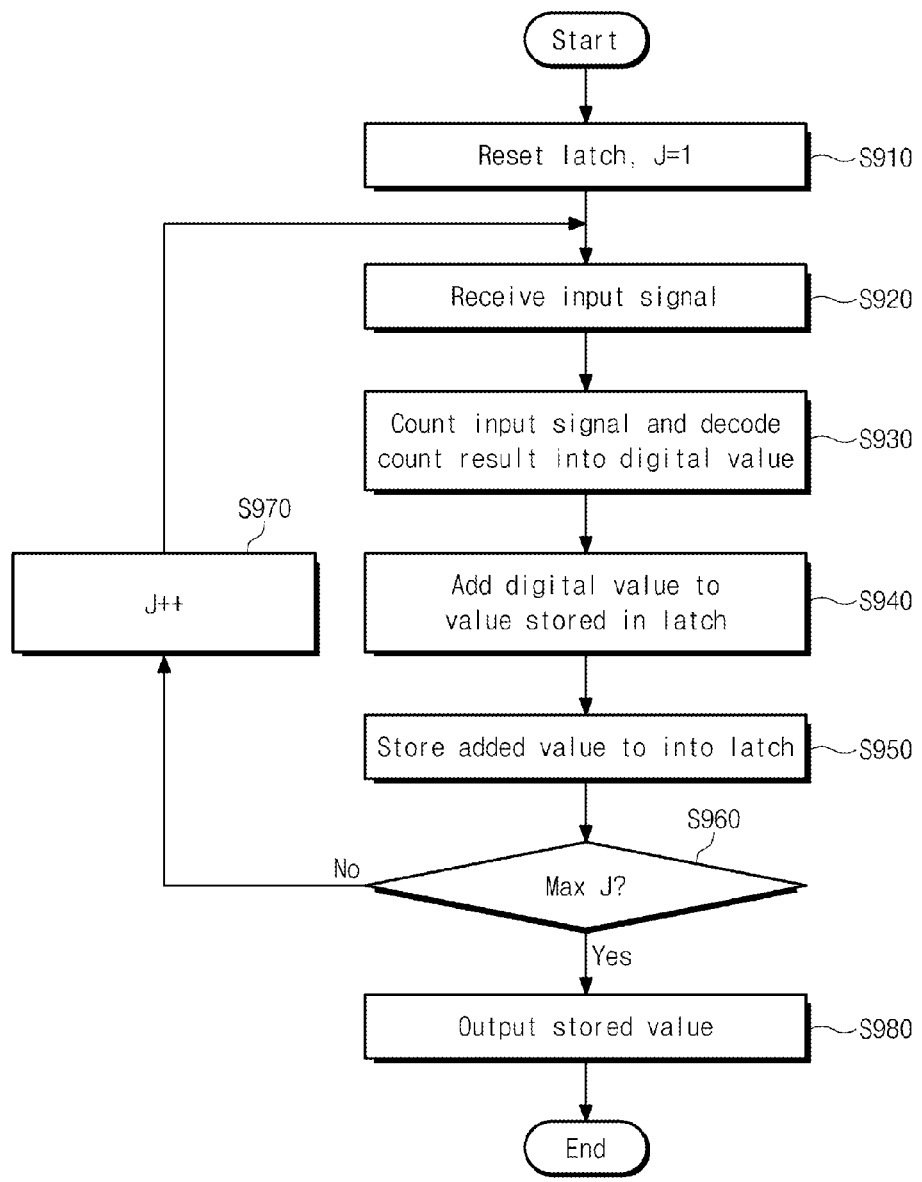
FIG. 39 is a flow chart illustrating an embodiment of an operating method of the counter 400 shown in FIG. 38.

FIG. 39 is a flow chart illustrating an example of an operating method of the counter 400 shown in FIG. 38. Referring to FIGS. 38 and 39, the internal latch is reset and a variable J is initialized into '1' in a step S910. For example, the internal latch of the digital adding unit (e.g., the latch 175 shown in FIG. 7) may be reset in response to the reset signal RST.

In a step S920, the input signal is received. In a step S930, the input signal is counted and the counting result is decoded into the digital value. The analog bit counting unit 460 may count the input signal in an unit of the reference current RC. The digital adding unit 470 may decode the output signal OUT of the analog bit counting unit 460 into the digital value.

In a step S940, the digital value is added with the value stored in the internal latch. For example, the digital adding unit 470 may add the digital value with the value stored in the internal latch (e.g., the latch 175 shown in FIG. 7).

In a step S950, the added value is stored in the internal latch. For example, the digital adding unit 470 may store the added value into the internal latch (e.g., the latch 175 shown in FIG. 7) in response to the latch signal CL.

In a step S960, it is determined whether the variable J is max. For example, a maximum value of the variable J may be a preset value in the counter control unit 490. The maximum value of the variable J may be stored in a program circuit like the mode register set MRS. When the variable J is not max, the variable J increases in a step S970 and the step S920 is reexecuted. When the variable J is max, the counter 400 may output the value stored in the internal latch (e.g., the latch 175 shown in FIG. 7) as a final output value in a step S980.

That is, the counter 400 may calculate an accumulated sum of the input signal for specific iterations.

Figure 40:
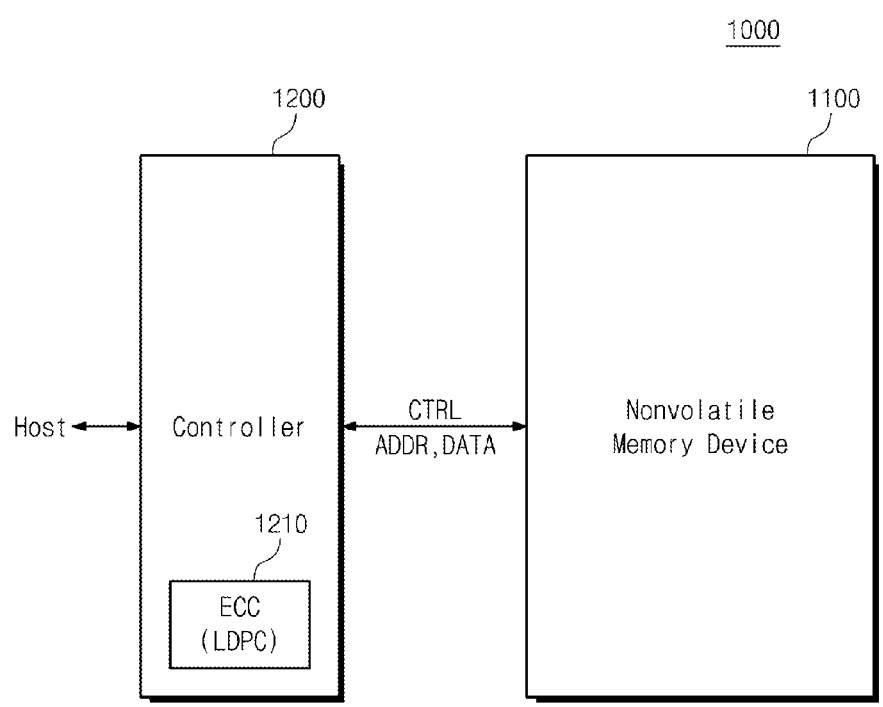
FIG. 40 is a block diagram illustrating memory systems according to example embodiments of the inventive concepts.

FIG. 40 is a block diagram illustrating memory systems according to example embodiments of the inventive concepts. Referring to FIG. 40, a memory system 1000 may include a nonvolatile memory device 1100 and a controller 1200. The nonvolatile memory device 1100 may have the same structure and operate in the same manner as the nonvolatile memory according to the inventive concepts. That is, the nonvolatile memory device 1100 may generate a current corresponding to fail bits and count the generated current to count a number of the fail bits.

The controller 1200 may be coupled with a host Host and the nonvolatile memory device 1100. The controller 1200 may be configured to access the nonvolatile memory device 1100 in response to a request from the host Host. The controller 1200 may be configured to control read, program, erase, and background operations of the nonvolatile memory portion 1100, for example. The controller 1200 may be configured to provide an interface between the nonvolatile memory portion 1100 and the host. The controller 1200 may be configured to drive firmware for controlling the nonvolatile memory portion 1100.

The controller 1200 may be configured to provide a control signals CTRL and an address ADDR to the nonvolatile memory portion 1100. The nonvolatile memory portion 1100 may perform read, program, and erase operations according to the control signal CTRL and the address ADDR provided from the controller 1200. The controller 1200 may further include a RAM, a processing unit, a host interface and a memory interface. The RAM may be used as at least one of a working memory of the processing unit, a cache memory between the nonvolatile memory portion 1100 and the host Host and/or a buffer memory between the nonvolatile memory portion 1100 and the host Host. The processing unit may control an overall operation of the controller 1200.

The host interface may include the protocol for executing data exchange between the host Host and the controller 1200. For example, the host interface may communicate with an external device (e.g., the host Host) via at least one of various protocols (e.g., a USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, and/or an IDE (Integrated Drive Electronics) protocol). The memory interface may interface with the nonvolatile memory device 1100. The memory interface may include a NAND interface or a NOR interface.

The memory system 1000 may further include an ECC block. The ECC block may be configured to detect and correct an error of data read from the nonvolatile memory device 1100 using ECC. The ECC block may be provided as an element of the controller 1200 and/or as an element of the nonvolatile memory device 1100. The controller 1200 and the nonvolatile memory device 1100 may be integrated into a single semiconductor device. The controller 1200 and the nonvolatile memory device 1100 may be integrated into a single semiconductor device to be, for example, a memory card. For example, the controller 1200 and the nonvolatile memory device 1100 may be integrated into a single semiconductor device to be, for example, a PC (PCMCIA) card, a CF card, an SM (or, SMC) card, a memory stick, a multimedia card (MMC, RS-MMC, MMCmicro), a security card (SD, miniSD, microSD, SDHC), a universal flash storage (UFS) device, and/or the like.

The controller 1200 and the nonvolatile memory device 1100 may be integrated into a single semiconductor device to form a solid state drive (SSD). The SSD may include a storage device configured to store data in a semiconductor memory. If the memory system 1000 is used as the SSD, it may be possible to remarkably improve an operating speed of a host Host coupled with the memory system 1000.

According to some example embodiments, the memory system 1000 may be used as, for example, a computer, portable computer, Ultra Mobile PC (UMPC), workstation, netbook, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, and/or one of various electronic devices constituting a computing system.

A nonvolatile memory device 1100 or a memory system 1000 may be packed by various types of packages, for example, PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and/or the like.

Figure 41:
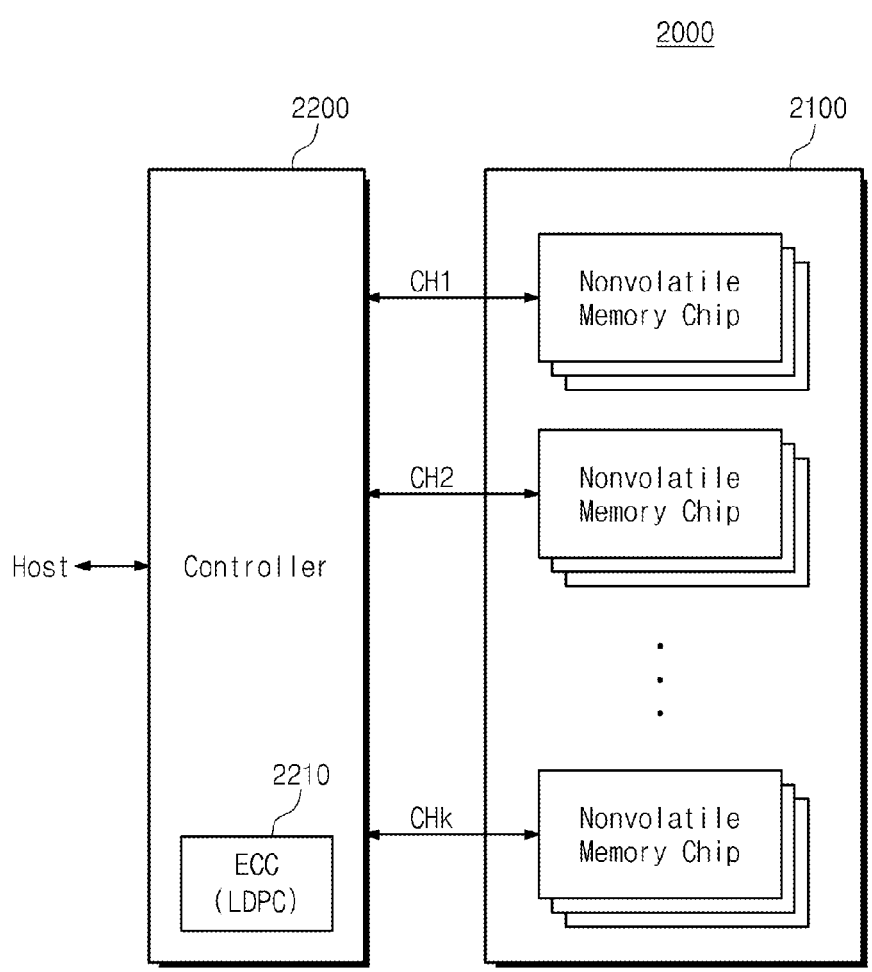
FIG. 41 is a block diagram illustrating applications of memory systems shown in FIG. 40.

FIG. 41 is a block diagram illustrating applications of memory systems in FIG. 40. Referring to FIG. 41, a memory system 2000 may include a nonvolatile memory device 2100 and a controller 2200. The nonvolatile memory device 2100 may include a plurality of nonvolatile memory chips, which may be classified into a plurality of groups. Nonvolatile memory chips in each group may communicate with the controller 2200 via a common channel. In FIG. 41, an example may be illustrated in which a plurality of memory chips communicate with the controller 2200 via K channels CH1 to CHk.

Each of the nonvolatile memory chips may have the same structure and operate in the same manner as the nonvolatile memory device according to the inventive concepts. That is, the nonvolatile memory device 1100 may generate a current corresponding to fail bits and count the generated current to count a number of the fail bits.

As illustrated in FIG. 41, one channel may be connected with a plurality of nonvolatile memory chips. However, the memory system 2000 may be modified such that one channel is connected with one nonvolatile memory chip.

Figure 42:
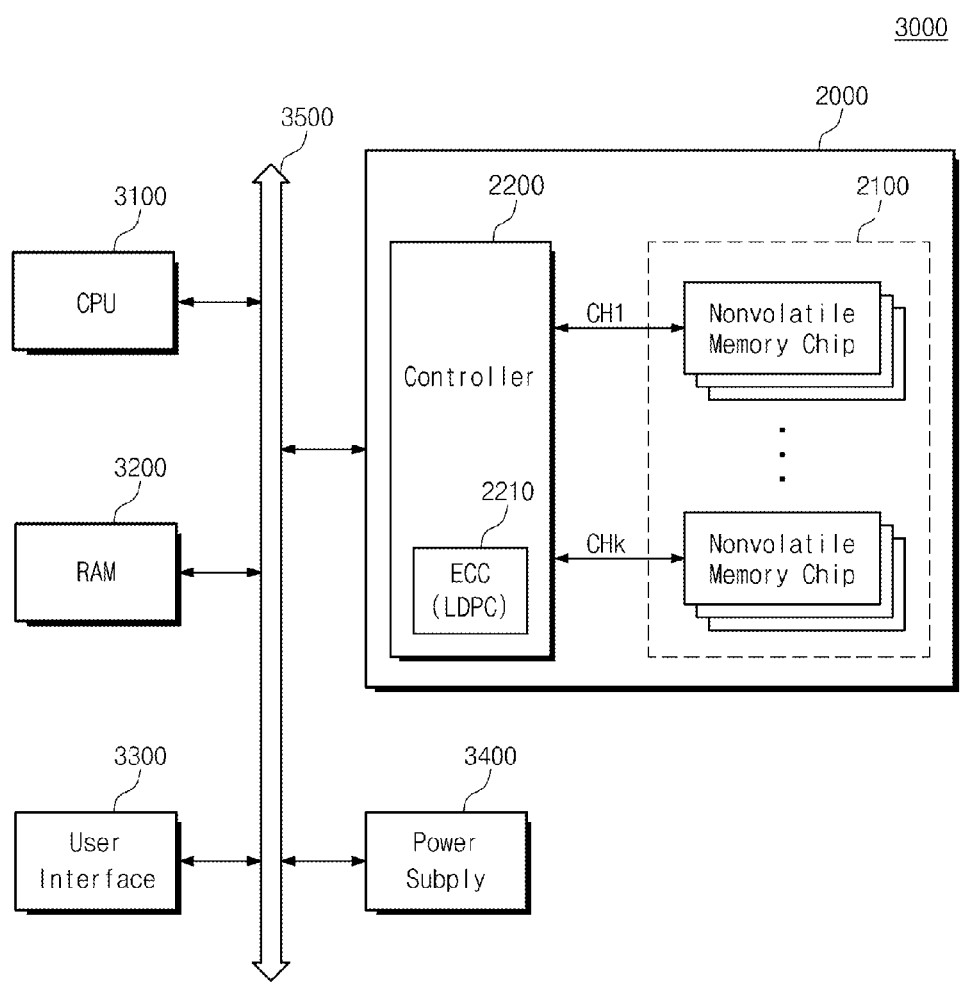
FIG. 42 is a block diagram illustrating computing systems including memory systems illustrated in FIG. 41.

FIG. 42 is a block diagram illustrating computing systems including memory systems illustrated in FIG. 41. Referring to FIG. 42, a computing system 3000 may include a CPU 3100, a RAM 3200, a user interface 3300, a power supply 3400 and a memory system 2000.

The memory system 2000 may be electrically connected with the CPU 3100, the RAM 3200, the user interface 3300 and the power supply 3400. Data provided via the user interface 3300 and/or processed by the CPU 3100 may be stored in the memory system 2000.

As illustrated in FIG. 42, a nonvolatile memory device 2100 may be connected with a system bus 3500 via a controller 2200. The nonvolatile memory device 2100 may be connected directly with the system bus 3500. The memory system 2000 in FIG. 65 may be a memory system described in FIG. 41. However, the memory system 2000 may be replaced with a memory system 1000 in FIG. 40. The computing system 3000 may be configured to include all memory systems 1000 and 2000 described in FIGS. 40 and 41.

As understood from the above description, as a cross-sectional area of a pillar varies, a voltage applying time and/or a voltage level of program and erase voltages may vary. Because a threshold voltage distribution of memory cells becomes narrow, the reliability may be improved.

While example embodiments have been particularly shown and described, it will be understood by one of ordinary skill in the art that variations in form and detail may be made therein without departing from the spirit and scope of the claims.

What is claimed is:

1. A method of programming a nonvolatile memory device including a plurality of memory cells connected with a plurality of word lines and a plurality of bit lines, the method comprising:
  performing a first program loop according to program data loaded in page buffers;
  wherein the first program loop includes:
    applying a first program voltage to a selected word line among the plurality of word lines;
    applying a first verify voltage to the selected word line; and
    storing a first verify result related with first memory cells targeted to a first program state which are verified using the first verify voltage during the first program loop;
  performing a second program loop according to the program data loaded in the page buffers,
  wherein the second program loop includes:
    applying a second program voltage to the selected word line,
  wherein a program pass or a program fail of the first program state is checked based on the first verify result during applying the second program voltage,
  wherein when the first program state is program failed, the second program loop further includes:
    applying the first verify voltage to the selected word line; and
    storing a second verify result related with the first memory cells targeted to the first program state which are verified using the first verify voltage during the second program loop,
  wherein when the first program state is program passed, the first verify voltage is not applied to the selected word line at the second program loop.

2. The method of claim 1, wherein the second program loop further includes:
  applying a second verify voltage to the selected word line; and
  storing a third verify result related with second memory cells targeted to a second program state which is verified using the second verify voltage, wherein the method further comprises:
  performing a third program loop according to the program data loaded in the page buffers after the second program loop,
  wherein the third program loop includes:
    applying a third program voltage to the selected word line;
  wherein when the first memory cells are program passed at the second program loop, a program pass or a program fail of the second memory cells is checked based on the third verify result of the second program loop during applying the third program voltage,
  wherein when the first memory cells are program failed at the second program loop, the program pass or the program fail of the first memory cells is checked based on the second verify result of the second program loop during applying the third program voltage.

3. The method of claim 2, wherein the first memory cells are program-inhibited during the third program loop when the first memory cells are program passed at the second program loop.

4. The method of claim 2, wherein when the first memory cells are program failed at the second program loop, the third program loop further includes:
  applying the first verify voltage to the selected word line; and
  storing a fourth verify result related with the first memory cells targeted to the first program state which are verified using the first verify voltage during the third program loop.

5. The method of claim 2, wherein the third program loop further includes:
  applying a third verify voltage to the selected word line; and
  storing a fourth verify result related with third memory cells targeted to a third program state which are verified using the third verify voltage,
  wherein the method further comprises:
    performing a fourth program loop according to the program data loaded in the page buffers after the third program loop,
  wherein the fourth program loop includes:
    applying a fourth program voltage to a selected word line;
  wherein when the second memory cells are program passed at the third program loop, the fourth program loop further includes checking a program pass or a program fail of the third memory cells based on the fourth verify result of the fourth program loop.

6. The method of claim 5, wherein the program pass or the program fail of the third memory cells is checked by comparing a number of fail bits of the third memory cells with a bypass value, the number of the fail bits indicating a number of memory cells having threshold voltages lower than the third verify voltage among the third memory cells.

7. The method of claim 6, wherein the third memory cells are program passed when the number of the fail bits is less than the bypass value.

8. The method of claim 2, wherein the program pass or the program fail of the first program state is checked by comparing a number of first fail bits of the first memory cells with a first bypass value, the number of the first fail bits indicating a number of memory cells having threshold voltages lower than the first verify voltage among the first memory cells.

9. The method of claim 8, wherein the first program state are program passed when the number of the first fail bits is less than the first bypass value.

10. The method of claim 8, wherein the program pass or the program fail of the second program state is checked by comparing a number of second fail bits of the second memory cells with a second bypass value, the number of the second fail bits indicating a number of memory cells having threshold voltages lower than the second verify voltages among the second memory cells.

11. The method of claim 10, wherein the second program state is program passed when the number of the second fail bits is less than the second bypass value.

12. The method of claim 10, wherein the first bypass value is different from the second bypass value.

13. The method of claim 10, wherein the first bypass value is identical with the second bypass value.

14. The method of claim 10, further comprising:
  adjusting the first bypass value; and
  adjusting the second bypass value.

15. The method of claim 8, further comprising:
  adjusting the first bypass value.

16. The method of claim 1, wherein the program pass or the program fail of the second program state is not checked during the second program loop.

17. The method of claim 1, wherein the first memory cells are program-inhibited by setting data related with the first memory cells among the program data to indicate erase states.

18. A method of programming a nonvolatile memory device including a plurality of memory cells connected with a plurality of word lines and a plurality of bit lines, the method comprising:
  performing a coarse program on selected memory cells connected to a selected word line among the plurality of word lines according to multi-page program data loaded in page buffers; and then
  performing a fine program on the selected memory cells according to the multi-page program data loaded in the page buffers,
  wherein the fine program includes:
    performing a first program loop according to the multi-page program data;
  wherein the first program loop includes:
    applying a first program voltage to the selected word line;
    applying a first verify voltage to the selected word line; and
    storing a first verify result related with first memory cells targeted to a first program state which are verified using the first verify voltage during the first program loop;
  performing a second program loop according to the multi-page program data,
  wherein the second program loop includes:
    applying a second program voltage to the selected word line,
    wherein a program pass or a program fail of the first memory cells is checked based on the first verify result during applying the second program voltage,
    wherein when the first memory cells are program failed, the second program loop further includes:
      applying the first verify voltage to the selected word line; and
      storing a second verify result related with the first memory cells targeted to the first program state which are verified using the first verify voltage during the second program loop,
    wherein when the first memory cells are program passed, the first verify voltage is not applied to the selected word line at the second program loop.

19. A method of programming a nonvolatile memory device including a plurality of memory cells connected with a plurality of word lines and a plurality of bit lines, the method comprising:
- performing a first program loop according to program data loaded in page buffers;
- wherein the first program loop includes:
  - applying a first program voltage to a selected word line among the plurality of word lines;
  - applying a first verify voltage to the selected word line; and
  - storing a first verify result related with first memory cells targeted to a first program state which are verified using the first verify voltage during the first program loop;
- performing a second program loop according to the program data loaded in the page buffers,
- wherein the second program loop includes:
  - applying a second program voltage to the selected word line;
  - applying a second verify voltage; and
  - storing a second verify result related with second memory cells targeted to a second program state which are verified using the second verify voltage during the second program loop;
- wherein a program pass or a program fail of the first memory cells is checked based on the first verify result during applying the second program voltage,
- wherein when the first memory cells are program failed, the second program loop further includes:
  - applying the first verify voltage to the selected word line; and
  - storing a third verify result related with the first memory cells targeted to the first program state which are verified using the first verify voltage during the second program loop,
- wherein when the first memory cells are program passed, the first verify voltage is not applied to the selected word line at the second program loop; and then
- performing a third program loop according to the program data loaded in the page buffers after the second program loop,
- wherein the third program loop includes:
  - applying a third program voltage to the selected word line,
- wherein when the first memory cells are program passed at the second program loop, a program pass or a program fail of the second memory cells is checked based on the second verify result of the second program loop during applying the third program voltage,
- wherein when the first memory cells are program failed at the second program loop, the program pass or the program fail of the first memory cells is checked based on the third verify result of the second program loop and the program pass or the program fail of the second memory cells is not checked during applying the third program voltage.

* * * * *